US008781773B2

(12) United States Patent
Gurov et al.

(10) Patent No.: US 8,781,773 B2
(45) Date of Patent: *Jul. 15, 2014

(54) SYSTEM AND METHODS FOR PARAMETRIC TESTING

(75) Inventors: Leonid Gurov, Rishon Le Zion (IL); Alexander Chufarovsky, Ashdod (IL); Gil Balog, Jerusalem (IL); Reed Linde, El Dorado Hills, CA (US)

(73) Assignee: Optimal Plus Ltd, Nes-Zionna (IL)

( * ) Notice: Subject to any disclaimer, the term of this patent is extended or adjusted under 35 U.S.C. 154(b) by 503 days.

This patent is subject to a terminal disclaimer.

(21) Appl. No.: 13/164,910

(22) Filed: Jun. 21, 2011

(65) Prior Publication Data

US 2011/0251812 A1 Oct. 13, 2011

Related U.S. Application Data

(63) Continuation-in-part of application No. PCT/IL2009/001208, filed on Dec. 22, 2009, which is a continuation-in-part of application No. 12/341,431, filed on Dec. 22, 2008, now Pat. No. 8,112,249.

(51) Int. Cl.
  *G01N 37/00* (2006.01)
  *H01L 21/66* (2006.01)
  *G01R 31/26* (2014.01)

(52) U.S. Cl.
  USPC .............. 702/82; 702/81; 702/83; 702/118; 438/14

(58) Field of Classification Search
  USPC ........................ 702/81, 82, 83, 118
  See application file for complete search history.

(56) References Cited

U.S. PATENT DOCUMENTS

| 4,639,664 A | 1/1987 | Chiu et al. |
| 5,327,437 A | 7/1994 | Balzer |

(Continued)

FOREIGN PATENT DOCUMENTS

| JP | 2311775 A | 12/1990 |
| JP | 2003197697 A2 | 7/2003 |
| WO | 2007113805 A2 | 10/2007 |

OTHER PUBLICATIONS

Bernardo, Jose M. et al., "A General Multivariate Bayesian Process Capability Index", p. 1-16, (Dec. 9, 1996).

(Continued)

*Primary Examiner* — Jonathan C Teixeira Moffat
*Assistant Examiner* — Liam R Casey
(74) *Attorney, Agent, or Firm* — Nath Goldberg & Meyer; Joshua B. Goldberg

(57) ABSTRACT

Methods, systems, computer-program products and program-storage devices for determining whether or not to perform an action based at least partly on an estimated maximum test-range. One method comprises: attaining results generated from a parametric test on semiconductor devices included in a control set; selecting from the semiconductor devices at least one extreme subset including at least one of a high-scoring subset and a low-scoring subset; plotting at least results of the at least one extreme subset; fitting a plurality of curves to a plurality of subsets of the results; extending the curves to the zero-probability axis for the low-scoring subset or the one-probability axis for the high-scoring subset to define a corresponding plurality of intersection points; defining an estimated maximum test range based on at least one of the intersection points; and determining whether or not to perform an action based at least partly on the estimated maximum test range.

59 Claims, 48 Drawing Sheets

(56) References Cited

U.S. PATENT DOCUMENTS

| | | | |
|---|---|---|---|
| 5,386,189 A | 1/1995 | Nishimura et al. | |
| 5,436,979 A | 7/1995 | Gray et al. | |
| 5,477,544 A | 12/1995 | Botelho | |
| 5,539,325 A | 7/1996 | Rostoker et al. | |
| 5,655,110 A * | 8/1997 | Krivokapic et al. | 700/95 |
| 5,726,920 A | 3/1998 | Chen et al. | |
| 5,736,850 A | 4/1998 | Legal | |
| 5,996,099 A | 11/1999 | Fournel et al. | |
| 6,055,463 A | 4/2000 | Cheong et al. | |
| 6,246,250 B1 | 6/2001 | Doherty et al. | |
| 6,366,109 B1 | 4/2002 | Matsushita | |
| 6,377,901 B1 | 4/2002 | List et al. | |
| 6,618,682 B2 | 9/2003 | Buluga et al. | |
| 6,711,514 B1 | 3/2004 | Bibbee | |
| 6,751,763 B2 | 6/2004 | Cho | |
| 6,842,022 B2 | 1/2005 | Khoche | |
| 6,924,477 B2 | 8/2005 | DeBono et al. | |
| 6,936,889 B2 | 8/2005 | Koga et al. | |
| 6,937,049 B2 | 8/2005 | Wuidart et al. | |
| 6,948,149 B2 | 9/2005 | Goodwin | |
| 6,988,232 B2 | 1/2006 | Ricchetti et al. | |
| 7,013,231 B2 | 3/2006 | Kritt | |
| 7,184,917 B2 | 2/2007 | Pramanick et al. | |
| 7,209,851 B2 | 4/2007 | Singh et al. | |
| 7,265,570 B2 | 9/2007 | Ong | |
| 2004/0044938 A1 | 3/2004 | Heo | |
| 2004/0225465 A1 | 11/2004 | Pramanick et al. | |
| 2005/0278597 A1 | 12/2005 | Miguelanez et al. | |
| 2006/0085155 A1 | 4/2006 | Miguelanez et al. | |
| 2006/0100844 A1 | 5/2006 | Yang et al. | |
| 2006/0106555 A1 | 5/2006 | Voorakaranam et al. | |
| 2007/0260937 A1 | 11/2007 | Connally et al. | |
| 2008/0077256 A1 | 3/2008 | Muenz | |
| 2008/0117213 A1 | 5/2008 | Cirit et al. | |
| 2008/0281566 A1 | 11/2008 | Wang et al. | |
| 2009/0312972 A1 | 12/2009 | Muller et al. | |

OTHER PUBLICATIONS

Reda, Sherief et al., "Analyzing the Impact of Process Variations on Parametric Measurements: Novel Models and Applications", EDAA (2009).

Shumaker, John, et al., "Intelligent Sample Test Using Cost Based Methodologies", p. 439-442, IEEE (2003).

* cited by examiner

| N (Number of Validation unit) | Result | N (Number of Validation unit) | Result |
|---|---|---|---|
| Unit 1 | 1.24899399 | Unit 31 | 1.24976802 |
| Unit 2 | 1.25038695 | Unit 32 | 1.24907005 |
| Unit 3 | 1.25007701 | Unit 33 | 1.24907100 |
| Unit 4 | 1.24891603 | Unit 34 | 1.25000000 |
| Unit 5 | 1.24868405 | Unit 35 | 1.24875998 |
| Unit 6 | 1.25015497 | Unit 36 | 1.24922502 |
| Unit 7 | 1.24930298 | Unit 37 | 1.24922705 |
| Unit 8 | 1.24953604 | Unit 38 | 1.25046504 |
| Unit 9 | 1.24814296 | Unit 39 | 1.24953496 |
| Unit 10 | 1.25100696 | Unit 40 | 1.25054204 |
| Unit 11 | 1.25015497 | Unit 41 | 1.24837506 |
| Unit 12 | 1.24899399 | Unit 42 | 1.25085199 |
| Unit 13 | 1.24845302 | Unit 43 | 1.24845004 |
| Unit 14 | 1.24883902 | Unit 44 | 1.24953496 |
| Unit 15 | 1.24969006 | Unit 45 | 1.24938095 |
| Unit 16 | 1.24953604 | Unit 46 | 1.25030994 |
| Unit 17 | 1.24868405 | Unit 47 | 1.24969006 |
| Unit 18 | 1.25038803 | Unit 48 | 1.24876106 |
| Unit 19 | 1.25000000 | Unit 49 | 1.24883902 |
| Unit 20 | 1.24961305 | Unit 50 | 1.25015497 |
| Unit 21 | 1.24938095 | Unit 51 | 1.24852800 |
| Unit 22 | 1.25015497 | Unit 52 | 1.24930298 |
| Unit 23 | 1.24852705 | Unit 53 | 1.24783397 |
| Unit 24 | 1.24953496 | Unit 54 | 1.24914801 |
| Unit 25 | 1.24930406 | Unit 55 | 1.24868202 |
| Unit 26 | 1.25116098 | Unit 56 | 1.25000000 |
| Unit 27 | 1.24775302 | Unit 57 | 1.24775600 |
| Unit 28 | 1.25023305 | Unit 58 | 1.24907005 |
| Unit 29 | 1.24938095 | Unit 59 | 1.24976695 |
| Unit 30 | 1.25000000 | Unit 60 | 1.24969006 |

FIG. 4A

| N (Number of Validation unit) | Result | N (Number of Validation unit) | Result |
|---|---|---|---|
| Unit 61 | 1.25007796 | Unit 91 | 1.24930298 |
| Unit 62 | 1.25092995 | Unit 92 | 1.24876106 |
| Unit 63 | 1.24907005 | Unit 93 | 1.24907100 |
| Unit 64 | 1.24984503 | Unit 94 | 1.25077498 |
| Unit 65 | 1.24883902 | Unit 95 | 1.24953496 |
| Unit 66 | 1.24961305 | Unit 96 | 1.25038695 |
| Unit 67 | 1.24953496 | Unit 97 | 1.25007796 |
| Unit 68 | 1.24938095 | Unit 98 | 1.25131595 |
| Unit 69 | 1.24914801 | Unit 99 | 1.24852800 |
| Unit 70 | 1.25015497 | Unit 100 | 1.24976695 |
| Unit 71 | 1.25023198 | Unit 101 | 1.24914801 |
| Unit 72 | 1.24984598 | Unit 102 | 1.25007796 |
| Unit 73 | 1.24845195 | Unit 103 | 1.24992299 |
| Unit 74 | 1.24961305 | Unit 104 | 1.25092900 |
| Unit 75 | 1.25023198 | Unit 105 | 1.24860501 |
| Unit 76 | 1.24845195 | Unit 106 | 1.25015497 |
| Unit 77 | 1.24829698 | Unit 107 | 1.24845302 |
| Unit 78 | 1.25023198 | Unit 108 | 1.25077403 |
| Unit 79 | 1.24937999 | Unit 109 | 1.24984503 |
| Unit 80 | 1.24961305 | Unit 110 | 1.24907100 |
| Unit 81 | 1.25007701 | Unit 111 | 1.24938095 |
| Unit 82 | 1.25092900 | Unit 112 | 1.25000000 |
| Unit 83 | 1.24984503 | Unit 113 | 1.24992204 |
| Unit 84 | 1.24883902 | Unit 114 | 1.24914801 |
| Unit 85 | 1.24914896 | Unit 115 | 1.24914896 |
| Unit 86 | 1.24961400 | Unit 116 | 1.25038695 |
| Unit 87 | 1.24937999 | Unit 117 | 1.24891496 |
| Unit 88 | 1.25061905 | Unit 118 | 1.24938095 |
| Unit 89 | 1.24984598 | Unit 119 | 1.24907100 |
| Unit 90 | 1.25007701 | Unit 120 | 1.25108504 |

FIG. 4B

| N (Number of Validation unit) | Result | N (Number of Validation unit) | Result |
| --- | --- | --- | --- |
| Unit 121 | 1.24883795 | Unit 151 | 1.24821997 |
| Unit 122 | 1.24953496 | Unit 152 | 1.25007701 |
| Unit 123 | 1.24853003 | Unit 153 | 1.24891496 |
| Unit 124 | 1.25092995 | Unit 154 | 1.24907100 |
| Unit 125 | 1.24937999 | Unit 155 | 1.24907100 |
| Unit 126 | 1.24876106 | Unit 156 | 1.25147200 |
| Unit 127 | 1.24969006 | Unit 157 | 1.24992204 |
| Unit 128 | 1.25108504 | Unit 158 | 1.24907100 |
| Unit 129 | 1.24953496 | Unit 159 | 1.24922705 |
| Unit 130 | 1.25085199 | Unit 160 | 1.24930298 |
| Unit 131 | 1.24938095 | Unit 161 | 1.25015497 |
| Unit 132 | 1.25046504 | Unit 162 | 1.24876106 |
| Unit 133 | 1.24875998 | Unit 163 | 1.25000000 |
| Unit 134 | 1.24899304 | Unit 164 | 1.24961305 |
| Unit 135 | 1.24876106 | Unit 165 | 1.24883902 |
| Unit 136 | 1.25000000 | Unit 166 | 1.24821997 |
| Unit 137 | 1.24930298 | Unit 167 | 1.25162601 |
| Unit 138 | 1.24876201 | Unit 168 | 1.24891496 |
| Unit 139 | 1.24868405 | Unit 169 | 1.24852896 |
| Unit 140 | 1.25077498 | Unit 170 | 1.24845099 |
| Unit 141 | 1.24914706 | Unit 171 | 1.25108397 |
| Unit 142 | 1.24937999 | Unit 172 | 1.24914706 |
| Unit 143 | 1.24883902 | Unit 173 | 1.24852800 |
| Unit 144 | 1.25000000 | Unit 174 | 1.25030994 |
| Unit 145 | 1.25023305 | Unit 175 | 1.25023198 |
| Unit 146 | 1.25023198 | Unit 176 | 1.24891496 |
| Unit 147 | 1.24969101 | Unit 177 | 1.24914801 |
| Unit 148 | 1.25023198 | Unit 178 | 1.24806595 |
| Unit 149 | 1.24891496 | Unit 179 | 1.25061905 |
| Unit 150 | 1.24922597 | Unit 180 | 1.24930203 |

FIG. 4C

| N (Number of Validation unit) | Result | N (Number of Validation unit) | Result |
|---|---|---|---|
| Unit 181 | 1.24899304 | Unit 211 | 1.24907100 |
| Unit 182 | 1.24868500 | Unit 212 | 1.24790704 |
| Unit 183 | 1.25015497 | Unit 213 | 1.25007796 |
| Unit 184 | 1.24922502 | Unit 214 | 1.24853003 |
| Unit 185 | 1.24837399 | Unit 215 | 1.24945796 |
| Unit 186 | 1.24821997 | Unit 216 | 1.24922502 |
| Unit 187 | 1.25046504 | Unit 217 | 1.24852800 |
| Unit 188 | 1.24945796 | Unit 218 | 1.24945796 |
| Unit 189 | 1.24930298 | Unit 219 | 1.24907100 |
| Unit 190 | 1.24953604 | Unit 220 | 1.24883795 |
| Unit 191 | 1.25046504 | Unit 221 | 1.24814105 |
| Unit 192 | 1.24821699 | Unit 222 | 1.24876106 |
| Unit 193 | 1.24852896 | Unit 223 | 1.25069702 |
| Unit 194 | 1.25007796 | Unit 224 | 1.24976695 |
| Unit 195 | 1.25015497 | Unit 225 | 1.24790800 |
| Unit 196 | 1.24922502 | Unit 226 | 1.24914896 |
| Unit 197 | 1.24821901 | Unit 227 | 1.24899304 |
| Unit 198 | 1.24961305 | Unit 228 | 1.24907005 |
| Unit 199 | 1.25007701 | Unit 229 | 1.24930298 |
| Unit 200 | 1.25007796 | Unit 230 | 1.24853003 |
| Unit 201 | 1.24984503 | Unit 231 | 1.24984503 |
| Unit 202 | 1.24899399 | Unit 232 | 1.24984503 |
| Unit 203 | 1.24953496 | Unit 233 | 1.24907100 |
| Unit 204 | 1.24875998 | Unit 234 | 1.24945796 |
| Unit 205 | 1.24767601 | Unit 235 | 1.24984503 |
| Unit 206 | 1.24837506 | Unit 236 | 1.24937999 |
| Unit 207 | 1.25015497 | Unit 237 | 1.24953604 |
| Unit 208 | 1.24969006 | Unit 238 | 1.24821997 |
| Unit 209 | 1.24992299 | Unit 239 | 1.25030994 |
| Unit 210 | 1.24876201 | Unit 240 | 1.24852800 |

FIG. 4D

| N (Number of Validation unit) | Result | N (Number of Validation unit) | Result |
|---|---|---|---|
| Unit 241 | 1.24829602 | Unit 271 | 1.25154996 |
| Unit 242 | 1.24860704 | Unit 272 | 1.24907005 |
| Unit 243 | 1.25023305 | Unit 273 | 1.24891698 |
| Unit 244 | 1.24945700 | Unit 274 | 1.25069797 |
| Unit 245 | 1.25000000 | Unit 275 | 1.24930203 |
| Unit 246 | 1.24883902 | Unit 276 | 1.25046504 |
| Unit 247 | 1.24969006 | Unit 277 | 1.24868405 |
| Unit 248 | 1.24914801 | Unit 278 | 1.25015497 |
| Unit 249 | 1.24945796 | Unit 279 | 1.24783003 |
| Unit 250 | 1.24976802 | Unit 280 | 1.25015497 |
| Unit 251 | 1.24984503 | Unit 281 | 1.24937999 |
| Unit 252 | 1.24945700 | Unit 282 | 1.25015497 |
| Unit 253 | 1.24930298 | Unit 283 | 1.24845004 |
| Unit 254 | 1.24907100 | Unit 284 | 1.24914896 |
| Unit 255 | 1.24984503 | Unit 285 | 1.24976695 |
| Unit 256 | 1.24961305 | Unit 286 | 1.25023198 |
| Unit 257 | 1.24945796 | Unit 287 | 1.25015497 |
| Unit 258 | 1.24930406 | Unit 288 | 1.24945700 |
| Unit 259 | 1.25023198 | Unit 289 | 1.24860704 |
| Unit 260 | 1.24883795 | Unit 290 | 1.25100803 |
| Unit 261 | 1.24899399 | Unit 291 | 1.24961197 |
| Unit 262 | 1.24837506 | Unit 292 | 1.24891603 |
| Unit 263 | 1.25147200 | Unit 293 | 1.24845195 |
| Unit 264 | 1.25000000 | Unit 294 | 1.24999905 |
| Unit 265 | 1.24945796 | Unit 295 | 1.24860501 |
| Unit 266 | 1.24907100 | Unit 296 | 1.24930298 |
| Unit 267 | 1.24937999 | Unit 297 | 1.24876201 |
| Unit 268 | 1.24875998 | Unit 298 | 1.24969006 |
| Unit 269 | 1.24976802 | Unit 299 | 1.24961305 |
| Unit 270 | 1.24961305 | Unit 300 | 1.25023198 |

FIG. 4E

| Vmax | Vmin | Extrapolation Amplitude | Safety Coefficient | Lower Test Range |
|---|---|---|---|---|
| 1.24821997 | 1.24685248 | 0.00136749 | 1.3 | 1.24507475 |

| Serial Number | Lower 5% Test Values of Validation Data | Probabilities | Linear Extrapolation to the Point prob = 0 |
|---|---|---|---|
| 1 | 1.24767601 | 0.00227224 | . |
| 2 | 1.24775302 | 0.00560152 | 1.24762346 |
| 3 | 1.247756 | 0.0089308 | 1.24774801 |
| 4 | 1.24783003 | 0.01226008 | 1.24755742 |
| 5 | 1.24783397 | 0.01558937 | 1.24781555 |
| 6 | 1.24790704 | 0.01891865 | 1.24749179 |
| 7 | 1.247908 | 0.02224793 | 1.24790162 |
| 8 | 1.24806595 | 0.02557721 | 1.24685248 |
| 9 | 1.24814105 | 0.0289065 | 1.24748898 |
| 10 | 1.24814296 | 0.03223578 | 1.24812449 |
| 11 | 1.24821699 | 0.03556506 | 1.24742617 |
| 12 | 1.24821901 | 0.03889435 | 1.24819534 |
| 13 | 1.24821997 | 0.04222363 | 1.24820787 |
| 14 | 1.24821997 | 0.04555291 | 1.24821997 |
| 15 | 1.24821997 | 0.04888219 | 1.24821997 |

| Serial Number | Upper 5% Test Values of Validation Data | Probabilities | Linear Extrapolation to the Point prob = 1 |
|---|---|---|---|
| 1 | 1.250929 | 0.95111781 | . |
| 2 | 1.250929 | 0.95444709 | 1.250929 |
| 3 | 1.25092995 | 0.95777637 | 1.25094205 |
| 4 | 1.25092995 | 0.96110565 | 1.25092995 |
| 5 | 1.25100696 | 0.96443494 | 1.25182961 |
| 6 | 1.25100803 | 0.96776422 | 1.25101842 |
| 7 | 1.25108397 | 0.9710935 | 1.25174329 |
| 8 | 1.25108504 | 0.97442279 | 1.25109329 |
| 9 | 1.25108504 | 0.97775207 | 1.25108504 |
| 10 | 1.25116098 | 0.98108135 | 1.25159249 |
| 11 | 1.25131595 | 0.98441063 | 1.25204161 |
| 12 | 1.251472 | 0.98773992 | 1.25204663 |
| 13 | 1.251472 | 0.9910692 | 1.251472 |
| 14 | 1.25154996 | 0.99439848 | 1.25168113 |
| 15 | 1.25162601 | 0.99772776 | 1.25167792 |

| Vmax | Vmin | Extrapolation Amplitude | Safety Coefficient | Upper Test Range |
|---|---|---|---|---|
| 1.25204663 | 1.250929 | 0.00111763 | 1.3 | 1.25349956 |

| Site | Lower 5% Test Values of Validation Data | Probabilities | Linear Extrapolation to the Point prob = 0 | Lower Test Range Vmax | Vmin | Extrapolation Amplitude | Safety Coefficient | Lower Test Range |
|---|---|---|---|---|---|---|---|---|
| 1 | 1.24767601 | 0.00453896 | . | 1.24781555 | 1.24658367 | 0.00123188 | 1.3 | 1.24498222 |
|   | 1.24775302 | 0.01118944 | 1.24762346 |   |   |   |   |   |
|   | 1.247756   | 0.01783992 | 1.24774801 |   |   |   |   |   |
|   | 1.24783003 | 0.02449041 | 1.24755742 |   |   |   |   |   |
|   | 1.24783397 | 0.03114089 | 1.24781555 (1010) |   |   |   |   |   |
|   | 1.247908   | 0.03779137 | 1.24748733 (1020) |   |   |   |   |   |
|   | 1.24814105 | 0.04444186 | 1.24658367 |   |   |   |   |   |
| 2 | 1.24810893 | 0.00453896 | . | 1.24872528 | 1.2470701 | 0.00165518 | 1.3 | 1.24491836 |
|   | 1.24810997 | 0.01118944 | 1.24810823 |   |   |   |   |   |
|   | 1.24872801 | 0.01783992 | 1.2470701 (1030) |   |   |   |   |   |
|   | 1.24872903 | 0.02449041 | 1.24872528 (1040) |   |   |   |   |   |
|   | 1.24873901 | 0.03114089 | 1.24869228 |   |   |   |   |   |
|   | 1.24874301 | 0.03779137 | 1.24872028 |   |   |   |   |   |
|   | 1.24886817 | 0.04444186 | 1.24803183 |   |   |   |   |   |

FIG. 10A

| Site | Upper 5% Test Values of Validation Data | Probabilities | Linear Extrapolation to the Point prob = 1 | Upper Test Range |||| Upper Test Range |
|---|---|---|---|---|---|---|---|---|
| | | | | Vmax | Vmin | Extrapolation Amplitude | Safety Coefficient | |
| 1 | 1.25046504 | 0.09266802 | | 1.25111777 | 1.24965506 | 0.00146271 | 1.3 | 1.2530193 |
| | 1.25061905 | 0.22844535 | 1.25035992 | | | | | |
| | 1.25069702 | 0.36422267 | 1.25048788 | | | | | |
| | 1.25108397 | 0.5 | 1.24965901 | | (1050) | | | |
| | 1.251472 | 0.63577733 | 1.24965506 | | (1060) | | | |
| | 1.25154996 | 0.77155465 | 1.25110694 | | | | | |
| | 1.25162601 | 0.90733198 | 1.25111777 | | | | | |
| 2 | 1.25150111 | 0.09266802 | | 1.25157922 | 1.25092315 | 0.00065608 | 1.3 | 1.25243212 |
| | 1.25150218 | 0.22844535 | 1.25150038 | | | | | |
| | 1.25157922 | 0.36422267 | 1.25137256 | | (1070) | | | |
| | 1.25157922 | 0.5 | 1.25157922 | | (1080) | | | |
| | 1.25165519 | 0.63577733 | 1.25129948 | | | | | |
| | 1.25181022 | 0.77155465 | 1.25092924 | | | | | |
| | 1.25196633 | 0.90733198 | 1.25092315 | | | | | |

FIG. 10B

| Difference | -0.0007769 | t Ratio | -8.7292621 |
|---|---|---|---|
| Std Err Dif | 0.00008899 | DF | 297.612438 |
| Upper CL Dif | -0.0006017 | Prob > \|t\| | 2.22E-16 |
| Lower CL Dif | -0.000952 | Prob > t | 1 |
| Confidence | 0.95 | Prob < t | 1.11E-16 |

FIG. 10E

| N Points in Tail | Safety Coefficient | | | | | | |
|---|---|---|---|---|---|---|---|
| | 0.1 | 0.5 | 0.8 | 1 | 1.3 | 1.5 | 2 |
| 5 | 0.0029836850 | 0.0015964736 | 0.0009750078 | 0.0006937973 | 0.0004092881 | 0.0002845661 | 0.0001101131 |
| 6 | 0.0024302839 | 0.0011661830 | 0.0006513281 | 0.0004350591 | 0.0002321226 | 0.0001503734 | 0.0000481276 |
| 7 | 0.0020436258 | 0.0008951640 | 0.0004636619 | 0.0002935454 | 0.0001437948 | 0.0000876996 | 0.0000238543 |
| 8 | 0.0017588860 | 0.0007121746 | 0.0003455483 | 0.0002088047 | 0.0000949397 | 0.0000549277 | 0.0000129533 |
| 9 | 0.0015408672 | 0.0005821700 | 0.0002666163 | 0.0001545888 | 0.0000657870 | 0.0000363155 | 0.0000075402 |
| 10 | 0.0013688370 | 0.0004861359 | 0.0002113925 | 0.0001181006 | 0.0000473506 | 0.0000250543 | 0.0000046365 |
| 11 | 0.0012298049 | 0.0004129711 | 0.0001713277 | 0.0000925397 | 0.0000351422 | 0.0000178902 | 0.0000029805 |
| 12 | 0.0011152264 | 0.0003558139 | 0.0001413914 | 0.0000740412 | 0.0000267500 | 0.0000131429 | 0.0000019876 |
| 13 | 0.0010192559 | 0.0003102241 | 0.0001184702 | 0.0000602878 | 0.0000207993 | 0.0000098886 | 0.0000013672 |
| 14 | 0.0009377624 | 0.0002732179 | 0.0001005550 | 0.0000498270 | 0.0000164680 | 0.0000075931 | 0.0000009655 |
| 15 | 0.0008677458 | 0.0002427261 | 0.0000863042 | 0.0000417145 | 0.0000132439 | 0.0000059339 | 0.0000006976 |
| 20 | 0.0006277375 | 0.0001480449 | 0.0000455322 | 0.0000198165 | 0.0000053098 | 0.0000021072 | 0.0000001777 |
| 25 | 0.0004881941 | 0.0001007581 | 0.0000276513 | 0.0000110798 | 0.0000025965 | 0.0000009360 | 0.0000000606 |
| 30 | 0.0003974652 | 0.0000735066 | 0.0000183610 | 0.0000068709 | 0.0000014409 | 0.0000004796 | 0.0000000249 |
| 35 | 0.0003339971 | 0.0000562635 | 0.0000129699 | 0.0000045781 | 0.0000008730 | 0.0000002714 | 0.0000000117 |
| 40 | 0.0002872416 | 0.0000446088 | 0.0000095874 | 0.0000032157 | 0.0000005643 | 0.0000001652 | 0.0000000060 |
| 50 | 0.0002232047 | 0.0000302319 | 0.0000057732 | 0.0000017763 | 0.0000002708 | 0.0000000717 | 0.0000000020 |

FIG. 11

|  | Safety Coefficient = 1.3 | |
| --- | --- | --- |
| N Validation Units | 10% tail | 5% tail |
| 100 | 0.0000864633 | 0.0004092900 |
| 120 | 0.0000480490 | 0.0002321200 |
| 140 | 0.0000291527 | 0.0001437900 |
| 160 | 0.0000188664 | 0.0000949400 |
| 180 | 0.0000128285 | 0.0000657870 |
| 200 | 0.0000090714 | 0.0000473500 |
| 220 | 0.0000066219 | 0.0000351422 |
| 240 | 0.0000049629 | 0.0000267500 |
| 260 | 0.0000038031 | 0.0000208000 |
| 280 | 0.0000029701 | 0.0000164680 |
| 300 | 0.0000023579 | 0.0000132439 |
| 400 | 0.0000008945 | 0.0000053098 |
| 500 | 0.0000004185 | 0.0000025965 |
| 600 | 0.0000002239 | 0.0000014409 |
| 700 | 0.0000001315 | 0.0000008730 |
| 800 | 0.0000000827 | 0.0000005643 |
| 900 | 0.0000000549 | 0.0000003833 |

FIG. 12

| SCENARIO | VALIDATION UNITS (FAILURES OF TEST CANDIDATE) | VALIDATION UNITS (ESTIMATED TEST RANGE) | TTR ENABLED (AFTER VALIDATION UNITS) | SAMPLED UNITS (FAILURES OF TEST CANDIDATE) | SAMPLED UNITS (ESTIMATED TEST RANGE) | TTR DISABLED (AFTER SAMPLED UNITS) |
|---|---|---|---|---|---|---|
| 1 | NONE | WITHIN LIMITS | YES | NONE | WITHIN LIMITS | NO |
| 2 | NONE | WITHIN LIMITS | YES | YES | DON'T CARE | YES |
| 3 | NONE | WITHIN LIMITS | YES | NONE | OUTSIDE LIMITS | YES |
| 4 | YES | DON'T CARE | NO | DON'T CARE | DON'T CARE | DON'T CARE |
| 5 | NONE | OUTSIDE LIMITS | NO | DON'T CARE | DON'T CARE | DON'T CARE |

FIG. 14

|  | Result Test 2 |  | Result Test 2 |
|---|---|---|---|
| Unit 290 | -2.1103215 | Unit 320 | 0.59943015 |
| Unit 291 | 0.869765 | Unit 321 | 0.40339681 |
| Unit 292 | 0.61172143 | Unit 322 | -1.0558419 |
| Unit 293 | -1.2953824 | Unit 323 | 1.21560149 |
| Unit 294 | 0.28942262 | Unit 324 | 0.90115922 |
| Unit 295 | 0.43807395 | Unit 325 | 1.77844605 |
| Unit 296 | -0.757755 | Unit 326 | -1.1968199 |
| Unit 297 | -0.817587 | Unit 327 | -1.8732938 |
| Unit 298 | -0.5363542 | Unit 328 | -2.2390737 |
| Unit 299 | -0.8903146 | Unit 329 | 2.37532758 |
| Unit 300 | 0.7741976 | Unit 330 | -8.0156743 |
| Unit 301 | -0.6619927 | Unit 331 | 1.41879213 |
| Unit 302 | -1.0968346 | Unit 332 | 0.55585346 |
| Unit 303 | -0.3572646 | Unit 333 | 0.89279075 |
| Unit 304 | 1.95024794 | Unit 334 | -0.9515018 |
| Unit 305 | 0.31364304 | Unit 335 | -1.9955974 |
| Unit 306 | 0.44120726 | Unit 336 | 0.15524347 |
| Unit 307 | -0.7887084 | Unit 337 | -0.8487835 |
| Unit 308 | 0.5655662 | Unit 338 | -1.0695485 |
| Unit 309 | 1.12272968 | Unit 339 | 1.83644011 |
| Unit 310 | 0.90996417 | Unit 340 | 0.61771611 |
| Unit 311 | -0.8294161 | Unit 341 | -0.9095555 |
| Unit 312 | 0.76887487 | Unit 342 | -0.353164 |
| Unit 313 | -0.5739912 | Unit 343 | -1.1124837 |
| Unit 314 | -0.5167937 | Unit 344 | -1.4535354 |
| Unit 315 | -0.7024257 | Unit 345 | 1.70230925 |
| Unit 316 | 1.25435236 | Unit 346 | 0.57151707 |
| Unit 317 | -0.6280745 | Unit 347 | -1.7739678 |
| Unit 318 | -0.0837432 | Unit 348 | -0.0117667 |
| Unit 319 | 0.99953103 | Unit 349 | -0.9817522 |

| | Lower Test Range Test 2 | Upper Test Range Test 2 |
|---|---|---|
| Unit 300 | -3.9198257 | 5.060877722 |
| Unit 310 | -3.9198257 | 5.046667499 |
| Unit 320 | -3.9198257 | 5.046667499 |
| Unit 330 | -24.6657425 | 4.75711624 |

FIG. 16B

|  | Result Test 1 |  | Result Test 1 |
|---|---|---|---|
| Unit 280 | 0.29669486 | Unit 310 | 0.90996417 |
| Unit 281 | 0.8101448 | Unit 311 | -0.8294161 |
| Unit 282 | 0.72409495 | Unit 312 | 0.76887487 |
| Unit 283 | 0.81967127 | Unit 313 | -0.5739912 |
| Unit 284 | 0.02303197 | Unit 314 | -0.5167937 |
| Unit 285 | 1.6607029 | Unit 315 | -0.7024257 |
| Unit 286 | 0.49082469 | Unit 316 | 1.25435236 |
| Unit 287 | -0.4685474 | Unit 317 | -0.6280745 |
| Unit 288 | 0.47465517 | Unit 318 | -0.0837432 |
| Unit 289 | -1.2270474 | Unit 319 | 0.99953103 |
| Unit 290 | -2.1103215 | Unit 320 | 0.59943015 |
| Unit 291 | 0.869765 | Unit 321 | 0.40339681 |
| Unit 292 | 0.61172143 | Unit 322 | -1.0558419 |
| Unit 293 | -1.2953824 | Unit 323 | 1.21560149 |
| Unit 294 | 0.28942262 | Unit 324 | 0.90115922 |
| Unit 295 | 0.43807395 | Unit 325 | 1.77844605 |
| Unit 296 | -0.757755 | Unit 326 | -1.1968199 |
| Unit 297 | -0.817587 | Unit 327 | -1.8732938 |
| Unit 298 | -0.5363542 | Unit 328 | -2.2390737 |
| Unit 299 | -0.8903146 | Unit 329 | 2.37532758 |
| Unit 300 | 0.7741976 | Unit 330 | -0.0156743 |
| Unit 301 | -0.6619927 | Unit 331 | 1.41879213 |
| Unit 302 | -1.0968346 | Unit 332 | 0.55585346 |
| Unit 303 | -0.3572646 | Unit 333 | 0.89279075 |
| Unit 304 | 1.95024794 | Unit 334 | -0.9515018 |
| Unit 305 | 0.31364304 | Unit 335 | -1.9955974 |
| Unit 306 | 0.44120726 | Unit 336 | 0.15524347 |
| Unit 307 | -0.7887084 | Unit 337 | -0.8487835 |
| Unit 308 | 0.5655662 | Unit 338 | -1.0695485 |
| Unit 309 | 1.12272968 | Unit 339 | 1.83644011 |

FIG. 18A

|  | Result Test 1 |  | Result Test 1 |
|---|---|---|---|
| Unit 340 | 0.61771611 | Unit 370 | -1.6538141 |
| Unit 341 | -0.9095555 | Unit 371 | 0.28364077 |
| Unit 342 | -0.353164 | Unit 372 | 0.92420259 |
| Unit 343 | -1.1124837 | Unit 373 | 0.23307515 |
| Unit 344 | -1.4535354 | Unit 374 | 0.228437 |
| Unit 345 | 1.70230925 | Unit 375 | -0.6597587 |
| Unit 346 | 0.57151707 | Unit 376 | -2.1160689 |
| Unit 347 | -1.7739678 | Unit 377 | -3.5368065 |
| Unit 348 | -0.0117667 | Unit 378 | -2.2395526 |
| Unit 349 | -0.9817522 | Unit 379 | -3.8468213 |
| Unit 350 | -0.1803134 | Unit 380 | -3.0756388 |
| Unit 351 | 1.08379552 | Unit 381 | -3.7748145 |
| Unit 352 | -0.7022151 | Unit 382 | -2.2893912 |
| Unit 353 | 0.5540035 | Unit 383 | -2.0872912 |
| Unit 354 | 1.43611732 | Unit 384 | -2.1878491 |
| Unit 355 | 0.77977718 | Unit 385 | -4.2938874 |
| Unit 356 | 1.10443335 | Unit 386 | -1.7288701 |
| Unit 357 | -0.5427755 | Unit 387 | -3.848908 |
| Unit 358 | -0.9226484 | Unit 388 | -3.0541782 |
| Unit 359 | 0.30360525 | Unit 389 | -1.2797389 |
| Unit 360 | -0.7902236 | Unit 390 | -1.7690436 |
| Unit 361 | -0.5864676 | Unit 391 | -2.9266397 |
| Unit 362 | -0.1343934 | Unit 392 | -1.5487635 |
| Unit 363 | -0.4608412 | Unit 393 | -1.7515183 |
| Unit 364 | -0.5625405 | Unit 394 | -1.1490466 |
| Unit 365 | 0.29899255 | Unit 395 | -1.8452313 |
| Unit 366 | -0.4445108 | Unit 396 | -2.6039109 |
| Unit 367 | -0.2193805 | Unit 397 | -0.9031418 |
| Unit 368 | -0.9517721 | Unit 398 | -4.3160608 |
| Unit 369 | -2.7432485 | Unit 399 | -2.7340501 |

FIG. 18B

|  | Result Test 1 |  | Result Test 1 |
|---|---|---|---|
| Unit 400 | -4.2546593 | Unit 430 | -4.6291487 |
| Unit 401 | -2.7993609 | Unit 431 | -6.2276392 |
| Unit 402 | -2.197184 | Unit 432 | -6.4785729 |
| Unit 403 | -2.084548 | Unit 433 | -5.1921977 |
| Unit 404 | -1.7104044 | Unit 434 | -6.3368757 |
| Unit 405 | -3.510077 | Unit 435 | -6.0108119 |
| Unit 406 | -2.1315118 | Unit 436 | -7.3941961 |
| Unit 407 | -2.3264704 | Unit 437 | -6.6795425 |
| Unit 408 | -1.5463167 | Unit 438 | -4.4449265 |
| Unit 409 | -3.6014589 | Unit 439 | -6.8239521 |
| Unit 410 | -1.7810115 | Unit 440 | -4.6294489 |
| Unit 411 | -3.2003162 | Unit 441 | -7.2539889 |
| Unit 412 | -3.3686012 | Unit 442 | -3.9616372 |
| Unit 413 | -5.2501338 | Unit 443 | -7.5403524 |
| Unit 414 | -5.4413305 | Unit 444 | -6.3825829 |
| Unit 415 | -3.7626614 | Unit 445 | -3.2998465 |
| Unit 416 | -5.8810876 | Unit 446 | -7.5188596 |
| Unit 417 | -5.0105663 | Unit 447 | -6.3786487 |
| Unit 418 | -6.6199646 | Unit 448 | -4.7624041 |
| Unit 419 | -5.7322337 | Unit 449 | -4.7870031 |
| Unit 420 | -8.0370456 | Unit 450 | -5.5212134 |
| Unit 421 | -5.6279112 | Unit 451 | -8.854877 |
| Unit 422 | -4.4465107 | Unit 452 | -7.3218363 |
| Unit 423 | -6.0679978 | Unit 453 | -4.9481911 |
| Unit 424 | -6.3955401 | Unit 454 | -6.7822833 |
| Unit 425 | -7.3208683 | Unit 455 | -5.1679275 |
| Unit 426 | -5.7586676 | Unit 456 | -7.2454266 |
| Unit 427 | -5.3239946 | Unit 457 | -5.607411 |
| Unit 428 | -4.8402737 | Unit 458 | -8.504849 |
| Unit 429 | -6.4701815 | Unit 459 | -6.4334985 |

FIG. 18C

| Touchdown | Lower Test Range Test 1 | Upper Test Range Test 1 |
|---|---|---|
| Unit 300 | -3.9198257 | 5.06087722 |
| Unit 310 | -3.9198257 | 5.04667499 |
| Unit 320 | -3.9198257 | 5.04667499 |
| Unit 330 | -4.0901637 | 4.75711624 |
| Unit 340 | -4.2523025 | 4.74291401 |
| Unit 350 | -4.2523025 | 4.72871178 |
| Unit 360 | -4.2523025 | 4.72871178 |
| Unit 370 | -4.4144413 | 4.72871178 |
| Unit 380 | -7.3978275 | 4.72871178 |
| Unit 390 | -10.218309 | 4.72871178 |

FIG. 18D

|         | Result     |         | Result     |
|---------|------------|---------|------------|
| Unit 1  | 1.24899399 | Unit 31 | 1.24976802 |
| Unit 2  | 1.25038695 | Unit 32 | 1.24907005 |
| Unit 3  | 1.25007701 | Unit 33 | 1.24907100 |
| Unit 4  | 1.24891603 | Unit 34 | 1.25000000 |
| Unit 5  | 1.24868405 | Unit 35 | 1.24875998 |
| Unit 6  | 1.25015497 | Unit 36 | 1.24922502 |
| Unit 7  | 1.24930298 | Unit 37 | 1.24922705 |
| Unit 8  | 1.24953604 | Unit 38 | 1.25046504 |
| Unit 9  | 1.24814296 | Unit 39 | 1.24953496 |
| Unit 10 | 1.25100696 | Unit 40 | 1.25054204 |
| Unit 11 | 1.25015497 | Unit 41 | 1.24837506 |
| Unit 12 | 1.24899399 | Unit 42 | 1.25085199 |
| Unit 13 | 1.24845302 | Unit 43 | 1.24845004 |
| Unit 14 | 1.24883902 | Unit 44 | 1.24953496 |
| Unit 15 | 1.24969006 | Unit 45 | 1.24938095 |
| Unit 16 | 1.24953604 | Unit 46 | 1.25030994 |
| Unit 17 | 1.24868405 | Unit 47 | 1.24969006 |
| Unit 18 | 1.25038803 | Unit 48 | 1.24876106 |
| Unit 19 | 1.25000000 | Unit 49 | 1.24883902 |
| Unit 20 | 1.24961305 | Unit 50 | 1.25015497 |
| Unit 21 | 1.24938095 | Unit 51 | 1.24852800 |
| Unit 22 | 1.25015497 | Unit 52 | 1.24930298 |
| Unit 23 | 1.24852705 | Unit 53 | 1.24783397 |
| Unit 24 | 1.24953496 | Unit 54 | 1.24914801 |
| Unit 25 | 1.24930406 | Unit 55 | 1.24868202 |
| Unit 26 | 1.25116098 | Unit 56 | 1.25000000 |
| Unit 27 | 1.24775302 | Unit 57 | 1.24775600 |
| Unit 28 | 1.25023305 | Unit 58 | 1.24907005 |
| Unit 29 | 1.24938095 | Unit 59 | 1.24976695 |
| Unit 30 | 1.25000000 | Unit 60 | 1.24969006 |

FIG. 19A

|         | Result     |          | Result     |
|---------|------------|----------|------------|
| Unit 61 | 1.25007796 | Unit 91  | 1.24930298 |
| Unit 62 | 1.25092995 | Unit 92  | 1.24876106 |
| Unit 63 | 1.24907005 | Unit 93  | 1.24907100 |
| Unit 64 | 1.24984503 | Unit 94  | 1.25077498 |
| Unit 65 | 1.24883902 | Unit 95  | 1.24953496 |
| Unit 66 | 1.24961305 | Unit 96  | 1.25038695 |
| Unit 67 | 1.24953496 | Unit 97  | 1.25007796 |
| Unit 68 | 1.24938095 | Unit 98  | 1.25131595 |
| Unit 69 | 1.24914801 | Unit 99  | 1.24852800 |
| Unit 70 | 1.25015497 | Unit 100 | 1.27976695 |
| Unit 71 | 1.25023198 | Unit 101 | 1.24914801 |
| Unit 72 | 1.24984598 | Unit 102 | 1.25007796 |
| Unit 73 | 1.24845195 | Unit 103 | 1.24992299 |
| Unit 74 | 1.24961305 | Unit 104 | 1.25092900 |
| Unit 75 | 1.25023198 | Unit 105 | 1.24860501 |
| Unit 76 | 1.24845195 | Unit 106 | 1.25015497 |
| Unit 77 | 1.24829698 | Unit 107 | 1.24845302 |
| Unit 78 | 1.25023198 | Unit 108 | 1.25077403 |
| Unit 79 | 1.24937999 | Unit 109 | 1.24984503 |
| Unit 80 | 1.24961305 | Unit 110 | 1.24907100 |
| Unit 81 | 1.25007701 | Unit 111 | 1.24938095 |
| Unit 82 | 1.25092900 | Unit 112 | 1.25000000 |
| Unit 83 | 1.24984503 | Unit 113 | 1.24992204 |
| Unit 84 | 1.24883902 | Unit 114 | 1.24914801 |
| Unit 85 | 1.24914896 | Unit 115 | 1.24914896 |
| Unit 86 | 1.24961400 | Unit 116 | 1.25038695 |
| Unit 87 | 1.24937999 | Unit 117 | 1.24891496 |
| Unit 88 | 1.25061905 | Unit 118 | 1.24938095 |
| Unit 89 | 1.24984598 | Unit 119 | 1.24907100 |
| Unit 90 | 1.25007701 | Unit 120 | 1.25108504 |

|  | Result |  | Result |
|---|---|---|---|
| Unit 121 | 1.24883795 | Unit 151 | 1.24821997 |
| Unit 122 | 1.24953496 | Unit 152 | 1.25007701 |
| Unit 123 | 1.24853003 | Unit 153 | 1.24891496 |
| Unit 124 | 1.25092995 | Unit 154 | 1.24907100 |
| Unit 125 | 1.24937999 | Unit 155 | 1.24907100 |
| Unit 126 | 1.24876106 | Unit 156 | 1.25147200 |
| Unit 127 | 1.24969006 | Unit 157 | 1.24992204 |
| Unit 128 | 1.25108504 | Unit 158 | 1.24907100 |
| Unit 129 | 1.24953496 | Unit 159 | 1.24922705 |
| Unit 130 | 1.25085199 | Unit 160 | 1.24930298 |
| Unit 131 | 1.24938095 | Unit 161 | 1.25015497 |
| Unit 132 | 1.25046504 | Unit 162 | 1.24876106 |
| Unit 133 | 1.24875998 | Unit 163 | 1.25000000 |
| Unit 134 | 1.24899304 | Unit 164 | 1.24961305 |
| Unit 135 | 1.24876106 | Unit 165 | 1.24883902 |
| Unit 136 | 1.25000000 | Unit 166 | 1.24821997 |
| Unit 137 | 1.24930298 | Unit 167 | 1.25162601 |
| Unit 138 | 1.24876201 | Unit 168 | 1.24891496 |
| Unit 139 | 1.24868405 | Unit 169 | 1.24852896 |
| Unit 140 | 1.25077498 | Unit 170 | 1.24845099 |
| Unit 141 | 1.24914706 | Unit 171 | 1.25108397 |
| Unit 142 | 1.24937999 | Unit 172 | 1.24914706 |
| Unit 143 | 1.24883902 | Unit 173 | 1.24852800 |
| Unit 144 | 1.25000000 | Unit 174 | 1.25030994 |
| Unit 145 | 1.25023305 | Unit 175 | 1.25023198 |
| Unit 146 | 1.25023198 | Unit 176 | 1.24891496 |
| Unit 147 | 1.24969101 | Unit 177 | 1.24914801 |
| Unit 148 | 1.25023198 | Unit 178 | 1.24806595 |
| Unit 149 | 1.24891496 | Unit 179 | 1.25061905 |
| Unit 150 | 1.24922597 | Unit 180 | 1.24930203 |

FIG. 19C

|         | Result      |          | Result      |
|---------|-------------|----------|-------------|
| Unit 181 | 1.24899304 | Unit 211 | 1.24907100 |
| Unit 182 | 1.24868500 | Unit 212 | 1.24790704 |
| Unit 183 | 1.25015497 | Unit 213 | 1.25007796 |
| Unit 184 | 1.24922502 | Unit 214 | 1.24853003 |
| Unit 185 | 1.24837399 | Unit 215 | 1.24945796 |
| Unit 186 | 1.24821997 | Unit 216 | 1.24922502 |
| Unit 187 | 1.25046504 | Unit 217 | 1.24852800 |
| Unit 188 | 1.24945796 | Unit 218 | 1.24945796 |
| Unit 189 | 1.24930298 | Unit 219 | 1.24907100 |
| Unit 190 | 1.24953604 | Unit 220 | 1.24883795 |
| Unit 191 | 1.25046504 | Unit 221 | 1.24814105 |
| Unit 192 | 1.24821699 | Unit 222 | 1.24876106 |
| Unit 193 | 1.24852896 | Unit 223 | 1.25069702 |
| Unit 194 | 1.25007796 | Unit 224 | 1.24976695 |
| Unit 195 | 1.25015497 | Unit 225 | 1.24790800 |
| Unit 196 | 1.24922502 | Unit 226 | 1.24914896 |
| Unit 197 | 1.24821901 | Unit 227 | 1.24899304 |
| Unit 198 | 1.24961305 | Unit 228 | 1.24907005 |
| Unit 199 | 1.25007701 | Unit 229 | 1.24930298 |
| Unit 200 | 1.25007796 | Unit 230 | 1.24853003 |
| Unit 201 | 1.24984503 | Unit 231 | 1.24984503 |
| Unit 202 | 1.24899399 | Unit 232 | 1.24984503 |
| Unit 203 | 1.24953496 | Unit 233 | 1.24907100 |
| Unit 204 | 1.24875998 | Unit 234 | 1.24945796 |
| Unit 205 | 1.24767601 | Unit 235 | 1.24984503 |
| Unit 206 | 1.24837506 | Unit 236 | 1.24937999 |
| Unit 207 | 1.25015497 | Unit 237 | 1.24953604 |
| Unit 208 | 1.24969006 | Unit 238 | 1.24821997 |
| Unit 209 | 1.24992299 | Unit 239 | 1.25030994 |
| Unit 210 | 1.24876201 | Unit 240 | 1.24852800 |

FIG. 19D

|          | Result     |          | Result     |
|----------|------------|----------|------------|
| Unit 241 | 1.24829602 | Unit 271 | 1.25154996 |
| Unit 242 | 1.24860704 | Unit 272 | 1.24907005 |
| Unit 243 | 1.25023305 | Unit 273 | 1.24891698 |
| Unit 244 | 1.24945700 | Unit 274 | 1.25069797 |
| Unit 245 | 1.25000000 | Unit 275 | 1.24930203 |
| Unit 246 | 1.24883902 | Unit 276 | 1.25046504 |
| Unit 247 | 1.24969006 | Unit 277 | 1.24868405 |
| Unit 248 | 1.24914801 | Unit 278 | 1.25015497 |
| Unit 249 | 1.24945796 | Unit 279 | 1.24783003 |
| Unit 250 | 1.24976802 | Unit 280 | 1.25015497 |
| Unit 251 | 1.24984503 | Unit 281 | 1.24937999 |
| Unit 252 | 1.24945700 | Unit 282 | 1.25015497 |
| Unit 253 | 1.24930298 | Unit 283 | 1.24845004 |
| Unit 254 | 1.24907100 | Unit 284 | 1.24914896 |
| Unit 255 | 1.24984503 | Unit 285 | 1.24976695 |
| Unit 256 | 1.24961305 | Unit 286 | 1.25023198 |
| Unit 257 | 1.24945796 | Unit 287 | 1.25015497 |
| Unit 258 | 1.24930406 | Unit 288 | 1.24945700 |
| Unit 259 | 1.25023198 | Unit 289 | 1.24860704 |
| Unit 260 | 1.24883795 | Unit 290 | 1.25100803 |
| Unit 261 | 1.24899399 | Unit 291 | 1.24961197 |
| Unit 262 | 1.24837506 | Unit 292 | 1.24891603 |
| Unit 263 | 1.25147200 | Unit 293 | 1.24845195 |
| Unit 264 | 1.25000000 | Unit 294 | 1.24999905 |
| Unit 265 | 1.24945796 | Unit 295 | 1.24860501 |
| Unit 266 | 1.24907100 | Unit 296 | 1.24930298 |
| Unit 267 | 1.24937999 | Unit 297 | 1.24876201 |
| Unit 268 | 1.24875998 | Unit 298 | 1.24969006 |
| Unit 269 | 1.24976802 | Unit 299 | 1.24961305 |
| Unit 270 | 1.24961305 | Unit 300 | 1.25023198 |

FIG. 19E

|          | Result Test 4 |          | Result Test 4 |
|----------|---------------|----------|---------------|
| Unit 220 | 0.99953103    | Unit 250 | -0.9817522    |
| Unit 221 | 0.59943015    | Unit 251 | -0.1803134    |
| Unit 222 | 0.40339681    | Unit 252 | 1.08379552    |
| Unit 223 | -1.0558419    | Unit 253 | -0.7022151    |
| Unit 224 | 1.21560149    | Unit 254 | 0.5540035     |
| Unit 225 | 0.90115922    | Unit 255 | 1.43611732    |
| Unit 226 | 1.77844605    | Unit 256 | 0.77977718    |
| Unit 227 | -1.1968199    | Unit 257 | 1.10443335    |
| Unit 228 | -1.8732938    | Unit 258 | -0.5427755    |
| Unit 229 | -2.2390737    | Unit 259 | -0.9226484    |
| Unit 230 | 2.37532758    | Unit 260 | 0.30360525    |
| Unit 231 | -0.0156743    | Unit 261 | -0.7902236    |
| Unit 232 | 1.41879213    | Unit 262 | -0.5864676    |
| Unit 233 | 0.55585346    | Unit 263 | -0.1343934    |
| Unit 234 | 0.89279075    | Unit 264 | -0.4608412    |
| Unit 235 | -0.9515018    | Unit 265 | -0.5625405    |
| Unit 236 | -1.9955974    | Unit 266 | 0.29899255    |
| Unit 237 | 0.15524347    | Unit 267 | -0.4445108    |
| Unit 238 | -0.8487835    | Unit 268 | -0.2193805    |
| Unit 239 | -1.0695485    | Unit 269 | -0.9517721    |
| Unit 240 | 1.83644011    | Unit 270 | -2.7432485    |
| Unit 241 | 0.61771611    | Unit 271 | -1.6538141    |
| Unit 242 | -0.9095555    | Unit 272 | 0.28364077    |
| Unit 243 | -0.353164     | Unit 273 | 0.92420259    |
| Unit 244 | -1.1124837    | Unit 274 | 0.23307515    |
| Unit 245 | -1.4535354    | Unit 275 | 0.228437      |
| Unit 246 | 1.70230925    | Unit 276 | -0.6597587    |
| Unit 247 | 0.57151707    | Unit 277 | -2.1160689    |
| Unit 248 | -1.7739678    | Unit 278 | -3.5368065    |
| Unit 249 | -0.0117667    | Unit 279 | -2.2395526    |

FIG. 21A

|  | Result Test 4 |  | Result Test 4 |  | Result Test 4 |
|---|---|---|---|---|---|
| Unit 280 | -3.8468213 | Unit 310 | -3.6014589 | Unit 340 | -6.8239521 |
| Unit 281 | -3.0756388 | Unit 311 | -1.7810115 | Unit 341 | -4.6294489 |
| Unit 282 | -3.7748145 | Unit 312 | -3.2003162 | Unit 342 | -7.2539889 |
| Unit 283 | -2.2893912 | Unit 313 | -3.3686012 | Unit 343 | -3.9616372 |
| Unit 284 | -2.0872912 | Unit 314 | -5.2501338 | Unit 344 | -7.5403524 |
| Unit 285 | -2.1878491 | Unit 315 | -5.4413305 | Unit 345 | -6.3825829 |
| Unit 286 | -4.2938874 | Unit 316 | -3.7626614 | Unit 346 | -3.2998465 |
| Unit 287 | -1.7288701 | Unit 317 | -5.8810876 | Unit 347 | -7.5188596 |
| Unit 288 | -3.848908 | Unit 318 | -5.0105663 | Unit 348 | -6.3786487 |
| Unit 289 | -3.0541782 | Unit 319 | -6.6199646 | Unit 349 | -4.7624041 |
| Unit 290 | -1.2797389 | Unit 320 | -5.7322337 | Unit 350 | -4.7870031 |
| Unit 291 | -1.7690436 | Unit 321 | -8.0370456 | Unit 351 | -5.5212134 |
| Unit 292 | -2.9266397 | Unit 322 | -5.6279112 | Unit 352 | -8.854877 |
| Unit 293 | -1.5487635 | Unit 323 | -4.4465107 | Unit 353 | -7.3218363 |
| Unit 294 | -1.7515183 | Unit 324 | -6.0679978 | Unit 354 | -4.9481911 |
| Unit 295 | -1.1490466 | Unit 325 | -6.3955401 | Unit 355 | -6.7822833 |
| Unit 296 | -1.8452313 | Unit 326 | -7.3208683 | Unit 356 | -5.1679275 |
| Unit 297 | -2.6039109 | Unit 327 | -5.7586676 | Unit 357 | -7.2454266 |
| Unit 298 | -0.9031418 | Unit 328 | -5.3239946 | Unit 358 | -5.607411 |
| Unit 299 | -4.3160608 | Unit 329 | -4.8402737 | Unit 359 | -8.504849 |
| Unit 300 | -2.7340501 | Unit 330 | -6.4701815 | Unit 360 | -6.4334985 |
| Unit 301 | -4.2546593 | Unit 331 | -4.6291487 |  |  |
| Unit 302 | -2.7993609 | Unit 332 | -6.2276392 |  |  |
| Unit 303 | -2.197184 | Unit 333 | -6.4785729 |  |  |
| Unit 304 | -2.084548 | Unit 334 | -5.1921977 |  |  |
| Unit 305 | -1.7104044 | Unit 335 | -6.3368757 |  |  |
| Unit 306 | -3.510077 | Unit 336 | -6.0108119 |  |  |
| Unit 307 | -2.1315118 | Unit 337 | -7.3941961 |  |  |
| Unit 308 | -2.3264704 | Unit 338 | -6.6795425 |  |  |
| Unit 309 | -1.5463167 | Unit 339 | -4.4449265 |  |  |

|  | Lower Test Range Test 4 | Upper Test Range Test 4 |
|---|---|---|
| Unit 300 | -10.765608 | 5.0856066 |

| Unit | Test Value | LSL | HSL | Normalized Test Value | Type | Formula |
|---|---|---|---|---|---|---|
| 1 | 1.24899399 | 1.24 | 1.26 | 0.4496995 | Lower | X = (X-LSL)/(HSL-LSL) |
| 2 | 1.25038695 | | | 0.5193475 | Lower | X = (X-LSL)/(HSL-LSL) |
| 3 | 1.25007701 | | | 0.5038505 | Lower | X = (X-LSL)/(HSL-LSL) |
| 4 | 1.24891603 | | | 0.4458015 | Lower | X = (X-LSL)/(HSL-LSL) |
| 5 | 1.24868405 | | | 0.4342025 | Lower | X = (X-LSL)/(HSL-LSL) |
| 6 | 1.25015497 | | | 0.4922515 | Upper | X = (HSL-X)/(HSL-LSL) |
| 7 | 1.24930298 | | | 0.534851 | Upper | X = (HSL-X)/(HSL-LSL) |
| 8 | 1.24953604 | | | 0.523198 | Upper | X = (HSL-X)/(HSL-LSL) |
| 9 | 1.24814296 | | | 0.592852 | Upper | X = (HSL-X)/(HSL-LSL) |
| 10 | 1.25100696 | | | 0.449652 | Upper | X = (HSL-X)/(HSL-LSL) |

FIG. 22

| LTR | 1.24507475 | | | 0.2537375 | | 1.24507475 | L = LSL + (HSL-LSL)*LTR |
|---|---|---|---|---|---|---|---|
| UTR | 1.25349956 | | | 0.325022 | | 1.25349956 | U = USL - (HSL-LSL)*LTR |

SYSTEM AND METHODS FOR PARAMETRIC TESTING

REFERENCE TO COPENDING APPLICATIONS

This application is a continuation in part of International application number PCT/IL2009/001208 filed Dec. 22, 2009, which is a continuation-in-part from U.S. application Ser. No. 12/341,431 filed Dec. 22, 2008, both of which are hereby incorporated by reference herein.
The following US applications are co-pending:
Methods and Systems for Semiconductor Testing using a Testing Scenario Language

| Application # | Filed | Publication # | Published |
| --- | --- | --- | --- |
| 12/493,460 | Apr. 4, 2006 | US-2009-0265300 | Oct. 22, 2009 |

Systems and Methods For Test Time Outlier Detection and Correction in Integrated Circuit Testing

| Application # | Filed | Publication # | Published |
| --- | --- | --- | --- |
| 12/418,024 | Apr. 3, 2009 | US-2009-0192754 | Jul. 30, 2009 |
| 13/113,409 | May 23, 2011 | | |

System and Methods for Parametric Test Time Reduction

| Application # | Filed | Publication # | Published |
| --- | --- | --- | --- |
| 12/341,431 | Dec. 22, 2008 | US-2010-0161276 | Jun. 24, 2010 |

System and Method for Binning at Final Test

| Application # | Filed | Publication # | Published |
| --- | --- | --- | --- |
| 12/497,798 | Jul. 6, 2009 | US-2011-0000829 | Jan. 6, 2011 |

Misalignment Indication Decision System and Method

| Application # | Filed |
| --- | --- |
| 12/944,363 | Nov. 11, 2010 |

FIELD OF THE INVENTION

The present invention relates generally to testing semiconductor devices and more particularly to parametric testing.

BACKGROUND OF THE INVENTION

State of the art Test Time Reduction "TTR" systems are described in U.S. Pat. No. 6,618,682 to Bulaga et al and U.S. Pat. No. 6,711,514 to Bibbee.
The following US patents are owned by Applicant:
Augmenting semiconductor's devices quality and reliability

| Patent # | Granted |
| --- | --- |
| 7,340,359 | Mar. 04, 2008 |

Optimize Parallel Testing

| Patent # | Granted |
| --- | --- |
| 7,208,969 | Apr. 24, 2007 |

Methods and Systems for Semiconductor Testing using a Testing Scenario Language

| Patent # | Granted |
| --- | --- |
| 7,567,947 | Jul. 28, 2009 |

Methods and Systems for Semiconductor Testing Using Reference Dice

| Patent # | Granted |
| --- | --- |
| 7,532,024 | May 12, 2009 |
| 7,679,392 | Mar. 16, 2010 |
| 7,737,716 | Jun. 15, 2010 |
| 7,777,515 | Aug. 17, 2010 |

Methods for Slow Test Time Detection of an Integrated Circuit During Parallel Testing

| Patent # | Granted |
| --- | --- |
| 7,528,622 | May 05, 2009 |

As described by Wikipedia's "Q-Q plot" entry:
"In statistics, a Q-Q plot ("Q" stands for quantile) is a graphical method for diagnosing differences between the probability distribution of a statistical population from which a random sample has been taken and a comparison distribution. An example of the kind of difference that can be tested for, is non-normality of the population distribution.

"For a sample of size n, one plots n points, with the (n+1)-quantiles of the comparison distribution (e.g. the normal distribution) on the horizontal axis (for $k=1, \ldots, n$), and the order statistics of the sample on the vertical axis. If the population distribution is the same as the comparison distribution this approximates a straight line, especially near the center. In the case of substantial deviations from linearity, the statistician rejects the null hypothesis of sameness.

"For the quantiles of the comparison distribution typically the formula $k/(n+1)$ is used. Several different formulas have been used or proposed as symmetrical plotting positions. Such formulas have the form $(k-a)/(n+1-2a)$ for some value of a in the range from 0 to ½. The above expression $k/(n+1)$ is one example of these, for a=0. Other expressions include:

$(k-1/3)/(n+1/3)$ $(k-0.3175)/(n+0.365)$ $(k-0.326)/(n+0.348)$ $(k-0.375)/(n+0.25)$ $(k-0.44)/(n+0.12)$

"For large sample size, n, there is little difference between these various expressions."

The disclosures of all publications and published patent documents mentioned in the specification, and of the publications and published patent documents cited therein directly or indirectly, are hereby incorporated by reference.

SUMMARY OF THE INVENTION

According to the present invention, there is provided a method of determining whether or not to perform an action based at least partly on an estimated maximum test range, the method comprising: attaining results generated from a parametric test performed on semiconductor devices included in a control set comprising a subset of a population of semiconductor devices; selecting from among the semiconductor devices at least one extreme subset including at least one of a high-scoring subset including all devices whose results exceed a high cut-off point and a low-scoring subset including all devices whose results fall below a low cut-off point; plotting at least results of the at least one extreme subset as a normal probability plot located between a zero probability axis and a one probability axis; fitting a plurality of curves to a plurality of subsets of the results of the at least one extreme subset respectively; extending each of the plurality of curves to the zero probability axis for the low-scoring subset or to the one probability axis for the high scoring subset thereby to define a corresponding plurality of intersection points along the zero or one probability axis; defining an estimated maximum test range based on at least one of the intersection points; and determining whether or not to perform an action based at least partly on the estimated maximum test range.

According to the present invention, there is also provided a system for determining whether or not to perform an action based at least partly on an estimated maximum test range, the system comprising: an attainer for attaining results generated from a parametric test performed on semiconductor devices included in a control set comprising a subset of the population of semiconductor devices; a selector for selecting from among the semiconductor devices at least one extreme subset including at least one of a high-scoring subset including all devices whose results exceed a high cut-off point and a low-scoring subset including all devices whose results fall below a low cut-off point; a plotter for plotting at least results of the at least one extreme subset as a normal probability plot located between a zero probability axis and a one probability axis; a fitter for fitting a plurality of curves to a plurality of subsets of the results of the at least one extreme subset respectively; an extender for extending each of the plurality of curves to the zero probability axis for the low-scoring subset or to the one probability axis for the high-scoring subset thereby to define a corresponding plurality of intersection points along the zero or one probability axis; a definer for defining the estimated maximum test range based on at least one of the intersection points; and a determiner for determining whether or not to perform an action based at least partly on the estimated maximum test range.

According to the present invention, there is further provided a program storage device readable by machine, tangibly embodying a program of instructions executable by the machine to perform a method of determining whether or not to perform an action based at least partly on an estimated maximum test range, the method comprising: attaining results generated from a parametric test performed on semiconductor devices included in a control set comprising a subset of a population of semiconductor devices; selecting from among the semiconductor devices at least one extreme subset including at least one of a high-scoring subset including all devices whose results exceed a high cut-off point and a low-scoring subset including all devices whose results fall below a low cut-off point; plotting at least results of the at least one extreme subset as a normal probability plot located between a zero probability axis and a one probability axis; fitting a plurality of curves to a plurality of subsets of the results of the at least one extreme subset respectively; extending each of the plurality of curves to the zero probability axis for the low-scoring subset or to the one probability axis for the high-scoring subset thereby to define a corresponding plurality of intersection points along the zero or one probability axis; defining an estimated maximum test range based on at least one of the intersection points; and determining whether or not to perform an action based at least partly on the estimated maximum test range.

According to the present invention, there is yet further provided a computer program product comprising a computer useable medium having computer readable program code embodied therein for determining whether or not to perform a an action based at least partly on an estimated maximum test range, the computer program product comprising: computer readable program code for causing the computer to attain results generated from a parametric test performed on semiconductor devices included in a control set comprising a subset of a population of semiconductor devices; computer readable program code for causing the computer to select from among the semiconductor devices at least one extreme subset including at least one of a high-scoring subset including all devices whose results exceed a high cut-off point and a low-scoring subset including all devices whose results fall below a low cut-off point; computer readable program code for causing the computer to plot results of the at least one extreme subset as a normal probability plot located between a zero probability axis and a one probability axis; computer readable program code for causing the computer to fit a plurality of curves to a plurality of subsets of the results of the at least one extreme subset respectively; computer readable program code for causing the computer to extend each of the plurality of curves to the zero probability axis for the low-scoring subset or to the one probability axis for the high-scoring subset thereby to define a corresponding plurality of intersection points along the zero or one probability axis; computer readable program code for causing the computer to define an estimated maximum test range based on at least one of the intersection points; and computer readable program code for causing the computer to determine whether or not to perform an action based at least partly on the estimated maximum test range.

BRIEF DESCRIPTION OF THE DRAWINGS

Certain embodiments of the present invention are illustrated in the following drawings:

FIGS. 4A-4E, taken together, form a table of example test results for an example set of 300 validation units, all provided in accordance with certain embodiments of the present invention.

FIG. 8A is a table of the highest 5% of the values of the normal quantile probability plot of FIG. 5, in accordance with certain embodiments of the present invention.

FIG. 8B is a table of summarizing values computed from the table of FIG. 8A, in accordance with certain embodiments of the present invention.

FIGS. 10A-10E are tables and graphs which compare computations toward test range estimation where only one site is used or multiple sites which do not statistically differ are used, to computations toward test range estimation where multiple, statistically different, sites are used, all in accordance with certain embodiments of the present invention.

FIGS. 11-13 are tables and a graph which are useful in determining various parameters during set-up, in accordance with certain embodiments of the present invention.

FIG. 14 is a table comparing five numerical examples of the operation of the method of FIGS. 1-3 described herein, all provided in accordance with certain embodiments of the present invention.

FIGS. 16A-16B, taken together, form a table with measurements of non-validation units, all provided in accordance with certain embodiments of the present invention.

FIGS. 18A-18D, taken together, form a table presenting measurements of non-validation units, all provided in accordance with certain embodiments of the present invention.

FIGS. 19A-19E, taken together, form a table with measurements of non-validation units, all provided in accordance with certain embodiments of the present invention.

FIGS. 21A-21C, taken together, form a table of measurements of non-validation units, all provided in accordance with certain embodiments of the present invention.

FIG. 22 is a table showing examples of normalization computations, in accordance with certain embodiments of the present invention.

DETAILED DESCRIPTION OF CERTAIN EMBODIMENTS

Figure 1:
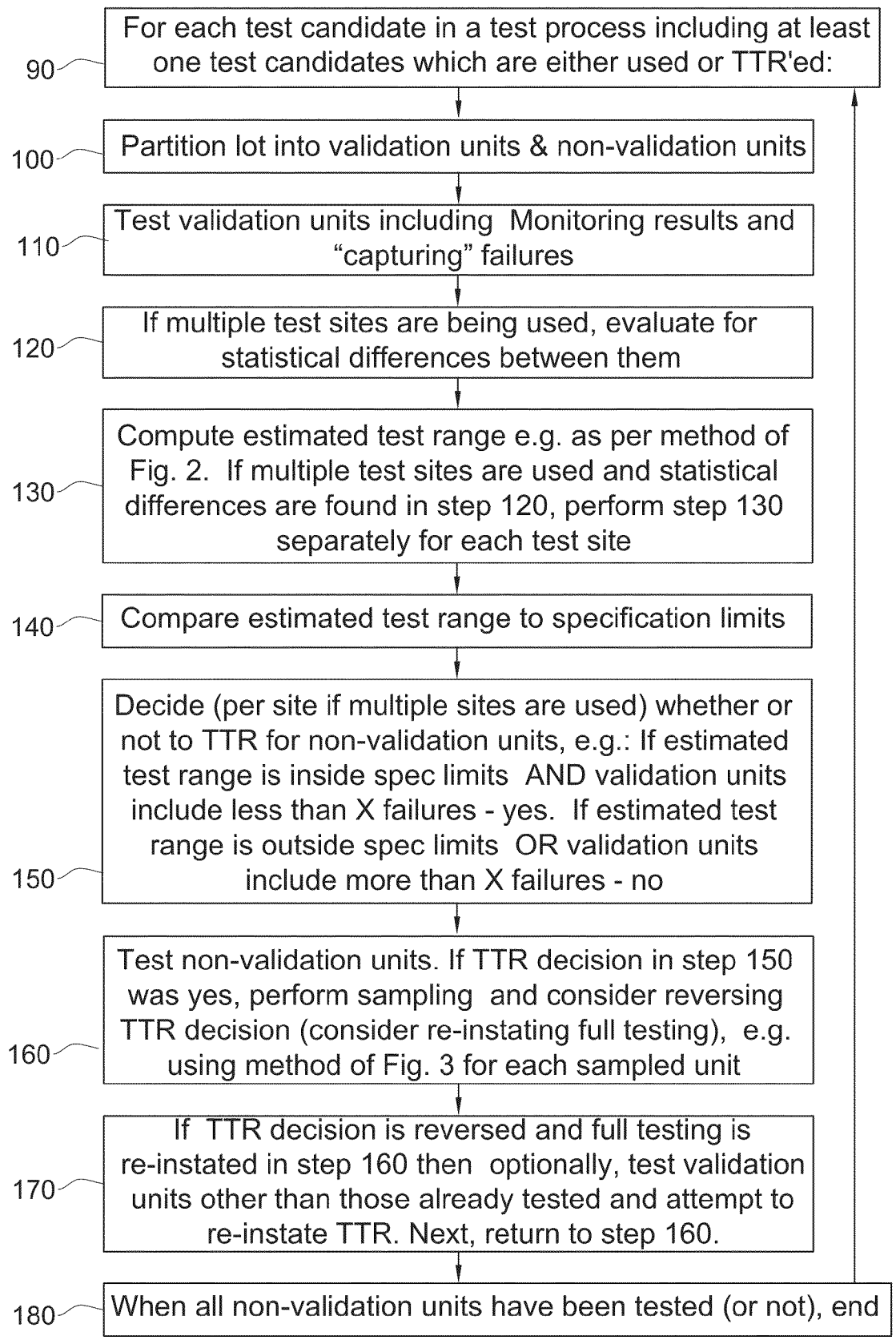
FIG. 1 is a simplified flowchart illustration of a top level method for reducing test time by analyzing an individual parametric test within a test set and selectively disabling that test, the method being operative in accordance with certain embodiments of the present invention.

As used herein, the phrases "e.g.", "for example," "such as", "for instance", and variants thereof describe non-limiting examples of the present invention.

Reference in the specification to "one embodiment", "an embodiment", "some embodiments", "another embodiment", "other embodiments", "one instance", "some instances", "one case", "some cases", "other cases" or variants thereof means that a particular feature, structure or characteristic described in connection with the embodiment(s) is included in at least one embodiment of the invention. Thus the appearance of the phrase "one embodiment", "an embodiment", "some embodiments", "another embodiment", "other embodiments" one instance", "some instances", "one case", "some cases", "other cases" or variants thereof does not necessarily refer to the same embodiment(s).

Features of the present invention which are described in the context of separate embodiments may also be provided in combination in a single embodiment. Conversely, features of the invention, including method steps, which are described for brevity in the context of a single embodiment or in a certain order may be provided separately or in any suitable sub-combination or in a different order.

Any trademark occurring in the text or drawings is the property of its owner and occurs herein merely to explain or illustrate one example of how an embodiment of the invention may be implemented.

The following terms or variants thereof may be construed either in accordance with any definition thereof appearing in the prior art literature or in accordance with the specification, or as follows:

T-Test: statistical test used to check a hypothesis equating means of two populations.

ANOVA: analysis-of-variance, a statistical model comparing several sample means to determine whether or not the sampled populations differ significantly.

Linear extrapolation: creating an outwardly extending line at an extremity of a body of data, typically a tangent of a curve fitting the body of data or the portions thereof which are adjacent to the extremity, so as to extend the data outward beyond its limit.

Polynomial extrapolation: extending outward a polynomial curve fitting a body of known data or just extreme values thereof.

Extrapolation: constructing new data points extending beyond a range defined by a discrete set of known data points.

Parametric test: Test yielding measurements (also termed herein "results") which are multi-valued, as opposed to binary pass/fail.

Lot: a population of units to be tested, e.g. parametrically

Site: A testing functionality which may operate in parallel to other testing functionalities, thereby speeding up testing of a lot by allowing the testing process to be performed on several units at a time rather than one unit at a time.

Validation units: in some embodiments, units within the lot which are fully tested, typically for all test candidates, thereby to generate measurements which are used to determine which units other than the validation units should and should not be fully tested.

Non-validation units: in some embodiments, units within the lot which are not validation units and therefore, may or may not be tested.

Sampled units: in some embodiments, a subset of the non-validation units which is fully tested.

Non-sampled units: in some embodiments, non-validation units which are not sampled units.

Sample rate: ratio of sampled units to the total number of non-validation units

Actual Test Range or Test Range: range of actual test results. For example if a test was executed on 3 devices and the measurements were 1.5, 2 and 4, the test range is 1.5 to 4.

Specification limits: upper and/or lower limits of a test that in some embodiments define the pass/fail criteria for that test. For example, a test may have a lower specification limit of 1 and an upper specification limit of 4 indicating that if a measurement taken for the specific test is between 1 and 4, the test is passed whereas if the measurement is either below 1 or above 4 the test is failed.

Sampling: in some embodiments, performing, on at least one individual semiconductor device within a population to be tested, at least one test which has been disabled.

Disabling a test: (a) controlling a test program flow such that a particular "disabled" test is not performed (complete disabling) or is performed on less devices or less frequently or less rigorously or more quickly (partial disabling) than if the test were enabled or (b) defining the test program flow such that the disabled test is a priori absent or performed on less devices or performed less frequently, less rigorously or more quickly than if the test were enabled.

Enabling a test: (a) controlling a test program flow such that a particular "enabled" test is performed (complete enabling) or is performed on more devices or more frequently or more rigorously or more slowly (partial enabling) than if the test were disabled or (b) defining the test program flow such that the enabled test is a priori present or performed on more devices or performed more frequently, more rigorously or more slowly than if the test were disabled. In terms of a particular device, a test can be enabled retroactively after the device has already undergone testing (without having that test applied), thus causing test augmentation for that previously tested device, and/or the test can be enabled prior to testing the device.

Wafer: Interim structure including dies which are also termed herein semiconductor devices or units.

Vmax: A maximum of various values extrapolated by fitting various curves to various subsets of measurements obtained from a test and extending those curves outward to determine theoretical values whose probability is either zero or one (e.g. by plotting various relatively high or relatively low measurements on a normal quantile probability plot and extending various curves fitted to at least some of those measurements, such as all lines interconnecting adjacent measurements, toward the plot's "probability=1" axis or its "probability=0" axis respectively). Such a maximum may be computed on measurements from control units. For example in some embodiments the maximum may be computed on measurements obtained in a first stage, from validation units or in a second stage, from a combination of validation units and sampled units.

Vmin: A minimum of various values extrapolated by fitting various curves to various subsets of measurements obtained from a test and extending those curves outward to determine theoretical values whose probability is either zero or one (e.g. by plotting various relatively high or relatively low measurements on a normal quantile probability plot and extending various curves fitted to at least some of those measurements, such as all lines interconnecting adjacent measurements, toward the plot's "probability=1" axis or its "probability=0" axis respectively). Such a minimum may be computed on measurements from control units. For example in some embodiments the maximum may be computed on measurements obtained in a first stage, from validation units or in a second stage, from a combination of validation units and sampled units.

Extrapolation Amplitude: Vmax−Vmin

Lower Test Range: In some embodiments Vmin. In some embodiments Vmin−Safety Coefficient*Extrapolation Amplitude Upper Test Range: In some embodiments Vmax. In some embodiments Vmax+Safety Coefficient*Extrapolation Amplitude Estimated maximum test range (also referred to below as Maximum Test Range, Estimated Test Range, "ETR" and variants thereof) in some embodiments is a range between two points defined by a Lower Estimated Test Range value and an Upper Estimated Test Range value. In some embodiments the Estimated Maximum Test Range may instead represent a value defined by the Lower Estimated Test Range value or Upper Estimated Test Range value. It is appreciated that the estimated maximum test range is in some embodiments a result of extrapolation from the upper and/or lower tails of parametric data from control units as described in more detail below.

Control units: In some embodiments, units from which measurements may potentially be used in calculating the estimated maximum test range. In some of these embodiments, measurements from less than all available control units are used in calculating the estimated maximum test range.

Non Control units: In some embodiments, units which are not control units and are therefore not included in the estimated maximum test range calculation.

Units: semiconductor devices. Optionally, the population of units under test comprises semiconductor devices contained in wafers and the test program flow comprises a wafer sort test program flow. Alternatively or in addition, the population of units under test may include a population of packaged semiconductors and the test program flow comprises an FT (final test) test program flow. Other possibilities are within the scope of the invention such as a population of singulated devices that have not yet been packaged and the test program flow comprises an appropriate test program flow.

Certain embodiments of the present invention seek to provide improved test time reduction "TTR" methods. Certain of the embodiments described herein include analyzing test results collected on validation units and extrapolating from these to obtain an estimated maximum test range for non-validation units for which no actual test range is available since these units have not been tested. If the estimated maximum test range, for a specific test, is safely inside the test Specification limits, according to suitable criteria for safety which may be user defined, the test is for example turned off or "TTR'ed" for example for the upcoming units in the lot and/or upcoming lots. If the estimated maximum test range, for a specific test, exceeds the test specification limits, the test is for example executed or turned on or kept on or "not TTR'ed", for example for the upcoming units in the lot and/or upcoming lots. Typically, a decision, based on data collected on validation units, is applied to non-Validation units.

In certain of these embodiments, a similar evaluation is typically executed on additional units in the lot, called sampled units. Once testing of non-validation units begins, assuming the test candidate is "turned off", sampling of this test begins in order to validate the original decision. The data collected on sampled units is added to the population of validation units and the estimated maximum test range is computed, for example anew for each sampled unit or periodically, based on the combined population. If the estimated maximum test range exceeds the test specification limit/s, the test is for example turned back on, for example executed for upcoming units in the lot and/or upcoming lots until such time as further sampling may demand that the test be for example turned back off and/or executed on previously tested units whose test flow excluded that test; and so on.

For simplicity of description, it is assumed that specification limits include upper and lower limits and that the estimated maximum test range also is bound by upper and lower values. However in other embodiments where the estimated maximum test range equals either the Upper Estimated Test Range value or the Lower Estimated Test Range Value and is compared to an upper or lower specification limit respectively, similar methods and systems to those described below may be used, mutatis mutandis. For example, if the measurement being monitored is the amount of power consumed by units, then in some cases where a lower number is advantageous, only an upper specification limit may be specified and the estimated maximum test range (which in these cases equals the Upper Estimated Test Range value) will be compared to this upper specification limit.

For simplicity of description it is assumed in the description below that additional control unit data are appended to the existing data set when recalculating the ETR. However in any of the various embodiments described herein, the recalculation of the ETR may occur either by appending additional control unit data to the existing data-set, increasing the total number of data points in the data set, or may occur by substituting existing data point(s) (for example the earliest data point(s)) in the data-set with the most recent data point(s), maintaining a fixed number of data points for ETR calculation.

Referring now to the drawings, FIG. 1 is a simplified flowchart illustration of a method for reducing test time by analyzing an individual parametric test within a test set and selectively disabling that test. The method of FIG. 1 is typically performed for each test in a battery of tests (e.g. in a test program) comprising a plurality of tests, such as 100 tests, e.g. sequentially. It is executed typically although not necessarily for each lot separately and therefore, typically although not necessarily, the method adapts from lot-to-lot. For example, when testing lot A, tests 1-3 might pass the criteria in validation units whereas tests 4-5 might fail the criteria. When testing lot B, different tests may pass and fail the criteria. However in other embodiments, the results from one lot may additionally or alternatively be applied to additional lots, and/or may be applied to only part of the units in the same lot.

The user may decide that a subset of tests in a test program, e.g. tests 1-10 from among a 100-test program, should not be evaluated on a lot by lot basis and should not be subjected to the method of FIG. 1. An example for this includes "must have" tests which, even though they may never fail, must be executed for other reasons such as to protect test hardware, perform preconditioning to other tests, etc.

In FIG. 1, the set of control populations typically includes a first control population also termed herein Validation units and a second control population also termed herein Sampled units.

The method of FIG. 1 uses the upper and lower 5% (say) of control units comprising the Validation Units and later also the Sampled Units, to compute the range of the test values of the units which have not yet been tested and to compare the minimum and maximum of these ranges to the Test Specification Limits.

The method of FIG. 1 typically includes the following steps for each individual test:

Step 100: The lot is "split" (logically) into 2 parts. The first part includes Validation units and the second part includes non-Validation units. For example, a lot that includes 10,000 devices may be split into the first 300 units and then the remaining 9700 units. "Full" testing is then performed on the 300 Validation units and based on the results and analysis on these units, a decision will be made on how to test the remaining 9700 non-validation units.

Any suitable methodology, such as simulation techniques and trial and error, may be used during a set-up stage, in order to determine a suitable proportion of the lot to allocate to validation units. For example, one suitable method for determining a suitable proportion, during set-up, is described herein below with reference to FIGS. 11-13.

Step 110: Validation units are tested.
Step 120: Site comparison.
Step 130: Compute the estimated maximum test range of the non-validation units based on the data collected in step 120 regarding the Validation units. In this step the Validation units are the control units. A suitable method for performing step 130 is described below with reference to FIG. 2.
Step 140: Comparison of estimated maximum test range to specification limits.
Step 150: Initial TTR decision based on estimated maximum test range. If the estimated maximum test range of the non-validation units is inside the test's Specification limits then decide to disable the test, for example turn off the test and not apply it to the non-validation units (typically other than for sampled units and other than as per re-decisions based on sampled units as described below) in step 160. Otherwise, decide to perform the test on the non-validation units in step 160. In some embodiments step 150 can also include a check of multiple conditions: For example, one of the conditions can relate to failure incidence (e.g. number or fraction of failing units)—check if each specific test candidate from among the 300 (say) validation units has failed T times, such as once (e.g. T may be 1), and if so, decide to perform the test on non-validation units in step 160. In these embodiments, the failure threshold T can designate an integer threshold (i.e. a number of units that failed the test should be less than T failures) or a fraction/percentage threshold (i.e. the fraction of units which fail the test should be less than T failures). Unit failure can be determined in any appropriate manner dependent on the embodiment. The failure threshold may be determined based on PPM budget considerations and/or based on the degree of tolerance of failures which characterizes the application. The failure threshold may or may not be the same for each test. Additionally in this example another condition may check if the estimated maximum test range is outside the test's specification limits and if so decide to perform the test on non-validation units in step 160. In this example, if the maximum estimated test range is inside the Specification limits—and validation units include less than T failures, then decide to disable the test, for example turning off the test and not applying it to the non-validation units (typically other than for sampled units and other than as per re-decisions based on sampled units as described below) in step 160. Depending on the embodiment, the condition of being inside/outside specification limits may refer to completely inside/outside or partly inside/outside the specification limits.

Step 160: Test non-validation units. In some embodiments, if it was decided to disable the test, then sampling is performed e.g. one unit from each pre-determined number of units is sampled. Sampling once every N units (where in this case N is the sample rate) includes "full" testing of, say, one unit, for example by turning back on the test that was for example turned off for the units preceding the N'th, 2N'th, etc. units. Depending on the embodiment the sample rate may be constant or may vary during testing (i.e. N may be constant or may vary). In one embodiment, the sample rate, N, may for example equal 10, or a suitable application-specific value may be determined e.g. by simulation. The measurement obtained from full testing of every N'th unit is added to the measurements obtained from the Validation units in order to determine whether or not to re-enable the test for all non-validation units. A suitable method for determining whether or not to re-enable the test based on sampling is described below with reference to FIG. 3. Alternatively, step 130 may be repeated for each sampled unit using the data relating to the validation units and the sampled unit(s).

Step 170: Optionally, if the test was re-enabled in Step 160, then repeat steps 110, 120, 130, 140 and 150 for a different group of validation units in an attempt to again disable the test for the non-validation units (typically other than for sampled units and other than as per re-decisions based on sampled units as described herein). If step 170 was executed, then after completing step 170 return to step 160.

Step 180: End when all non-validation units have been tested (or not). In some embodiments, if there are any additional untested lots, the method restarts for the next untested lots. Alternatively, the method may restart in the middle of the same lot. Alternatively one or more additional lots may be evaluated by returning to step 160.

Figure 2:
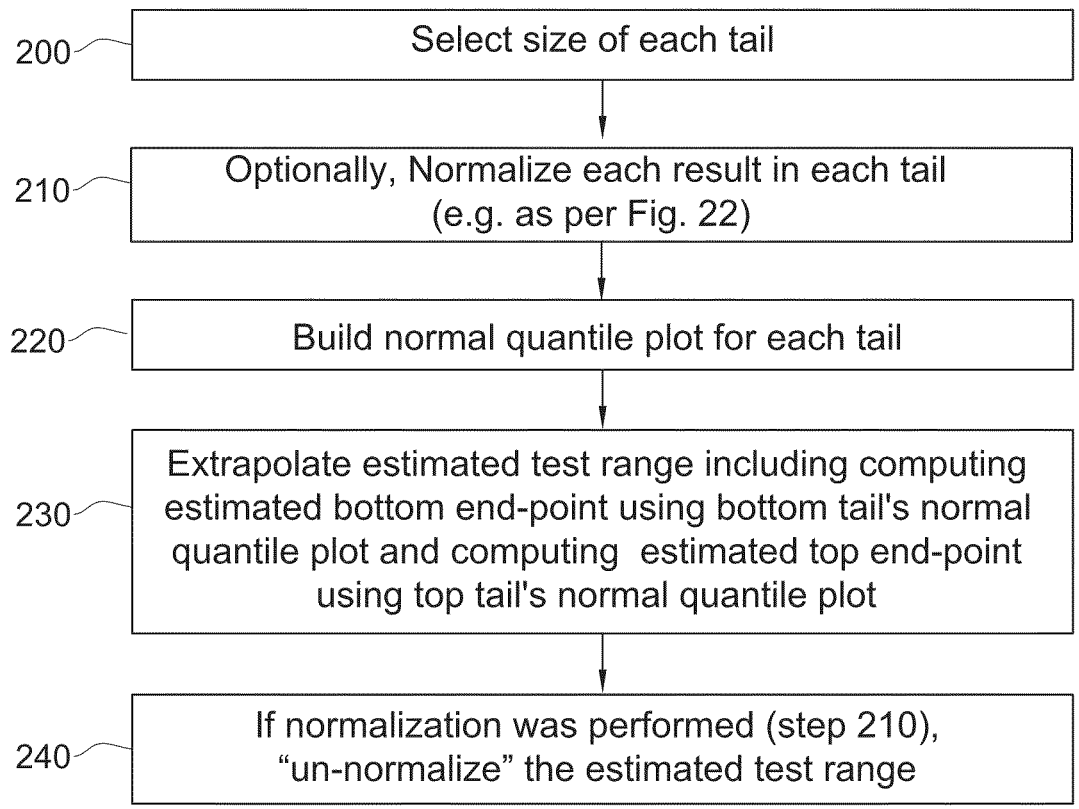
FIG. 2 is a simplified flowchart illustration of a method for computing the estimated maximum test range, the method being operative in accordance with certain embodiments of the present invention.
Figure 3:
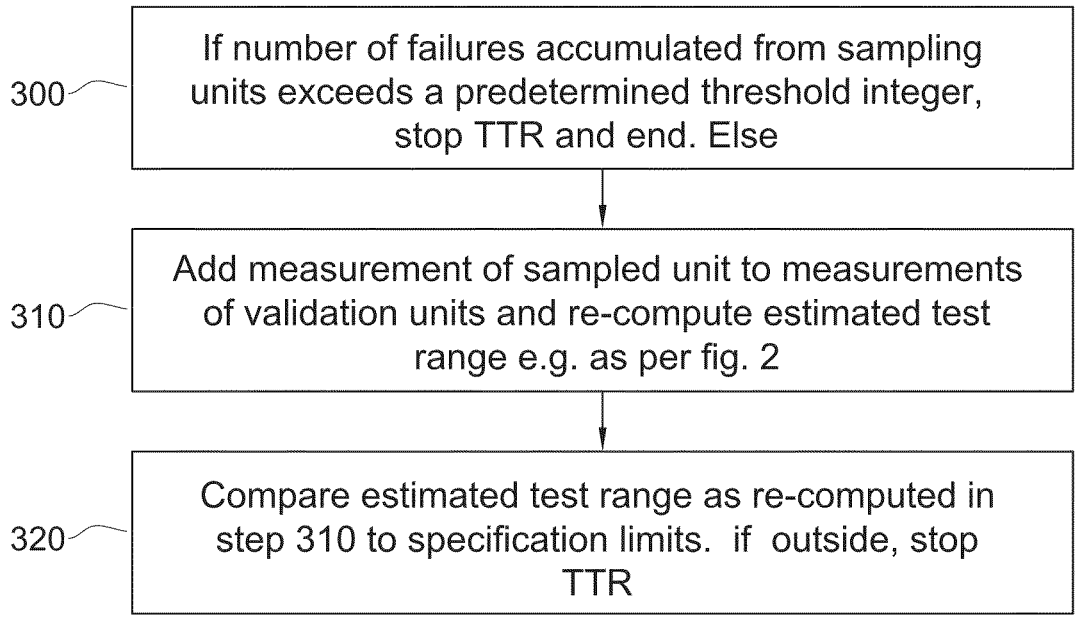
FIG. 3 is a simplified flowchart illustration of a method for determining whether or not to re-enable a test as part of step 160 of FIG. 1, the method being operative in accordance with certain embodiments of the present invention.
Figure 26:
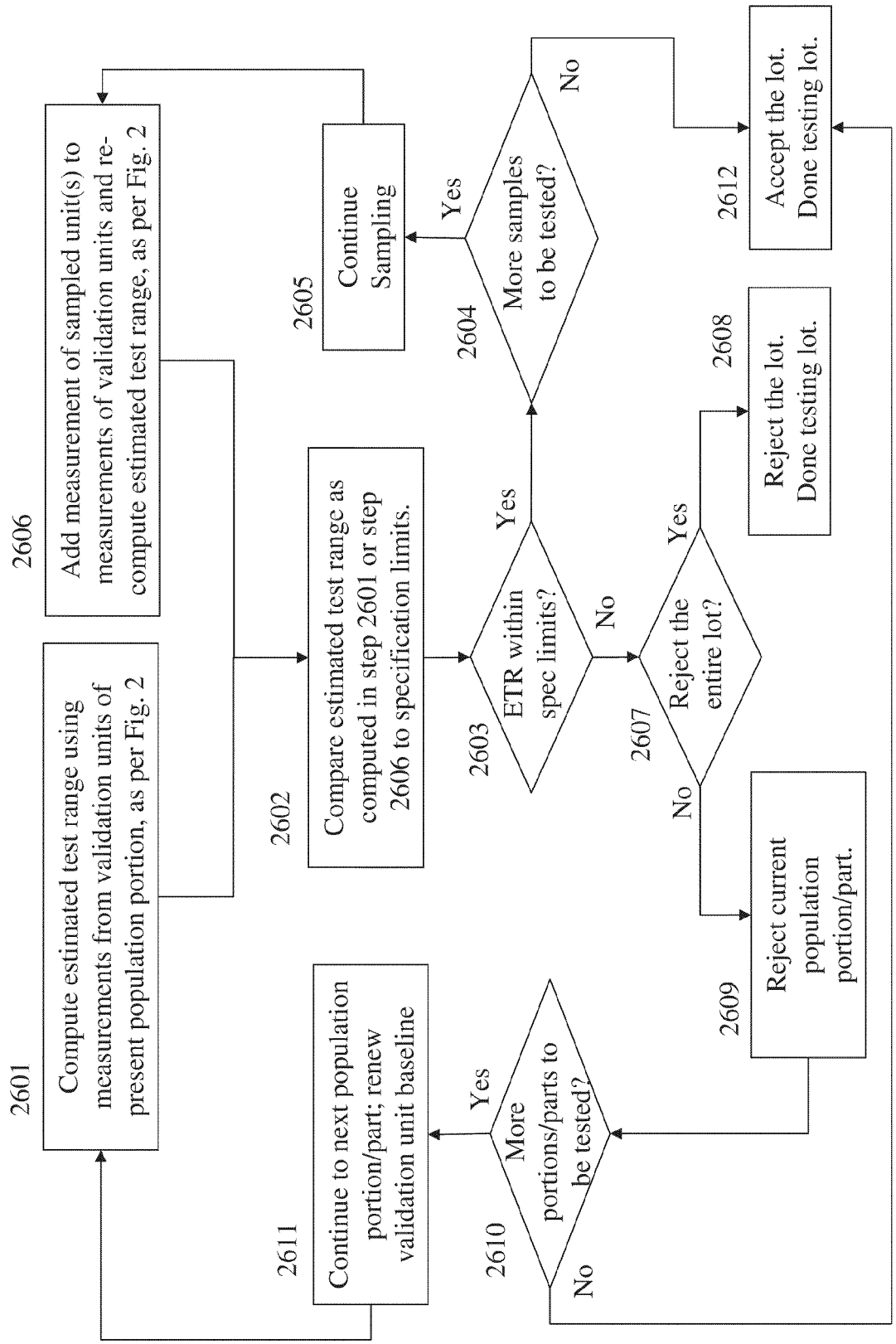
FIG. 26 is a simplified flowchart illustration of a method for material acceptance/rejection, the method being operative in accordance with certain embodiments of the present invention.
Figure 27:
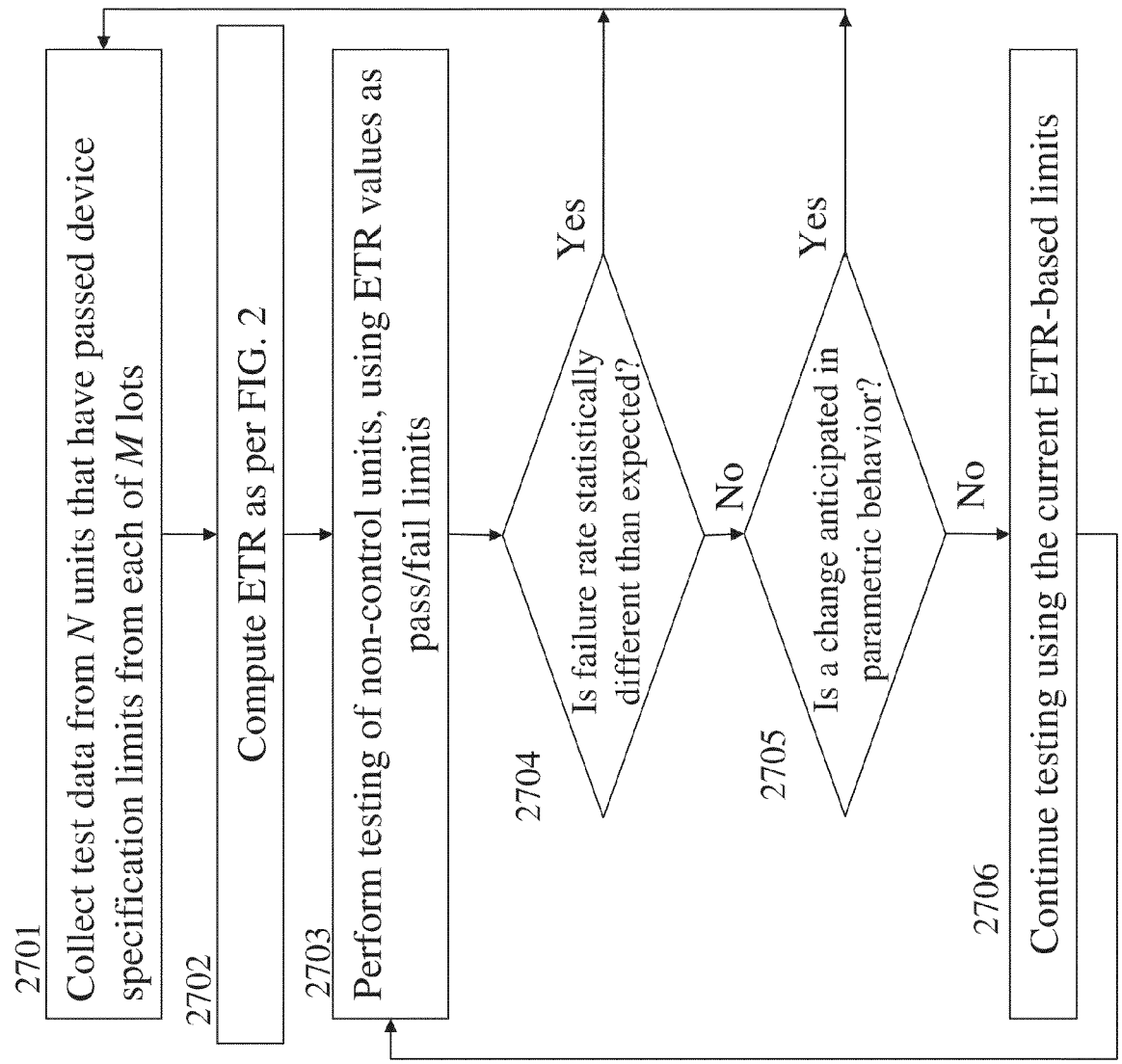
FIG. 27 is a simplified flowchart illustration of a method for applying estimated maximum test range based pass/fail limits, the method being operative in accordance with certain embodiments of the present invention.
Figure 28:
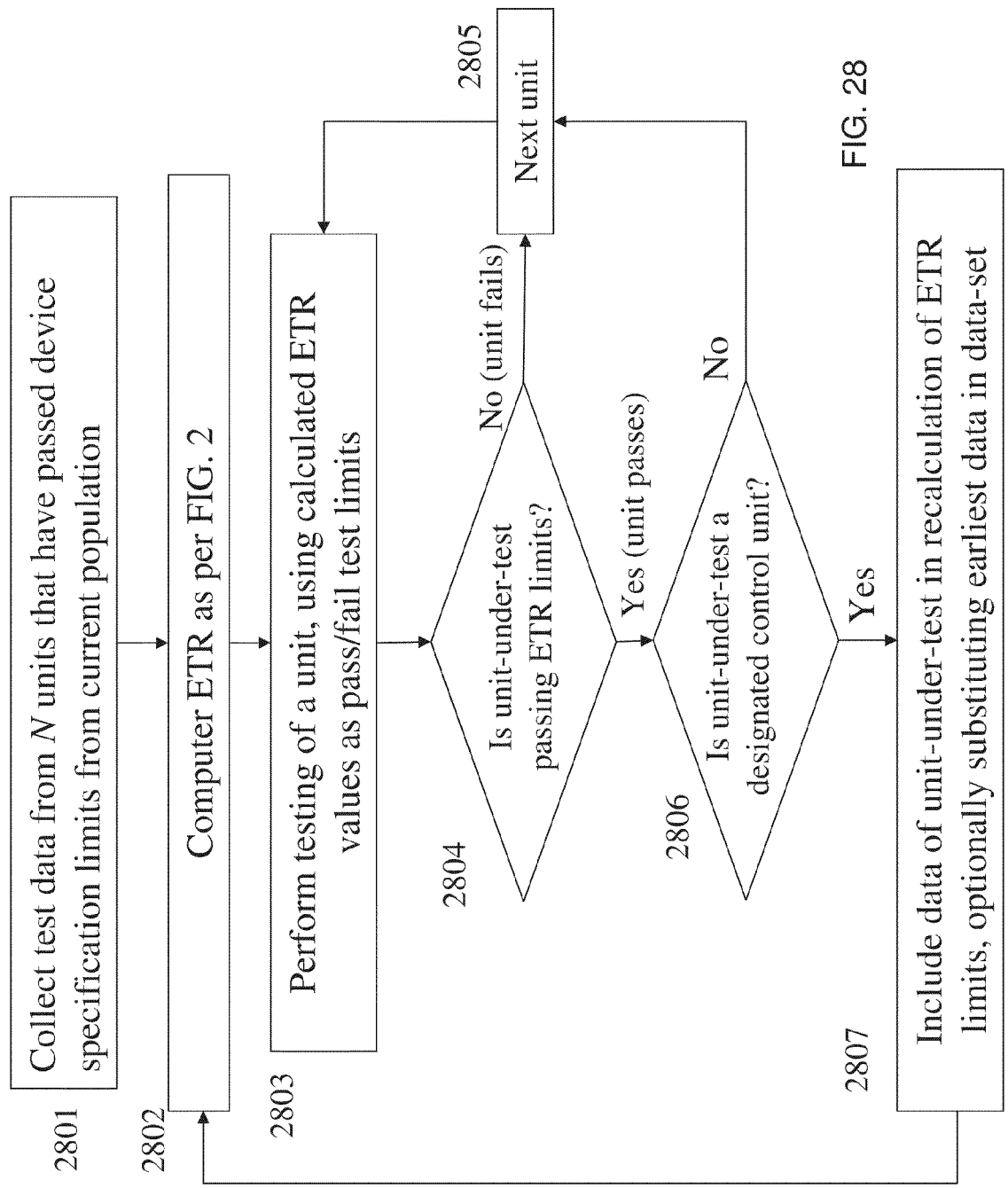
FIG. 28 is a simplified flowchart illustration of another method for applying estimated maximum test range based pass/fail limits, the method being operative in accordance with certain embodiments of the present invention.
Figure 29:
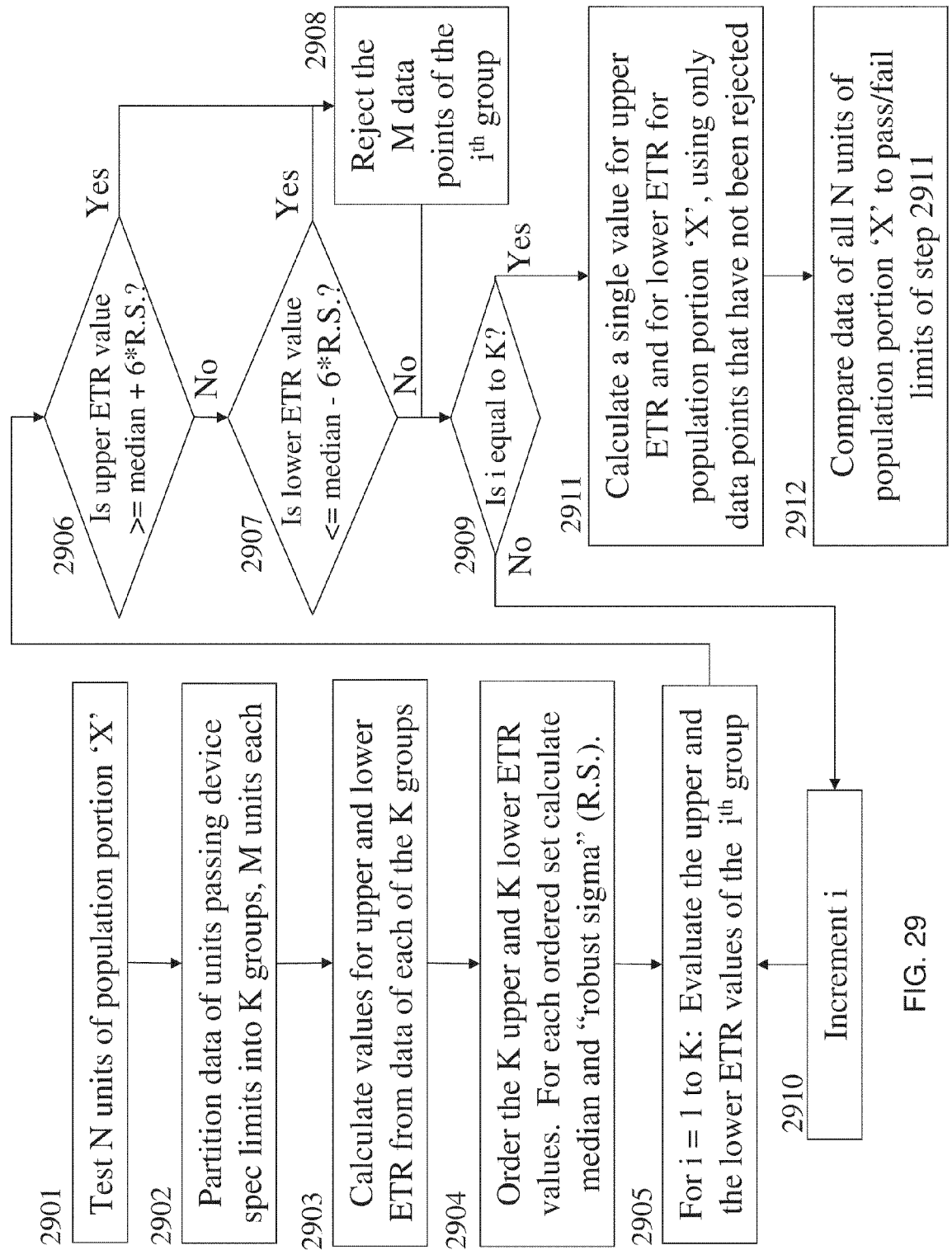
FIG. 29 is a simplified flowchart illustration of a method for excluding data from the calculation of the estimated maximum test range, the method being operative in accordance with certain embodiments of the present invention.
Figure 30:
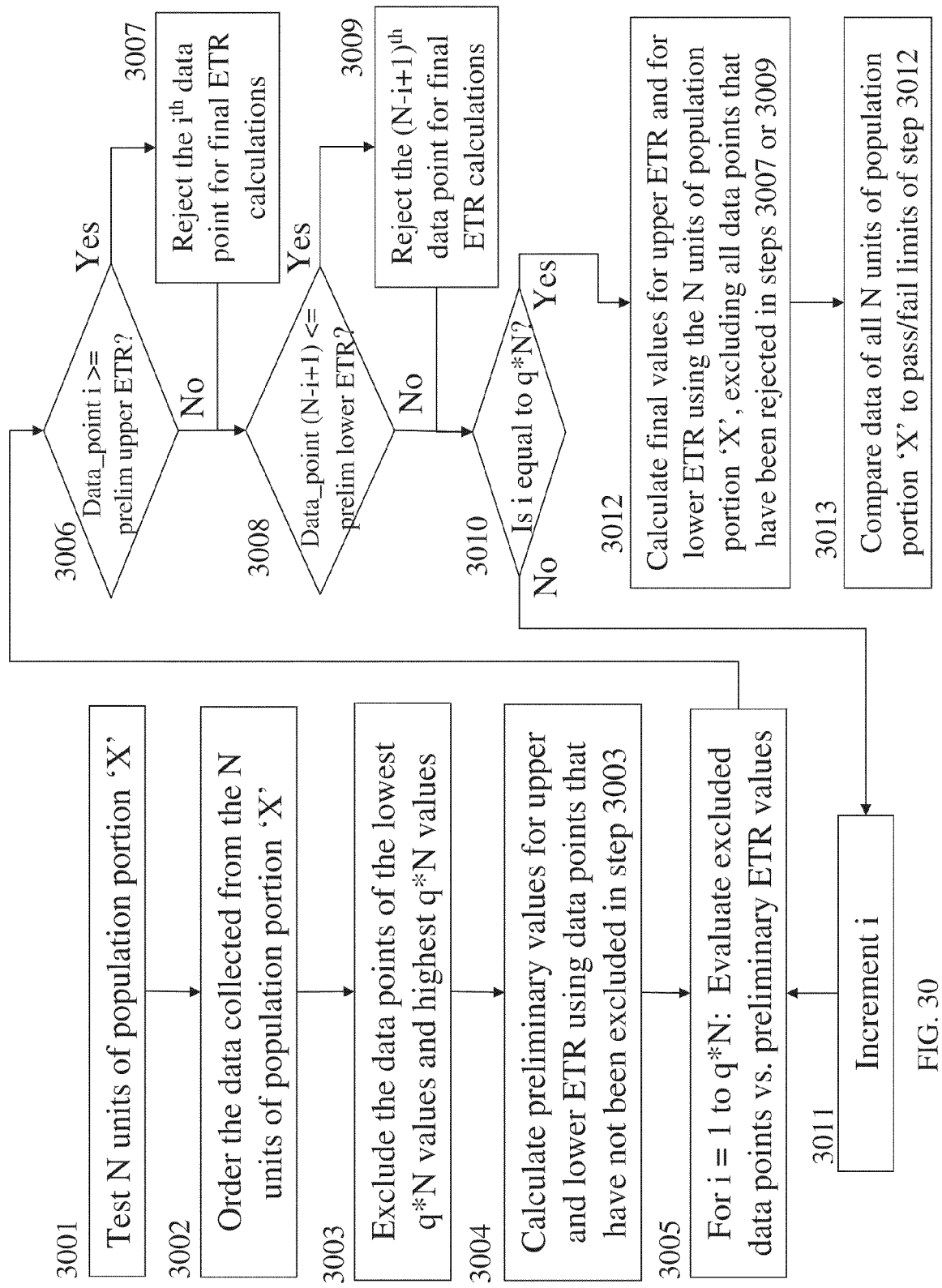
FIG. 30 is a simplified flowchart illustration of another method for excluding data from the calculation of the estimated maximum test range, the method being operative in accordance with certain embodiments of the present invention.

FIG. 2 is a simplified flowchart illustration of a method for performing the estimated maximum test range computation, for example in step 130 in FIG. 1, step 310 of FIG. 3, step 2601 and/or 2606 of FIG. 26, step 2702 of FIG. 27, step 2802 of FIG. 28, step 2903 and/or 2911 of FIG. 29, and/or step 3004 and/or 3012 of FIG. 30. The method of FIG. 2 may be exactly as illustrated and/or may comprise the following operations:

First in step 200, select the upper and/or lower 5% (say) of the control unit population i.e. a high-scoring subset including all devices whose results exceed a high cut-off point and/or a low-scoring subset including all devices whose results fall below a low cut-off point In some cases, the values of these high and low cutoff points are equal to the test results of the control units that respectively occupy the 95 percentile and 5 percentile rank positions (say) within the sorted list of all control units, It is appreciated that the size of the tail used in step 200 need not be 5% and instead, any suitable tail size may be employed such as 1% or 10%. A suitable method for determining an acceptable tail size, during set up, is described herein below with reference to FIGS. 11-13.

Optionally in step 210 normalize each result of each tail.

Then in step 220, build a normal probability plot for normalized values (or the actual measurements) and select upper 5% (say) and lower 5% (say) of the population. The upper 5% of the plot are used to compute an Upper Test Range in which all values within the upper 5% of the plot fall, and the lower 5% of the plot are used to compute a Lower Test Range in which all values within the lowest 5% of the plot fall. A "normal probability plot", also termed herein as a "normal quantile probability plot" is a term used herein to refer to a plot which resembles a conventional normal quantile plot except that the x axis represents probabilities rather than normal quantiles.

Depending on the embodiment, the plot built in step 220 may include the values (normalized or actual) of all control units, of only one of the tails or of only both tails. If the plot includes the values of all control units, then in some embodiments, step 210 when performed includes the normalization of the values of all the control units. Alternatively or additionally, if the plot includes the values of all control units, then in some embodiments the selection step 200 is performed after step 220 and before step 230.

In step 230, extrapolate from the sub-set of the control unit measurements to estimate expected results likely to accrue from non-control units. The lowest 5% of the population of the control units are used to compute the lower test range (the lowest expected value of the non-control population). For each pair of points (raw or normalized unit test results) on the normal quantile probability plot take intersection of the straight line, passed through this pair, with the {probability=0} axis of the normal probability plot. The zero probability axis refers in some embodiments to a vertical line positioned at the point on the X axis of the plot marking a probability value of zero. Note that depending on the embodiment, each curve may be fitted to any number of points equal to or greater than two and the curve fitting may be performed using any linear or non-linear function. For simplicity of description it is assumed herein that two points (i.e. a pair of points) are used and that each curve is a line. Let VMax and VMin be the maximum and minimum y-coordinates respectively of these intersections over all point pairs in the normal probability plot generated in step 220. Optionally, reduce the number of pairs to only those pairs of points which are adjacent when the measurements derived from testing the control units are ranked. Next, compute the extrapolation amplitude for the range of values of the lowest 5% of the control unit population: extrapolation amplitude=VMax−VMin. Finally, compute the lower test range of the non-control unit population. In one embodiment, the lower estimated test range value=Vmin while in another embodiment the lower estimated test range value is reduced (for additional safety) by a suitable safety factor, for example the product of a "safety coefficient", and the extrapolation amplitude. Therefore in this latter embodiment the estimated lower test range value may be computed as follows:

Lower estimated test range value=$V$min−extrapolation amplitude*safety coefficient.

Similarly, the highest 5% of the population of the control units are used to compute the upper test range (the highest expected value of the non-control population). For each pair of points (raw or normalized unit test results) on the normal quantile probability plot take intersection of the straight line, passed through this pair, with the {probability=1} axis of the normal probability plot. The one probability axis refers in some embodiments to a vertical line positioned at the point on the X axis of the plot marking a probability value of one. Note that depending on the embodiment, each curve may be fitted to any number of points equal to or greater than two and the curve fitting may be performed using any linear or non-linear function. For simplicity of description it is assumed herein that two points (i.e. a pair of points) are used and that each curve is a line. Let VMax and VMin be the maximum and minimum y-coordinates respectively of these intersections over all point pairs in the normal probability plot generated in step 220. Optionally, reduce the number of pairs to only those pairs of points which are adjacent when the measurements derived from testing the control units are ranked. Next, compute the extrapolation amplitude for the range of values of the highest 5% of the control unit population: extrapolation amplitude=VMax−VMin. Finally, compute the upper test range of the non-control unit population. In one embodiment the upper estimated test range value=Vmax while in another embodiment the upper estimate test range value is increased (for additional safety) by a suitable safety factor, for example the product of the safety coefficient and the extrapolation amplitude. Therefore in this latter embodiment the estimated upper test range may be computed as follows:

Upper estimated test range=$V$max+extrapolation amplitude*safety coefficient.

It is noted that the Vmax and Vmin computed for the lower estimated test range are typically although not necessarily different than the Vmax and Vmin calculated for the upper estimated test range.

In one embodiment the estimated maximum test range is the range between the two points defined by the estimated lower test range value and the estimated upper test range value, whereas in other embodiments the estimated maximum test range may equal the estimated lower test range value or the upper estimated test range value.

Any suitable methodology, such as simulation techniques and trial and error, may be used during a set-up stage, in order to determine a suitable safety coefficient. For example, one suitable method for determining a suitable safety coefficient during set-up is described herein below with reference to FIGS. 11-13.

In step 240, if normalization was performed in step 210, un-normalize the estimated maximum test range, for example as described further below.

In some embodiments, the method of determining the estimated maximum test range, for example as described with reference to FIG. 2 is advantageous over prior art statistics used in parametric testing in that no assumptions need be made about the form of the overall distribution of data in the population and no analytical mathematical model needs to be applied to the data other than the fitting of curves. Because of this, the method may be applied to arbitrary data distributions, without modification of the method. Additionally or alternatively, since only points from the tails of the data sets are used in the method of some embodiments, any skewness or modality in the body of the distribution of sampled unit data (in points excluded from the quantile plots) will in some cases have no effect on the outcome. Additionally or alternatively, the method of some embodiments, exhibits in some case greater sensitivity to outlier data points than prior art methods based on parametric statistics, since the estimated maximum test range values are ultimately a function of individual data points, while the projections based on the models of parametric statistics are based on aggregate parameters calculated by combining a large set of individual points (such as the mean and the standard deviation), which mutes the impact of individual points on projections. Thus, in some cases an abrupt shift in the extremes of an underlying mother distribution can be more quickly identified from sampled unit data under the method of these embodiments than under the methods of prior art, so corrective action or appropriate response may in some cases be taken earlier.

FIG. 3 is a simplified flowchart illustration of a method for determining whether or not to re-enable a test based on sampling results as part of the estimated maximum test range computation step 160 of FIG. 1. The method of FIG. 3 may be exactly as illustrated and/or may comprise the following operations:

In step 300, check if the incidence of failures accumulated from sampling units exceeds a predetermined threshold integer or fraction, such as once (e.g. the integer may be 1). If so, discontinue the TTR by re-enabling the test, for example for upcoming units in the lot, for upcoming lot(s) and/or on previously tested units (which did not have that test applied). The failure threshold may be determined based on PPM budget considerations and/or based on the degree of tolerance of failures which characterizes the application. The threshold is not necessarily the same for every test. Unit failure can be determined in any appropriate manner dependent on the embodiment. In some embodiments, the incidence of failures among sampling units and validation units may be added together and checked against a predetermined threshold integer or fraction in order to determine whether or not to discontinue the TTR by re-enabling the test. For example, step 300 may be performed each time a sampled unit is tested or periodically after a plurality of sampled units have been tested. If the test is re-enabled then end the method of FIG. 3. Otherwise proceed to step 310.

In step 310, add the measurement(s) of the sampled unit(s) to measurements of validation units and recompute the estimated maximum test range, for example as described in FIG. 2. For example, step 310 may be performed each time a new sampled unit is tested, with the measurement of the newly tested sampled unit being added to the measurements of previously tested sampled units and validation units. As another example, step 310 may be performed periodically after a plurality of sampled units have been tested.

In step 320, check if the estimated maximum test range computed in step 310 is inside the Specification limits. If yes, then do not change the test flow for non-sampled units and have the test remain disabled (test not executed—therefore having TTR), for example continue to turn off the test for the following non-sampled units in the lot, continue to turn off the test for the following non-sampled units in upcoming lot(s), and/or do not retroactively apply the test to units which have been previously tested with a test flow excluding that test. Depending on the embodiment, the sample rate may stay constant or may vary once a decision is made not to change the test flow. If the estimated maximum test range is outside the Specification limits, then re-enable the test (test executed—therefore no TTR), for example turning on the test for following units in the lot, turning on the test for following non-sampled units in upcoming lot(s), and/or applying the test to units which had previously been tested without that particular test. Depending on the embodiment, the condition of being inside/outside specification limits may refer to completely inside/outside or partly inside/outside the specification limits.

It is appreciated that the particular method shown and described in FIGS. 1-3 is merely exemplary and is not intended to be limiting. For example, the method as shown uses logical combinations of the following two criteria to determine whether or not to have TTR or conversely terminate TTR: (a) whether or not the estimated test range is inside specification limits and (b) whether or not, de facto, the number of units or the fraction of units which fail an individual test exceeds a predetermined threshold (where the threshold is not necessarily the same for every test). It is appreciated that alternatively, either of the above two criteria may be used in isolation. Also, a different logical combination of the two may be employed. Also, other criteria may be added to or may replace one of criteria (a), (b) above. Also, sampling may be omitted from step 160. Also, step 170 may be omitted or may be performed only once without looping back to step 160. Also, the estimated maximum test range may be computed or determined by any suitable method and not necessarily as per the method of FIG. 2. Additionally, the sampling process per sampled unit need not be in accordance with the method of FIG. 3; for example, the newly estimated maximum test range need not be computed on the basis of combining the raw validation unit measurements and the sampled units and re-computing the estimated maximum test range; instead, the test range as estimated from the validation unit may be suitably and directly modified in accordance with information flowing in from sampled units. Also, the decision whether or not to enable/disable a test may be made additionally or alternatively on a basis other than estimation of maximum test range and comparison to specification limits.

In accordance with at least one embodiment of the present invention, there is therefore provided a parametric test time reduction method for reducing time expended to conduct a test program flow on a population of semiconductor devices, the test program flow comprising at least one parametric test having a specification which defines a known pass value range wherein a result of the test is considered a passing result if the result falls inside the known pass value range, the method comprising, for at least one parametric test, computing an estimated maximum test range, at a given confidence level, on a validation set comprising a subset of the population of semiconductor devices, the estimated maximum test range comprising the range of values into which all results from performing the test on the set will statistically fall at the given confidence level, the validation set defining a complementary set including all semiconductors included in the population and not included in the validation set; and at least partly disabling the at least one parametric test based at least partly on a comparison of the estimated maximum test range and the known pass value range.

Further in accordance with at least one embodiment of the present invention, the test is at least partly disabled if the estimated maximum test range falls at least partly inside the known pass value range.

Still further in accordance with at least one embodiment of the present invention, the test is at least partly disabled if the estimated maximum test range falls entirely inside the known pass value range.

Certain embodiments of the present invention are operative to analyze and evaluate parametric test measurements in real-time i.e. during the test as opposed to before or after the test has been performed, in order to decide if and for which parts of a population to be tested, a test (or tests) will be executed. A set of populations is typically in these embodiments evaluated in real-time. Therefore, additionally in accordance with at least one embodiment of the present invention, the method also comprises making an on-the-fly determination as to whether the estimated maximum test range falls at least partly inside the known pass value range and using the on-the-fly determination as a condition for at least partly re-enabling the at least one parametric test, the on the fly determination comprising re-computing the estimated maximum test range on an on-the-fly generated validation set comprising at least one tested semiconductor device absent from the validation set.

Additionally in accordance with at least one embodiment of the present invention, the method also comprises at least partly enabling the at least one parametric test, irrespective of the comparison, if even one semiconductor device within the validation set fails the parametric test.

Additionally in accordance with at least one embodiment of the present invention, the method also comprises at least partly re-enabling the at least one parametric test, irrespective of the on-the-fly determination, if even one semiconductor device within the on-the-fly generated validation set fails the parametric test.

Further in accordance with at least one embodiment of the present invention, computing an estimated maximum test range comprises performing the parametric test on semiconductor devices included in the validation set, thereby to generate results for the semiconductor devices respectively and selecting from among the semiconductor devices at least one extreme subset including at least one of a high-scoring subset including all devices whose results exceed a high cut-off point and a low-scoring subset including all devices whose results fall below a low cut-off point; plotting results of the at least one extreme subset as a normal quantile probability plot having a zero probability axis and fitting a plurality of curves to a plurality of subsets of the results respectively; extending each of the plurality of curves to the zero probability axis thereby to define a corresponding plurality of intersection points and thereby to define a zero probability range along the zero probability axis within which all the intersection points fall; and defining the estimated maximum test range to include the zero probability range.

Still further in accordance with at least one embodiment of the present invention, the estimated maximum test range includes the zero probability range extended outward by a safety factor.

Still further in accordance with at least one embodiment of the present invention, the subsets of the results comprise result pairs.

Additionally in accordance with at least one embodiment of the present invention, the plurality of subsets of the results comprises all result pairs which are adjacent.

Further in accordance with at least one embodiment of the present invention, the plurality of subsets of the results comprises only result pairs which are adjacent.

Additionally in accordance with at least one embodiment of the present invention, the known pass value range has only a single endpoint and wherein the at least one extreme subset comprises only one extreme subset.

Further in accordance with at least one embodiment of the present invention, the known pass value range has two endpoints.

Also in accordance with at least one embodiment of the present invention, there is provided a parametric test time reduction system for reducing time expended to conduct a test program flow on a population of semiconductor devices, the test program flow comprising at least one parametric test having a specification which defines a known pass value range wherein a result of the test is considered a passing result if the result falls inside the known pass value range, the method comprising a parametric test range estimator, operative for at least one parametric test, to compute an estimated maximum test range, at a given confidence level, on a validation set comprising a subset of the population of semiconductor devices, the estimated maximum test range comprising the range of values into which all results from performing the test on the set will statistically fall at the given confidence level, the validation set defining a complementary set including all semiconductors included in the population and not included in the validation set; and a parameter test disabler at least partly disabling the at least one parametric test based at least partly on a comparison of the estimated maximum test range and the known pass value range.

Further in accordance with at least one embodiment of the present invention, the population of semiconductor devices is contained in wafers and the test program flow comprises a wafer sort test program flow.

Still further in accordance with at least one embodiment of the present invention, the population of semiconductor devices comprises a population of packaged units and the test program flow comprises an FT (final test) test program flow.

Additionally in accordance with at least one embodiment of the present invention, the test is at least partly disabled if the estimated maximum test range falls at least partly inside the known pass value range.

Further in accordance with at least one embodiment of the present invention, the test is at least partly disabled if the estimated maximum test range falls entirely inside the known pass value range.

Additionally in accordance with at least one embodiment of the present invention, the method also comprises making an on-the-fly determination as to whether the estimated maximum test range falls entirely inside the known pass value range and using the on-the-fly determination as a condition for at least partly re-enabling the at least one parametric test, the on-the-fly determination comprising re-computing the estimated maximum test range on an on-the-fly generated validation set comprising at least one tested semiconductor device absent from the validation set.

Still further in accordance with at least one embodiment of the present invention, the condition comprises a necessary condition and/or a sufficient condition.

Further in accordance with at least one embodiment of the present invention, the at least one parametric test is conducted at a plurality of sites in parallel and wherein the estimated maximum test range is computed separately for each site from among the plurality of sites whose test results statistically differ from test results of other sites in the plurality of sites. Still further in accordance with at least one embodiment of the present invention, computing comprises normalizing test results of the subset of the population of semiconductor devices, thereby to generate normalized test results; and computing the estimated test range based on the normalized test results.

Also in accordance with at least one embodiment of the present invention, there is provided a computer usable medium having a computer readable program code embodied therein, the computer readable program code being adapted to be executed to implement at least one of the methods shown and described herein.

Example: A numerical example of the operation of some of the steps of the method of FIGS. 1-2 is now described with reference to FIGS. 4A-9, where in this example the estimated maximum test range is evaluated based on data from control units comprising validation units.

FIGS. 4A-4E, taken together, form a table of test result measures for an example parametric Test A applied to a lot of 300 validation units.

The lower and upper specification limits (pass/fail limits) for this test are 1.24 and 1.26, respectively.

Figure 5:
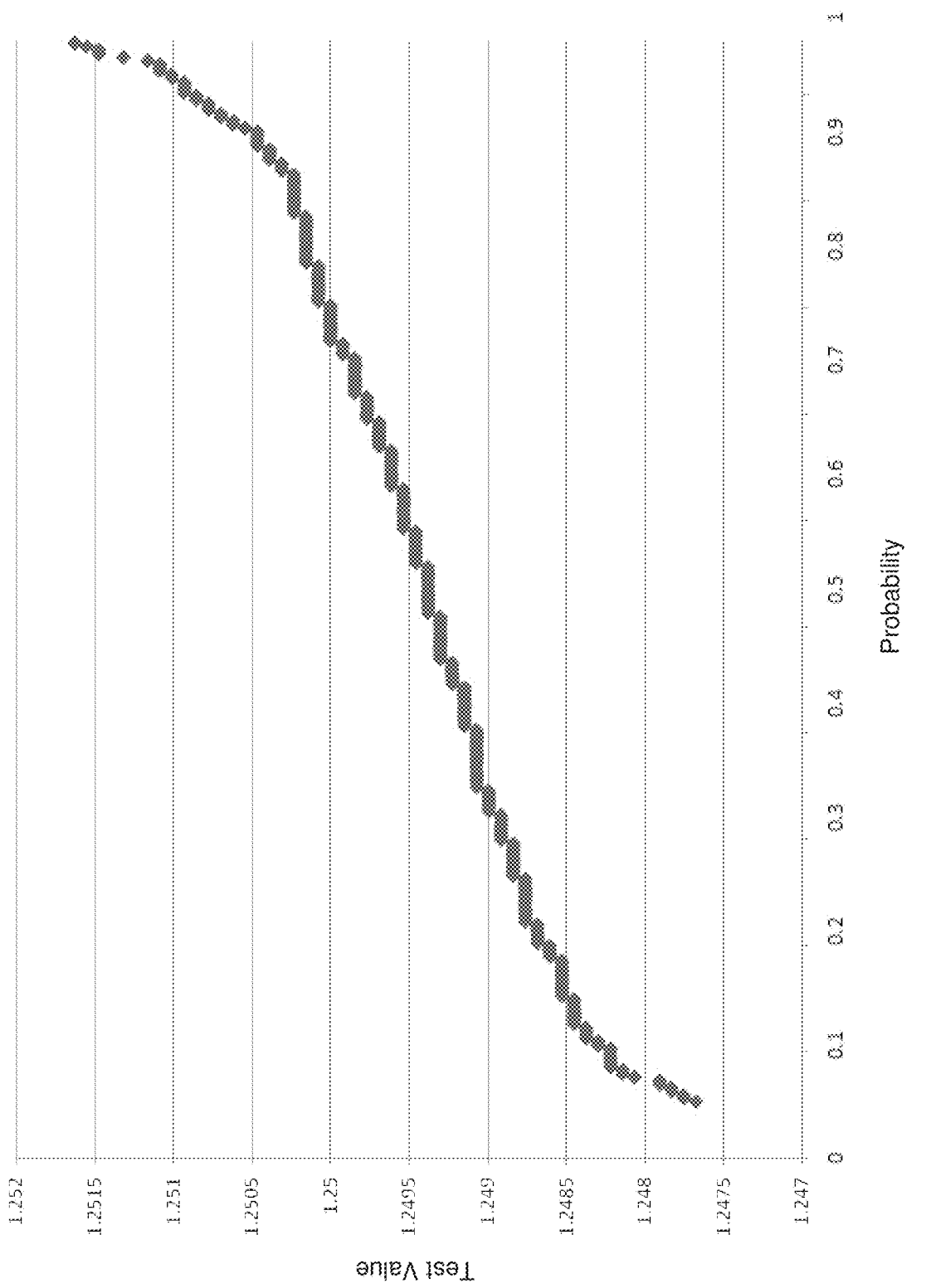
FIG. 5 is an example of a normal quantile probability plot, for the validation unit data of FIG. 4, all provided in accordance with certain embodiments of the present invention.
Figures 6A, 6B:
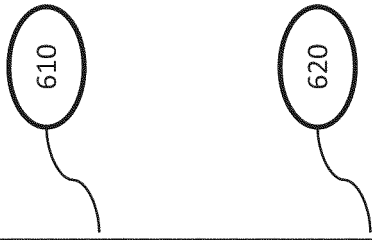
FIG. 6A is a table of the lowest 5% of the values of the normal quantile probability plot of FIG. 5, in accordance with certain embodiments of the present invention.
FIG. 6B is a table of summarizing values computed from the table of FIG. 6A, all provided in accordance with certain embodiments of the present invention.

FIG. 5 is a normal quantile probability plot for the validation unit data of FIG. 4. FIG. 6A is a table of the lowest 5% of the values (i.e. the 5%×300=15 lowest values) of the normal quantile probability plot of FIG. 5. The values themselves are shown in the first, leftmost column. Their respective probabilities are shown in the second, middle column. The probabilities were computed as described in Wikipedia, "Q-Q plot" entry, subsection entitled "Plotting positions".

$$\text{prob}[i]=(i-0.3175)/(N+0.365).$$

The linear extrapolations to the zero probability axis of the quantile plot i.e. the vertical axis in FIG. 5 is shown in the third, rightmost column. The linear extrapolations were computed using the following formula:

$$\text{Linear\_Extrapolation}[i]=y[i-1]-\text{prob}[i-1]*((y[i]-y[i-1])/(\text{prob}[i]-\text{prob}[i-1])),$$

where:
i=counter from 1 to 15
y=Test Values (first column in table of FIG. 6A)
prob=probabilities (second column in table of FIG. 6A)
In FIG. 6A, reference numeral 610 denotes Vmin and 620 denotes Vmax.

FIG. 6B is a table of summarizing values computed from the table of FIG. 6A. Vmax and Vmin are derived in accordance with step 220 in FIG. 2 as described in detail below with reference to FIG. 7. Extrapolation Amplitude (EA)= Vmax−Vmin. Lower Test Range=Vmin−Safety Coefficient*Extrapolation Amplitude, as shown in FIG. 7.

Figure 7:
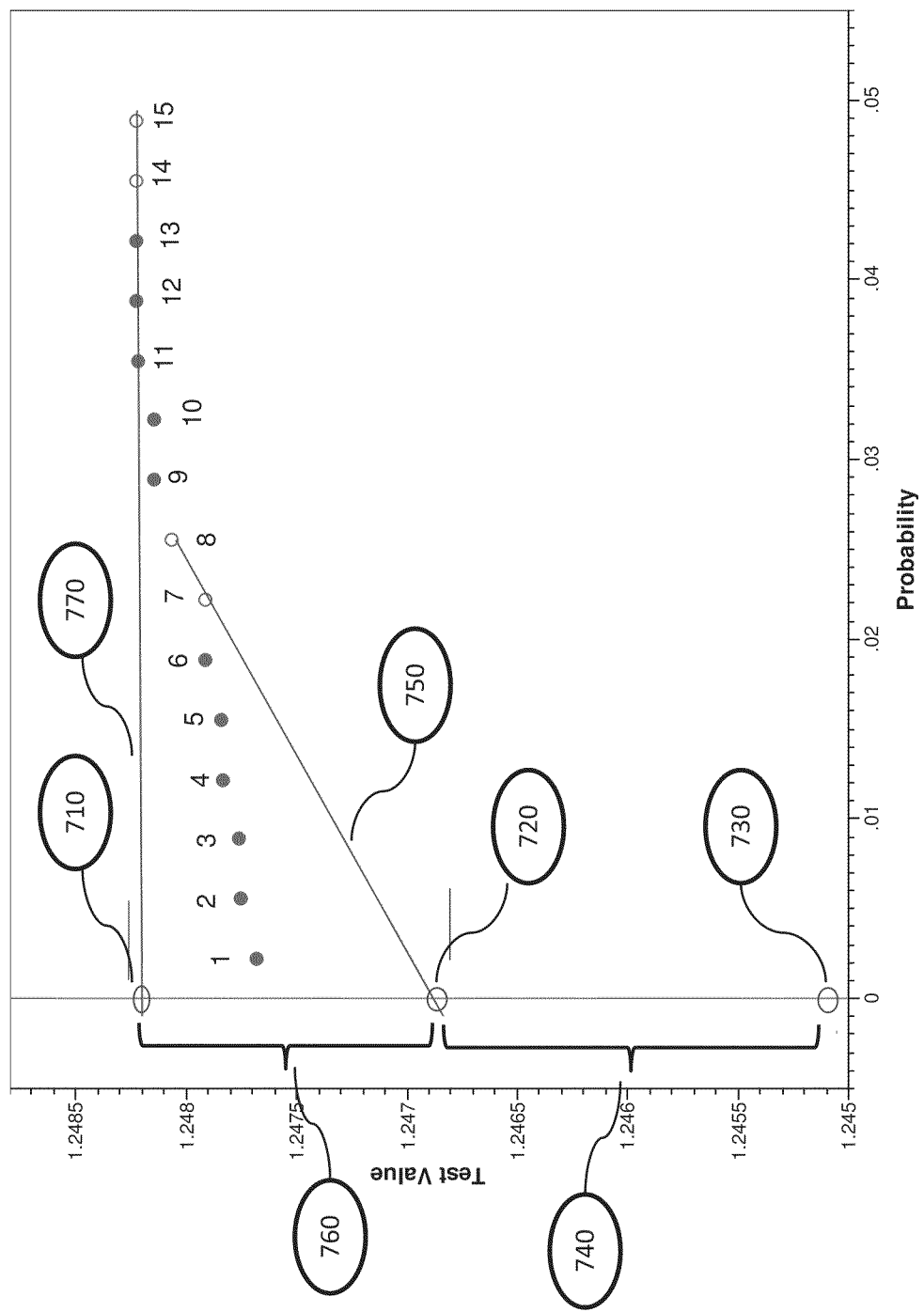
FIG. 7 is a zoom-in of the normal quantile probability plot of FIG. 5 showing only the 15 lowest scoring points, in accordance with certain embodiments of the present invention.

FIG. 7 is a zoom-in of the normal quantile probability plot of FIG. 5 showing only the 15 lowest scoring points. FIG. 7 is useful in understanding the derivation of the Vmax and Vmin values shown in the table of FIG. 6B. The Vmax and Vmin for the 15 lowest values, as described above with reference to step 220 in FIG. 2, are derived as follows: Vmax is the highest point of intersection between lines interconnecting adjacent points and the zero probability axis. Vmin is the lowest point of intersection between lines interconnecting adjacent points and the zero probability axis. In the illustrated example, the pair of points which yields Vmax comprises points 14 and 15 whereas the pair of points which yields Vmin comprises points 7 and 8. In FIG. 7, 710 denotes Vmax, 720 denotes Vmin, 730 denotes Lower Test Range which equals 1.24507, 740 denotes Extrapolation Amplitude*Safety Coefficient, 750 denotes the minimal Extrapolation, 760 denotes the Extrapolation Amplitude and 770 denotes the maximal Extrapolation.

FIG. 8A is a table of the highest 5% of the values (i.e. the 5%×300=15 highest values) of the normal quantile probability plot of FIG. 5. The values themselves are shown in the first, leftmost column. Their respective probabilities are shown in the second, middle column. The probabilities were computed as follows, as per Wikipedia, "Q-Q plot" entry, subsection entitled "Plotting positions":

$$\text{prob}[i]=(i-0.3175)/(N+0.365).$$

The linear extrapolations to the zero probability axis of the normal quantile probability plot i.e. the vertical axis in FIG. 5 are shown in the third, rightmost column. The linear extrapolations were computed using the following formula:

$$\text{Linear\_Extrapolation}[i]=y[i-1]+(1-\text{prob}[i-1]*((y[i]-y[i-1])/(\text{prob}[i]-\text{prob}[i-1])),$$

where:
i=counter from 1 to 15
y=Test Values (first column in table of FIG. 8A)
prob=probabilities (second column in table of FIG. 8A)
In FIG. 8A, reference numeral 810 denotes Vmin and 820 denotes Vmax.

FIG. 8B is a table of summarizing values computed from the table of FIG. 8A. Vmax and Vmin are derived in accordance with step 220 in FIG. 2 as described in detail below with reference to FIG. 9. Extrapolation Amplitude (EA)= Vmax−Vmin. Upper Test Range=Vmax+Safety Coefficient*Extrapolation Amplitude, as shown in FIG. 9.

Figure 9:
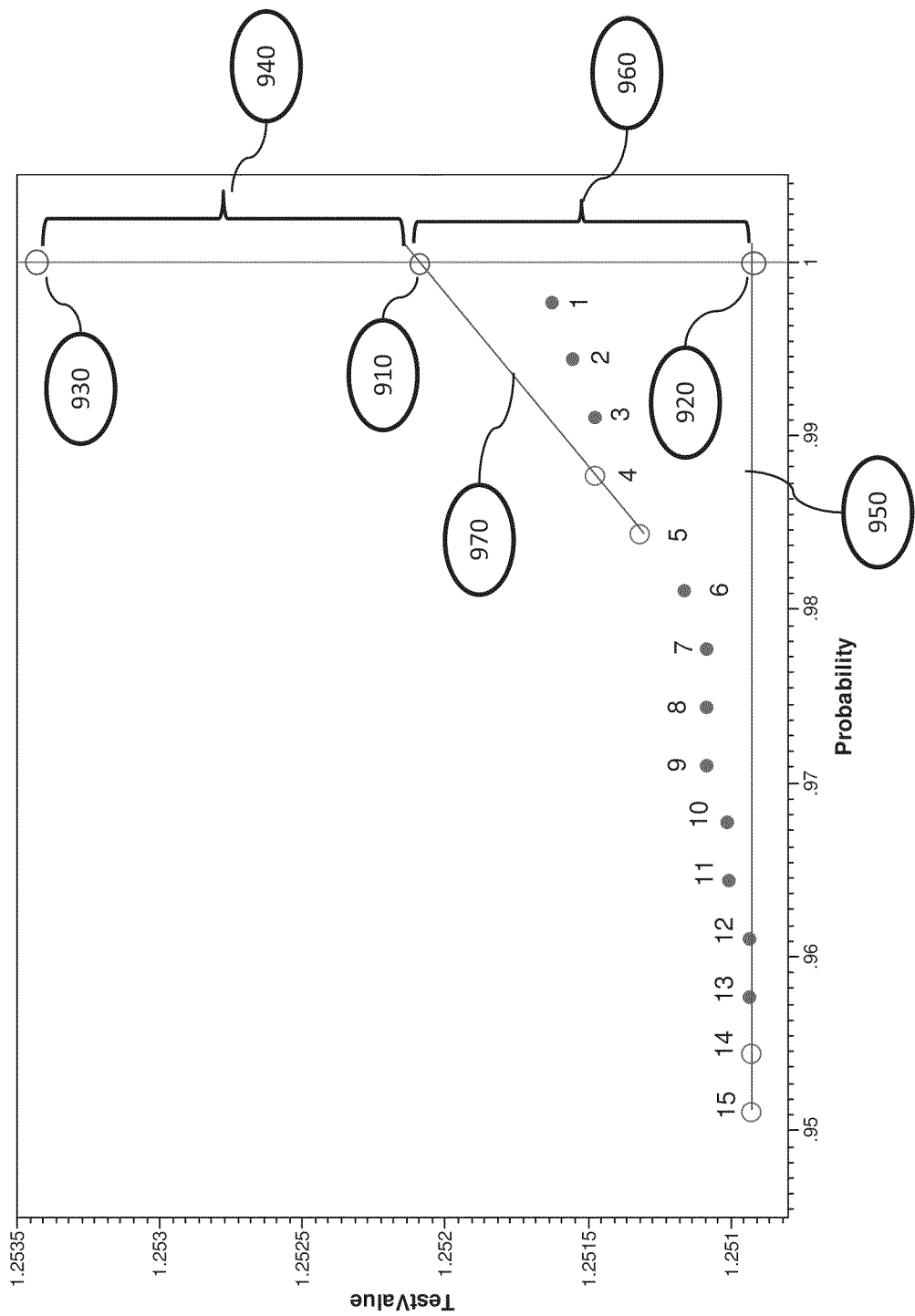
FIG. 9 is a zoom-in of the normal quantile probability plot of FIG. 5 showing only the 15 highest scoring points, in accordance with certain embodiments of the present invention.

FIG. 9 is a zoom-in of the normal quantile probability plot of FIG. 5 showing only the 15 highest scoring points. FIG. 9 is useful in understanding the derivation of the Vmax and Vmin values shown in the table of FIG. 8B. The Vmax and Vmin for the 15 highest values, as described above with reference to step 220 in FIG. 2, are derived as follows: Vmax is the highest point of intersection between lines interconnecting adjacent points and the one probability axis. Vmin is the lowest point of intersection between lines interconnecting adjacent points and the one probability axis. In the illustrated example, the pair of points which yields Vmax comprises points 11 and 12 whereas the pair of points which yields Vmin comprises points 1 and 2.

In FIG. 9, reference numeral 910 denotes Vmax, 920 denotes Vmin, 930 denotes the Upper Test Range which equals 1.25349 in the illustrated example, 940 denotes Extrapolation Amplitude*Safety Coefficient, 950 denotes the minimal Extrapolation, 960 denotes Extrapolation Amplitude and 970 denotes the maximal Extrapolation.

Figure 10C:
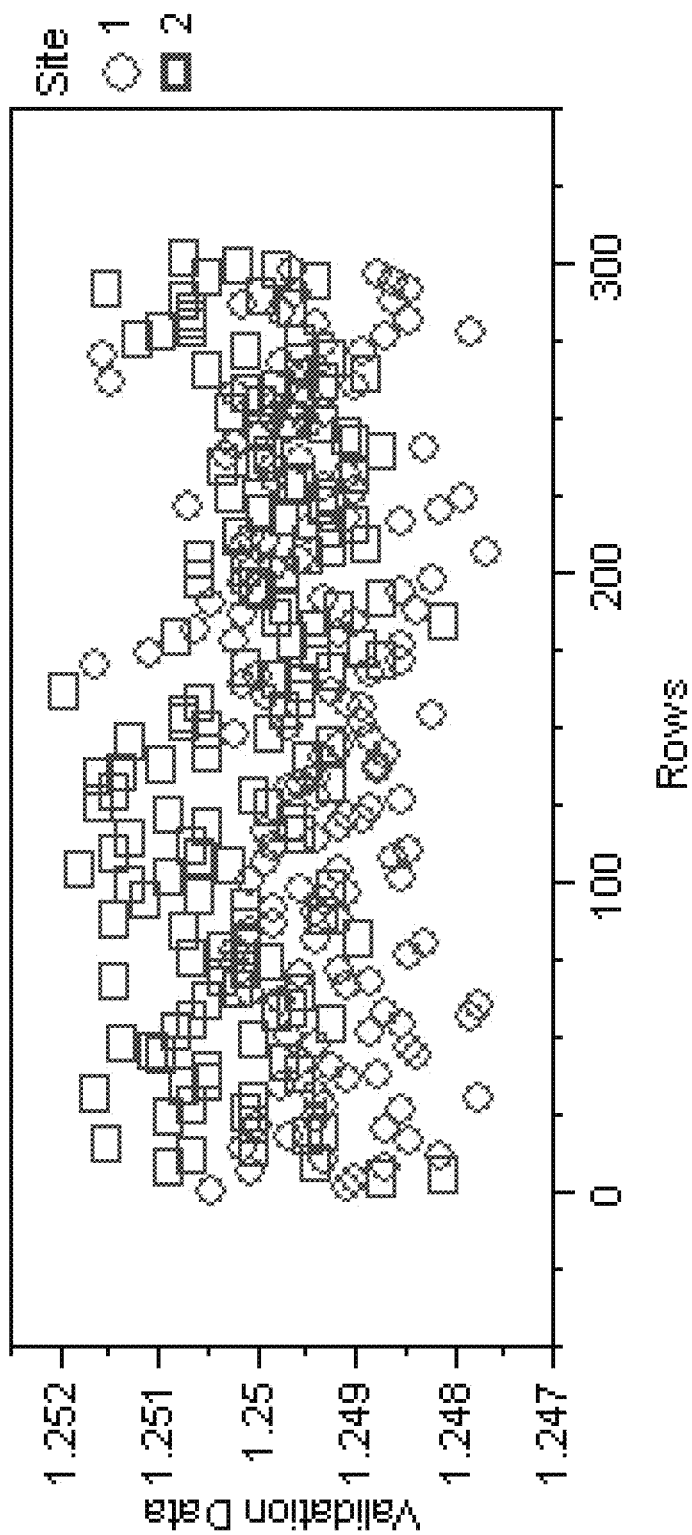
Figure 10D:
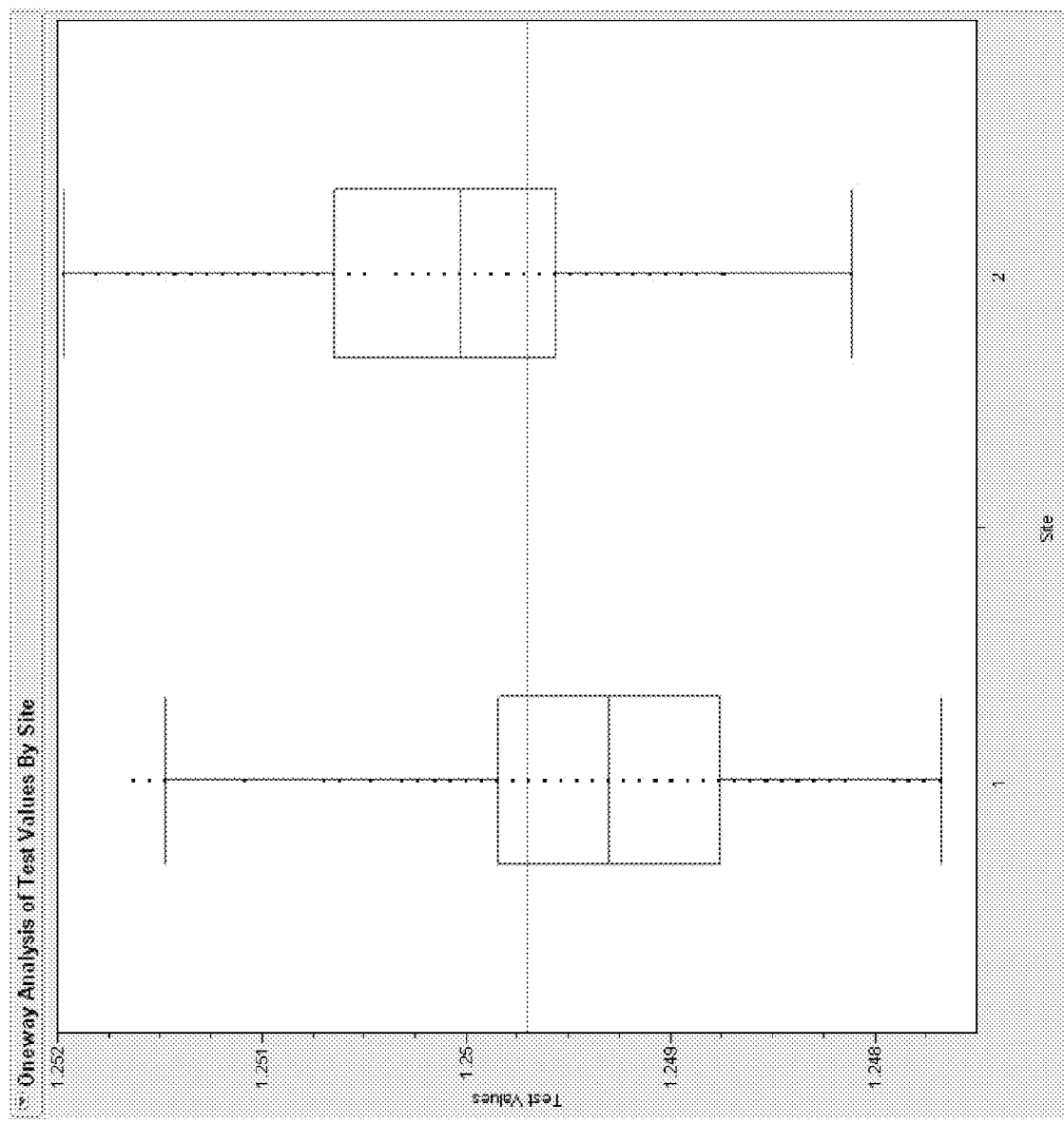

FIGS. 10A-10E compare computations toward test range estimation where only one site is used or multiple sites which do not statistically differ are used, to computations toward test range estimation where multiple, statistically different, sites are used. FIG. 10A shows lower test range computations, similar to those presented above with reference to FIG. 6, but per test-site. In FIG. 10A, 1010 denotes Vmax for Site 1, 1020 denotes Vmin for Site 1, 1030 denotes Vmin for Site 2 and 1040 denotes Vmax for Site 2. FIG. 10B shows upper test range computations, similar to those presented above with reference to FIG. 8, but per test-site. In FIG. 10B, 1050 denotes Vmin for Site 1, 1060 denotes Vmax for Site 1, 1070 denotes Vmax for Site 2 and 1080 denotes Vmin for Site 2. FIG. 10C is a graph of test measurements per test site. FIG. 10D is a box-plot of a t-test used to compare two sites. FIG. 10E is a table of t-test statistics indicating that the two test sites are statistically different in that t values are less than 0.005.

Parallel site considerations are now described with reference to FIG. 1. Regarding step 120, if testing is performed in parallel (more than one unit at the same time, in more than one respective test site) then the validation units are separated into multiple populations. In certain cases, testing of units is performed in parallel to the testing of additional units. For example, in dual-site testing, 2 units are tested at once. In Quad-site testing, 4 units are tested at once. Thus, throughput of testing is increased. If parallelism is 2 there are 2 populations (one for each site) and if parallelism is 4 there are 4 populations (one for each site).

Each population is statistically compared to the other populations in order to check if they are statistically different. This is done since, e.g. due to the nature of the testing hardware, there can be statistical differences between the test-sites in parallel testing. Statistical testing for such differences may be effected just after validation unit testing and before testing of non-validation units begins.

Usually, a T-Test is used when there are 2 test-sites and analysis of variance is used if there are more than 2 test-sites. FIGS. 10D and 10E present the results of a T-Test performed on 2 test sites. In this example, the T-test statistics indicate that the two test sites are statistically different (t values less than 0.005). If the test sites are statistically different, subsequent steps beginning with step 130 are performed separately for each site. If there is no statistical difference, subsequent steps may be performed once for all sites.

One suitable method for determining, during set-up, (a) a suitable safety coefficient for use in step 230 of FIG. 2; (b) a suitable proportion of the lot to allocate to control units, and (c) the size of the tail used in step 210 of FIG. 2, is now described with reference to FIGS. 11-13.

The user typically tunes the method of FIG. 1 using one or more of the following three parameters: the number of control units (in example illustrated by FIGS. 11-13, comprising validation units), the percentage of units used for range estimation (size of tail) and a Safety Coefficient. These three parameters can be presented as a 3-dimensional matrix with multiple possible combinations of the settings. There is a balance of all three parameters which the user may take into consideration, on a continuum between confidence and ROI (return on investment). If a user selects very high confidence, the resulting ROI will be very low. Considerations and methods for selection of these parameters may include the following:

Selection of the Percentage of units (tail). Known methods are based on estimation of distribution characteristics and therefore they are sensitive to the accuracy of the selection of the units in the tail. Because the method of FIGS. 1-2 does not make the prediction based on the tail distribution, the percentage number has less influence on the computation. The recommendation is to use 5%, which for high and low end tails totals 10% from all control units.

Selection of the number of control units. This parameter is typically selected in parallel to selection of the Safety coefficient because both parameters influence the confidence of the estimated range. One suitable number of control units is 200. Along with 5% of units for the tail this number provides a sufficient confidence and leaves out most units in an average lot as available for the TTR. In most cases a Safety coefficient equal to 1 may be used. For the normal distributions the user can assess the confidence based on the selected number of control units and the selected Safety Coefficient.

Safety Coefficient. The higher the number, the higher is the confidence in the result, but on the other hand, fewer lots will have test time reduced.

Figure 13:
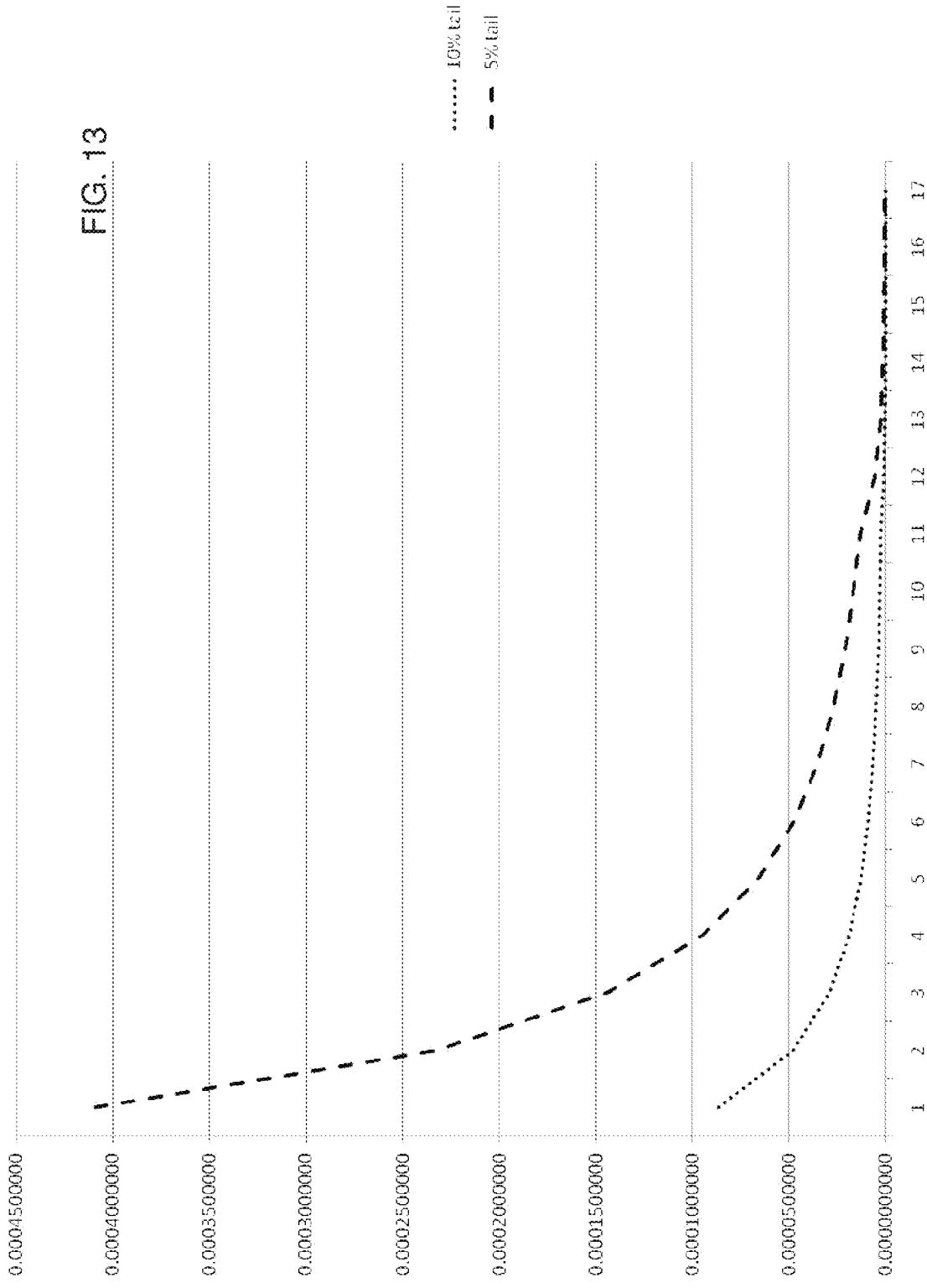

The table of FIG. 11 presents a "slice" of the possible values of the 3 parameters, with a fixed % of units in each tail (5%) and with various numbers of validation units and various safety coefficients. The values presented in the table cells represent the probability of non-validation units values to be out of estimated range. FIGS. 12 and 13 present, in table and graph form respectively, a partial slice where the safety coefficient is fixed at 1.3 and various numbers of validation units, for two separate tail sizes (5% and 10% of units per tail).

Five numerical examples of the operation of the method of FIGS. 1-3 are now described with reference to FIGS. 14-21C. The respective examples, also termed herein "scenarios", are characterized and compared in the table of FIG. 14.

Figure 15A:
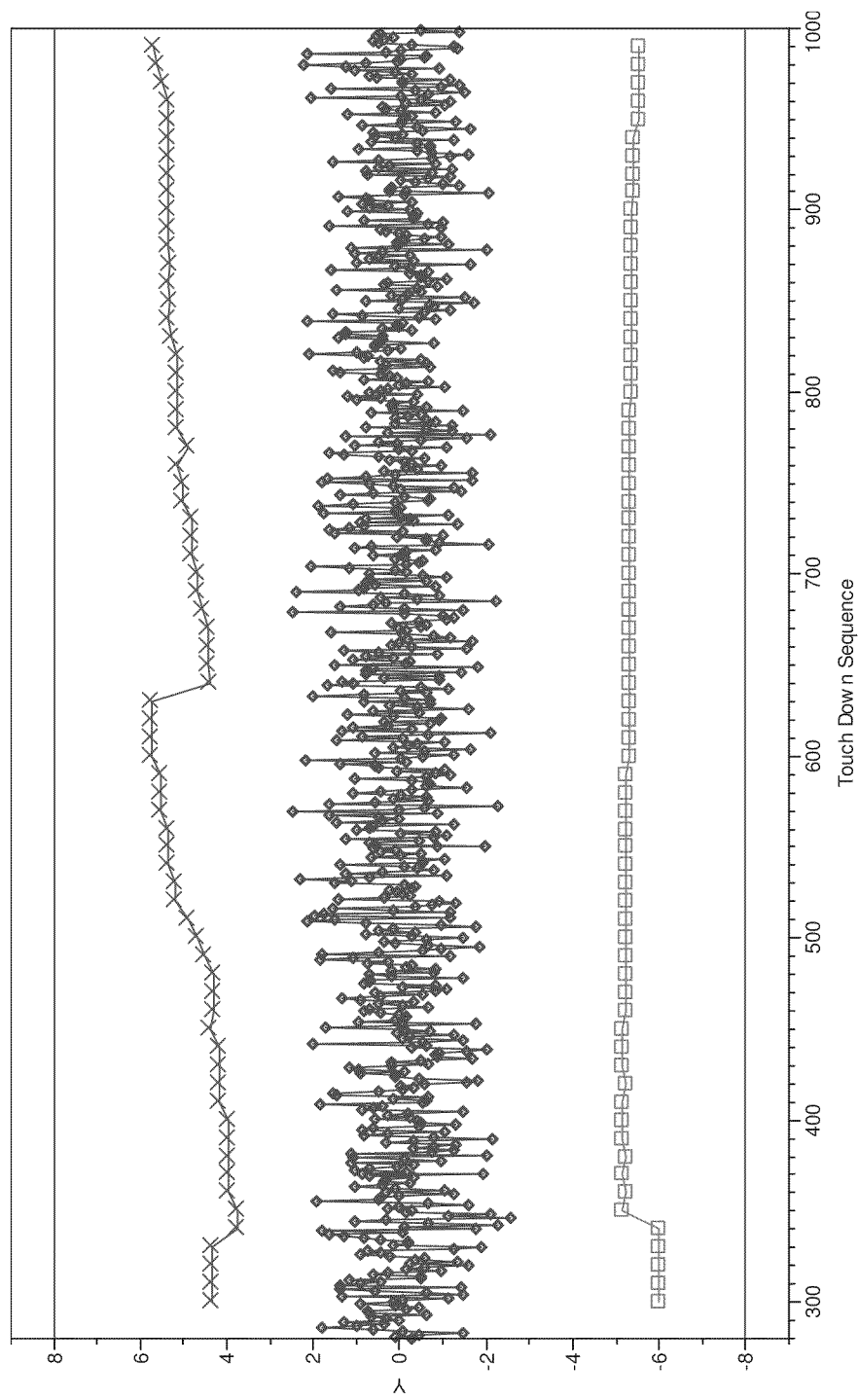
FIG. 15A is a graph of measurements of non-validation units, with the high/low specification limits and the estimated test range, in accordance with certain embodiments of the present invention.

Scenario 1: Analysis on validation units is positive (FIG. 1, Step 150). First, no failures of the test candidate are identified and in addition, the computed estimated test range is inside the specification limits. Test candidate is disabled (allowing TTR) and during the test of non-validation units (FIG. 1, Step 160), the results of the sampling units were "good" (FIG. 3) throughout the entire lot, meaning that no failures of the test candidate are identified and in addition, the recomputed estimated test range is inside the specification limits. Test candidate continues to be disabled for all non-validation units with no issues (thereby allowing TTR). FIG. 15A is a graph of measurements of non-validation units, with the high/low specification limits and the estimated test range.

Figure 15B:
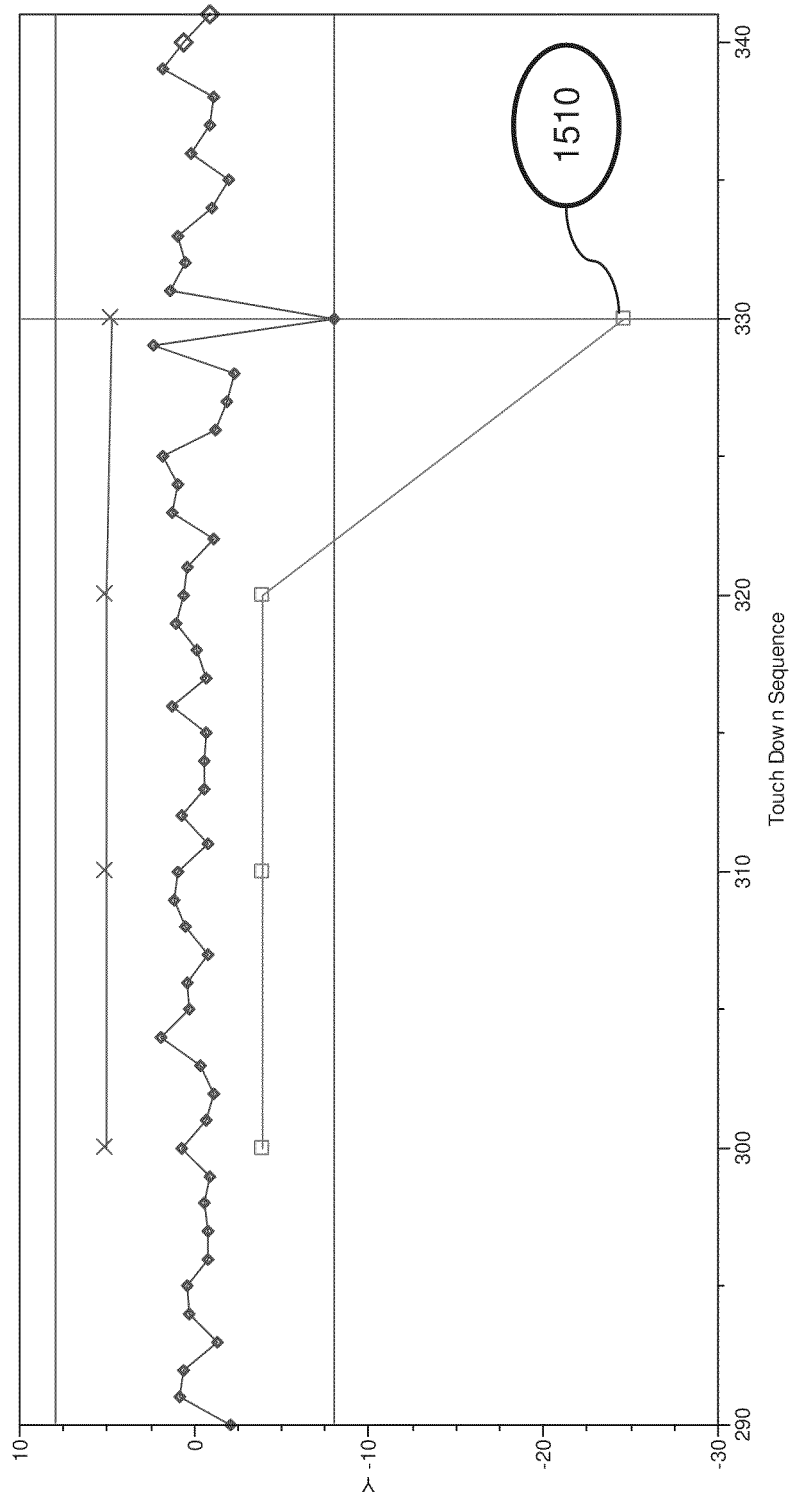
FIG. 15B is a graph of measurements of non-validation units, with the high/low specification limits and the estimated test range, in accordance with certain embodiments of the present invention.

Scenario 2: Analysis on validation units is positive (FIG. 1, Step 150). First, no failures of the test candidate are identified and in addition, the computed estimated test range is inside specification limits. Test candidate is disabled (allowing TTR) and during the test of non-validation units (FIG. 1, Step 160), the results of the sampling units are "not good". At a certain point, a failure of the test candidate is identified (FIG. 3, Step 300) and therefore the test is enabled from that point on (stopping TTR). FIG. 15B is a graph of measurements of non-validation units, with the high/low specification limits and the estimated test range. FIGS. 16A-16B, taken together, form a table with measurements of non-validation units. The measurement for unit 300 is marked as 1610 on FIGS. 16a and 1510 on FIG. 15B.

Figure 17:
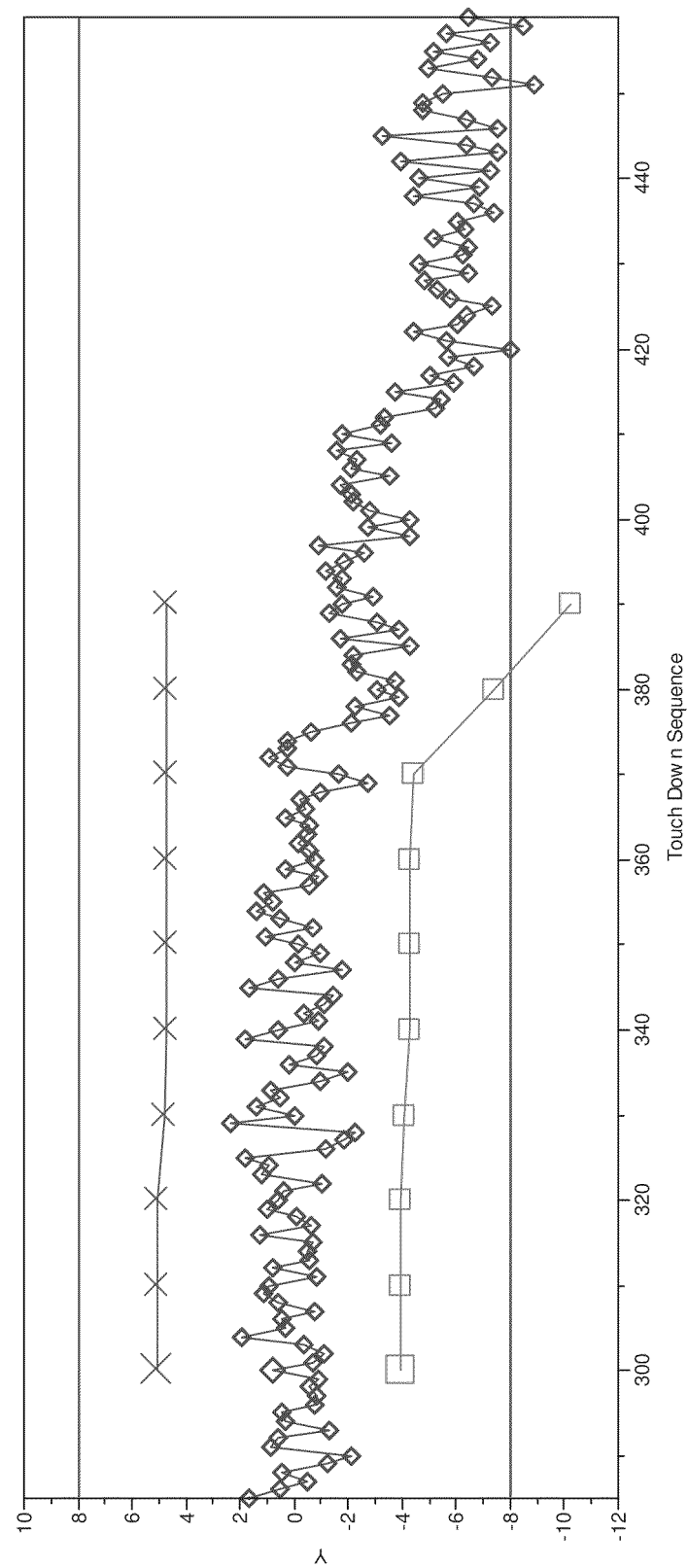
FIG. 17 is a graph of measurements of non-validation units, with the high/low specification limits and the estimated test range, all provided in accordance with certain embodiments of the present invention.

Scenario 3: Analysis on validation units is positive (FIG. 1, Step 150). First, no failures of the test candidate are identified and in addition, the computed estimated test range is inside specification limits. Test candidate is disabled (allowing TTR) and during the test of non-validation units (FIG. 1, Step 160), the results of the sampling units is "not good". At a certain point, the recomputed estimated test range is outside the specification limits and therefore (FIG. 3, Step 320) the test is enabled (TTR is stopped) from that point further. FIG. 17 is a graph of measurements of non-validation units, with the high/low specification limits and the estimated test range. FIGS. 18A-18D, taken together, form a table presenting measurements of non-validation units.

Scenario 4: Analysis on validation units is not positive (FIG. 1, Step D(2)). A failure of the test candidate has been identified and therefore the test candidate is enabled (no TTR) for the non-validation units. FIGS. 19A-19E, taken together, form a table with measurements of non-validation units. The measurement for unit 100 is marked as 1910 on FIG. 19B.

Figure 20:
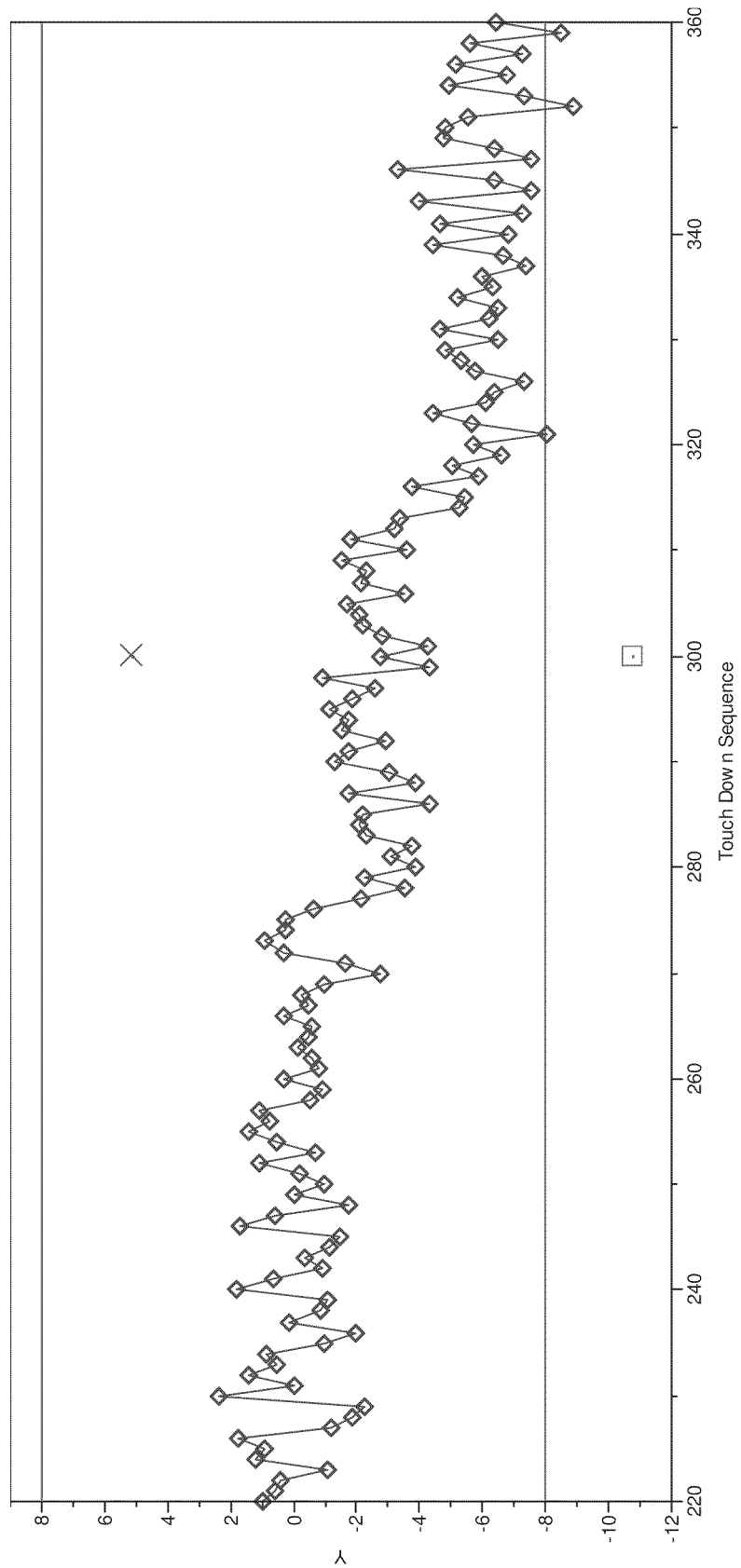
FIG. 20 is a graph of measurements of non-validation units, with the high/low specification limits and the estimated test range, all provided in accordance with certain embodiments of the present invention.

Scenario 5: Analysis on validation units is not positive (FIG. 1, Step 150). The computed estimated test range is outside the specification limits and therefore, the test candidate is enabled (no TTR) for the non-validation units. FIG. 20 is a graph of measurements of non-validation units, with the high/low specification limits and the estimated test range. FIGS. 21A-21C, taken together, form a table of measurements of non-validation units.

Normalization: Referring again to FIG. 2, optionally, test values of all tail control units or of all control units may be normalized in step 210, e.g. as follows:

$$X_{normalized\ for\ lower\ range}=(X-LSL)/(USL-LSL)$$

and $$X_{normalized\ for\ upper\ range}=(USL-X)/(USL-LSL),$$

where: X–Test value, LSL denotes Lower Specification Limit and USL denotes Upper Specification Limit. Normalization is effective if the extrapolation method is not linear e.g. is polynomial.

If normalization is performed in step 210 then in Step 240, the upper and lower test ranges that were computed need to be "un-normalized". In order to do so, the actual range limits may be computed as:

Lower Limit=$LSL+(HSL-LSL)$*Lower Test Range;

and

Upper Limit=$USL-(HSL-LSL)$*Upper Test Range.

FIG. 22 is a table showing examples of normalization computations.

Returning again to step 160 of FIG. 1, of which the method of FIG. 3 is an example, the evaluation of sampled unit data can be performed after each new sampled unit's test data has been acquired or can be performed periodically on population portions. In embodiments where the evaluation of sampled unit data is performed after each new sampled unit's test data has been acquired, the decision to enable or not enable a test which had been previously disabled is typically although not necessarily applied in real time to non-sampled units going forward (until such time, if any, when the test is again disabled). In embodiments where the analysis and evaluation is instead deferred until after data from a set of sampled units has been acquired from a portion of the subject population, the decisions resulting from the evaluation are alternatively or additionally associated with all members of the portion of the subject population from which the sampled units were drawn (sampled and non-sampled units). For example, at a wafer-sort test operation, a single wafer from a fabrication lot may be defined as a suitable portion for periodic analysis. In this example, the testing of a wafer would be completed with non-sampled units receiving the currently accepted test set and sampled units receiving additional testing to gather a sample of parametric test data related to excluded (i.e. disabled) tests. In this case, analysis and evaluation of the sampled unit data would be performed after the completion of this initial test sequence on the wafer. The sampled unit data analysis and evaluation, including the calculation of the estimated maximum test range (for example as shown in FIG. 2), would attempt to determine whether or not the accepted test set that had been applied had provided sufficient test coverage to the non-sampled units contained in the wafer. If so, no additional action would be taken on the wafer. If not, the non-sampled units would require a retroactive test augmentation action (e.g. retroactive enabling of the test).

It is noted that by deferring the estimated test range evaluation using the periodic approach, risk is added that the material being tested during the interval between successive evaluations is, in fact, missing one or more required tests, and that it may later require retroactive test augmentation (e.g. retroactive enabling of one or more tests). In some embodiments units "at risk" for requiring test augmentation would be those tested between the last decision point disabling a test in order to have TTR and a subsequent decision point at which TTR is rejected. In some embodiments, records and/or a ULT (Unit Level Traceability) imprint of units may be used to determine the "at risk" units. For example, during final test after packaged units may have become mixed together, it may be difficult to trace the test history of an individual unit in order to determine if a required test was not previously applied and would therefore need to be retroactively enabled for that unit. In this example, a ULT imprint may be electronically read to retrieve unit identity which was previously stored at wafer sort and/or test flow history (stored at each test step) to determine if the test needs to be retroactively enabled.

However, if the added risk is low, the flexibility afforded in scheduling the analysis and evaluation of the data from sets of sampled units at intervals (rather than in real-time, on a sample-by-sample basis) may in some cases offer simpler or more efficient alternatives for system implementation of the method. For example, if it found that under a periodic analysis and evaluation methodology that typically 99% of wafers tested with a TTR test set are, in fact, being adequately tested, and that only 1% of wafers require a retroactive test augmentation action (e.g. retroactive enabling of the test), then the logistical benefits of delaying analysis and evaluation to the end of each wafer's test process may in some cases trump the disadvantage of occasionally required test augmentation.

In some embodiments, since the method of periodic estimated test range determination requires performing analysis and evaluation after the initial testing of a portion of a subject population has already been completed, a failing outcome in the evaluation (that is, the decision to enable a test that had been disabled in the previously accepted and applied test set) requires that the incorrectly excluded (i.e. disabled) test(s) be performed on the non-sampled units of the material in question in a retroactive "test augmentation" action (i.e. retroactive re-enabling of the test), and may optionally also require enabling the excluded test(s) in the (the accepted) TTR test set to be applied to subsequent material to be tested. For example, in a hypothetical test set consisting of a maximum of three tests, t1, t2, and t3, a previous TTR decision may have been made to disable (e.g. "turn off") t2, resulting in execution of an accepted test set of only two tests (t1 and t3) on non-sampled units (all three tests will continue to be executed on sampled units). After testing several wafers successfully to this accepted TTR test set we may encounter a wafer from which sampled t2 parametric data are inconsistent with the previous t2 parametric data-set, and the inclusion of the sampled t2 parametric data in the calculated t2 estimated maximum test range causes the t2 ETR value to not be inside the range defined by upper and lower specification limits. A decision is made at that point to (retroactively) enable t2 for the current wafer. The tester returns to all inadequately tested (non-sampled) units on the current wafer to augment their testing by executing test t2, and optionally, the accepted test set may be redefined to include all three tests, t1, t2, and t3. If the accepted test set is also redefined, the enabled tests t1, t2, and t3 will also be applied to one or more subsequent wafers, for example until a point arrives at which another TTR decision may be made.

Note that in the example provided, involving a wafer-sort operation, the required t2 test augmentation (i.e. retroactive enabling) may be performed at any point after the need for augmentation has been identified, and as such, may be applied to the inadequately tested units in various embodiments at different points during subsequent wafer-sort test processing. For example, assuming that the portion size is a wafer, the test augmentation may be performed when the wafer including the inadequately tested units has only partially completed initial testing, when the wafer including the inadequately tested units has completed initial testing before proceeding to test the next wafer, when one or more wafers of an individual lot including the wafer with the inadequately tested units have completed initial testing, when the lot including the wafer with the inadequately tested units has completed initial testing before proceeding to test the next lot, when the wafers of multiple lots including the wafer with the inadequately tested units have completed initial wafer-sort testing, etc. Similarly, in embodiments applying the methodology to final test operations, test augmentation may be applied to the inadequately tested units at various points during final test processing. For example assuming a portion size equal to a final test lot, test augmentation may be applied when the final test lot including the inadequately tested units has partially completed initial testing, when the lot including the inadequately tested units has entirely completed initial testing before proceeding to test the next lot, when multiple lots including the lot with the adequately tested units have completed initial testing, etc.

In some embodiments, the test augmentation process will require different specific tests to be retroactively applied to various portions of the subject population, since the decision to enable excluded tests may vary between these population portions, and thus the test augmentation process will apply the excluded tests according to the requirement of each population portion. Similarly, in some embodiments the decision to enable excluded test(s) in the TTR test set for subsequent material to be tested may vary between population portions.

An example will now be provided to describe an embodiment in which the estimated maximum test range method is applied periodically to a wafer-level population portion of a fabrication lot. In this example, it is assumed that steps 90 to 150 of FIG. 1 as described above have already been performed. Therefore, the validation units of the lot under test have been tested to a full test set, from which parametric test data and failure occurrence were monitored. The parametric test data were analyzed using the estimated test range method for example of FIG. 2, and the resulting estimated test range was compared to specification limits. A decision was then made (in step 150) for each parametric test under evaluation as to whether or not to include the test in subsequent non-control unit testing (in this example, non-control units are units that are not validation units and are not sampled units). Depending on the embodiment, the TTR decision may have depended at least partly on the comparison of the estimated maximum test range to specification limits, and alternatively or additionally at least partly on the incidence of test failure (e.g. number or fraction of failing units). As previously described, the evaluation may in some cases be performed per test-site in test environments employing multiple test sites for parallel testing purposes.

Figure 23:
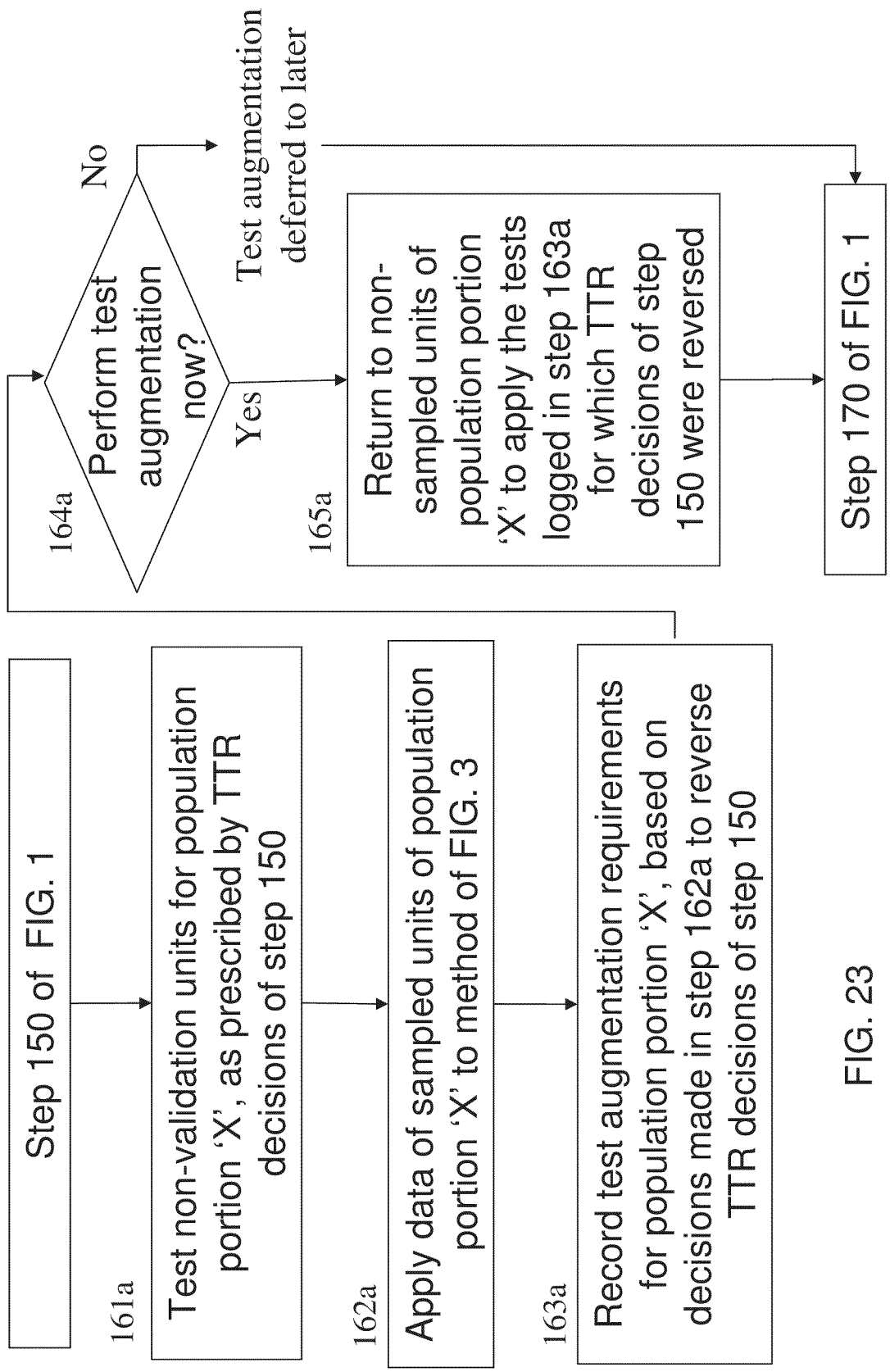
FIG. 23 is a simplified flowchart illustration of a method for reducing test time where sampled unit data are evaluated periodically, the method being operative in accordance with certain embodiments of the present invention.

FIG. 23 is a simplified flowchart illustration of a method of this example where sampled unit data are evaluated periodically. The method of FIG. 23 may be exactly as illustrated and/or may comprise the following operations: As testing proceeds in step 161*a* of FIG. 23 on the non-validation units of population portion 'X', which in the present example is assumed to be a single wafer from the fabrication lot under test, non-sampled units are tested to the accepted TTR test set which was determined in steps 90 through 150 of FIG. 1, while sampled units located within the wafer are tested to a full test set. In step 162*a*, at the conclusion of testing all units contained within the wafer (population portion 'X'), the method of FIG. 3 is applied to the data from all the sampled units within the population portion. The number or fraction of failures accumulated from sampled units (or alternatively from sampled units and validation units) are compared to a predetermined threshold integer or fraction for each excluded test from the TTR test set (where the threshold may or may not be the same of each test). The measurements of parametric test data for all sampled units in the wafer are added to the validation unit measurements for each excluded test for recalculation of the estimated maximum test range (for example as per FIG. 2, and its previous description). If it is found, based on the analysis and evaluation of the data from the wafer (population portion 'X'), that some of the tests had been incorrectly disabled and therefore not applied to the non-sampled units in the wafer, then in step 163*a* the test augmentation requirements for the non-sampled dies from that wafer are recorded. These are the tests that were excluded (i.e. disabled) in error from the accepted TTR test set of the wafer, and that need to be applied retroactively to (e.g. enabled retroactively for) the non-sampled units of the wafer to ensure that these units have been adequately tested.

In step 165*a* the test augmentation is applied to the non-sampled units, based on the requirements that were recorded in step 163*a*, in which, minimally, the recorded tests of step 163*a* are applied to (e.g. retroactively enabled for) the non-sampled units. Note that step 165*a* need not immediately follow step 163*a*, but may occur at any convenient point in the test process following step 163*a*, based on the decision point of step 164*a*. For the present example, in which population portion 'X' is associated with individual wafers, test augmentation step 165*a* may be applied to the non-sampled units of the current wafer, for instance immediately before the initial testing of the subsequent wafer begins, or to highlight another possibility, may be applied, for instance after all wafers of the fabrication lot have completed initial testing, or for instance at any other time. If it is desirable to also enable the recorded tests for subsequent material (for example population portion X+1), the enabling of the tests for subsequent material may occur regardless of the timing of the test augmentation.

It is appreciated that the particular method shown and described in FIG. 23 is merely one of many possible embodiments and is not intended to be limiting. In the illustrated embodiment of FIG. 23, the periodic analysis and evaluation (step 162*a*) occurs after conclusion of testing of all units in the population portion. The methodology described however is not dependent on when the periodic analysis and evaluation occurs. It is noted that the activity of periodically analyzing and evaluating the data acquired from a set of sampled units in step 162*a* may be performed at various times in various embodiments, for example while testing is progressing on non-sampled units in the portion, while testing is in progress on another portion of the subject population, while the testing operation has been suspended (for example, while changing and aligning wafers on the prober to prepare the next set of units for test), after all initial testing of the subject population has been completed, etc. Typically although not necessarily, the ability to perform a periodic analysis and evaluation activity (on a portion) requires only that the data from the set of sampled units (in the portion) be available for estimated maximum test range calculations, and is otherwise not dependent on other specific aspects of the testing process.

In the illustrated example of FIG. 23, the definition of the portion is assumed to occur prior to testing the portion. The methodology described however is not dependent on when the definition of the portion occurs. For example, in some embodiments the definition of the portion may occur during the periodic analysis and evaluation step 162*a*. Continuing with the example, if it were recognized during the analysis that there are two groups of units with different parametric test data distributions, then each of these two groups of units can be defined as portions and analyzed separately.

In the illustrated example of FIG. 23, the population portion is a wafer. The methodology described however is not dependent upon how population portions are defined. In some embodiments a subject population may be apportioned at wafer-sort, for example according to individual wafers, groups of wafers, groups of units contained within wafers, etc. such that analysis and evaluation occur on portions of a fabrication lot. Similarly, at a final test operation, in these embodiments a user may define a portion for example as the set of units contained within a group of trays or tubes loaded at the input to a unit handler, which may be a subset of all of the units of a final test lot staged for test processing. In such embodiments, the apportioning is defined based on the natural segmentation of the subject population. Examples include inter-alia part of a wafer, one wafer, part of a plurality of wafers, a plurality of wafers, part of a lot, one lot, part of a plurality of lots, a plurality of lots, etc. In some embodiments, where such natural segmentation does not exist, is irrelevant, or is not applied for any reason, one may apportion the subject population into a fixed number of units to a portion (for example, every 100 samples tested), or according to a fixed time interval between successive analysis and evaluation tasks (for example, every 8 hours). In some embodiments, the entire subject population may be tested (for example, the entire final test lot) prior to performing any analysis and evaluation of sampled unit data. However as mentioned above it is not required that the entire subject population be tested prior to performing analysis and evaluation, and it only required that the data from sampled units in a portion be available for estimated maximum test range calculations for that portion.

In some embodiments, the definition of population portions for periodic analysis and evaluation is based on variable criteria or unpredictable events, leading to variable or dynamic apportioning intervals, in contrast to the fixed interval examples provided above. Some such embodiments may include those in which the definition of the population portion depends on the test data from validation units and sampled units that has been previously evaluated. In some cases, historical data may suggest a natural grouping of units within population portions, for example, if it is recognized that even-numbered wafers and odd-numbered wafers from within a fabrication lot tend to exhibit a statistically significant offset in the parametric test data between the two, then each may be analyzed as a separate population portion. As another example of a natural grouping, in some cases it may be recognized that units located near the centers of wafers and units located near the edges of wafers typically exhibited a statistically significant offset in their respective parametric test data distributions, then each of these two portions could be analyzed as a separate population portion. The naturally occurring data encountered may suggest differing approaches to apportioning/grouping sampled unit data for successive lots, or even successive wafers. Additionally or alternatively, it may in some cases be advantageous to combine the data according to naturally grouped population portions with common features, to determine estimated maximum test range values by population portion. In these cases, the resulting decisions and actions from the estimated test range analysis may sometimes be more discriminating, reflecting the specific characteristics of each of these wafer sub-populations. As another example, if it is found that a trend is developing in the estimated test range values calculated from successive population portions evaluated (for example, trending upward or downward towards upper/lower test specification fail limits), then the interval between successive evaluations (and the number of units contained within each defined portion) may be reduced as testing the subject population proceeds, reducing the number of units at risk of retroactive test augmentation should any population portion require it. In some embodiments, variable apportioning intervals may be applied on the basis of factors related to the testing process. For example, if the frequency of analysis and evaluation activity is dictated by the availability of the computer resource supporting the activity, and that computer resource availability is variable, then the apportioning interval (size of portions sampled and/or frequency of analysis and evaluation activity) may also be made to be variable. For another example, if the system employed to perform periodic analysis and evaluation acquires parametric test data through external datalogging of these data (that is, through the transfer of sampled unit data to an external computer system for evaluation), then datalog data transfer may become a factor gating when the evaluation may be performed, which may in turn may result in a variable apportioning interval.

In the illustrated embodiment of FIG. 23, initial testing of defined population portions proceeds sequentially, that is, portion by portion (e.g. wafer-by-wafer). The methodology described, however, is not dependent upon the sequence in which initial testing is applied to the population portions. For example, if two population portions are defined, one as the set of all even-numbered wafers and the other as the set of all odd-numbered wafers, and the wafers within a fabrication lot are encountered at the wafer-sort operation in arbitrary numerical order, then the sequence of initial testing of the constituent wafers of the two population portions, described in FIG. 23, step 161*a*, may occur in a numerically arbitrary order. Continuing with this example, at the completion of initial testing of all (even and odd) wafers, steps 162*a* and 163*a* may be individually performed on the collective data set from each population portion (all even-numbered wafers, all odd-numbered wafers), followed by test augmentation step 165*a* (returning to augment the testing of individual wafers, as needed) which may be performed in a numerically arbitrary order. As another example, constituent units within each wafer may be apportioned into population portions defined either as "edge units" (units located near the edge of the wafer) or "center units" (units located away from the edge of the wafer). In this case, the units within each wafer may be tested in a sequence that is not dependent on whether they are "edge units" or "center units", with the two population portions tested essentially concurrently. At the completion of testing each wafer, for example, steps 162*a* and 163*a* may be individually performed on the collective data set from each population portion (all "edge units" of the wafer, all "center units" of the wafer), and test augmentation step 165*a* may be performed, as needed, on each population portion of the current wafer before continuing on to perform initial testing of the next wafer of the fabrication lot staged for test processing.

As mentioned above, the sample rate used to gather parametric data from sampled units for ETR calculation may be constant or may vary. In some embodiments a constant sample rate is used, in which the ratio of sampled units to the total number of units tested from within the subject population is a fixed number. In certain embodiments of the invention, however, the sample rate may be allowed to vary while the methods disclosed above are applied.

In certain embodiments, the sample rate may vary with the relationship of the estimated maximum test range to the test specification limits. In such embodiments, the sample rate is typically increased as the estimated maximum test range approaches the test specification limits, and is typically decreased as the estimated maximum test range moves away from the test specification limits. Alternatively, or in addition, the sample rate may vary with the incidence of test failure (e.g. number or fraction of failing units). Alternatively or in addition, the sample rate may vary based on any other parameter. Note that the sample rate for the various tests being monitored through the testing of sample units may vary from test-to-test, and will not necessarily be the same rate for different tests. For simplicity of description, the illustrated embodiments assume that when a test is disabled in order to allow test time reduction, sampling occurs and the test is not applied to non-sampled units.

Figure 24:
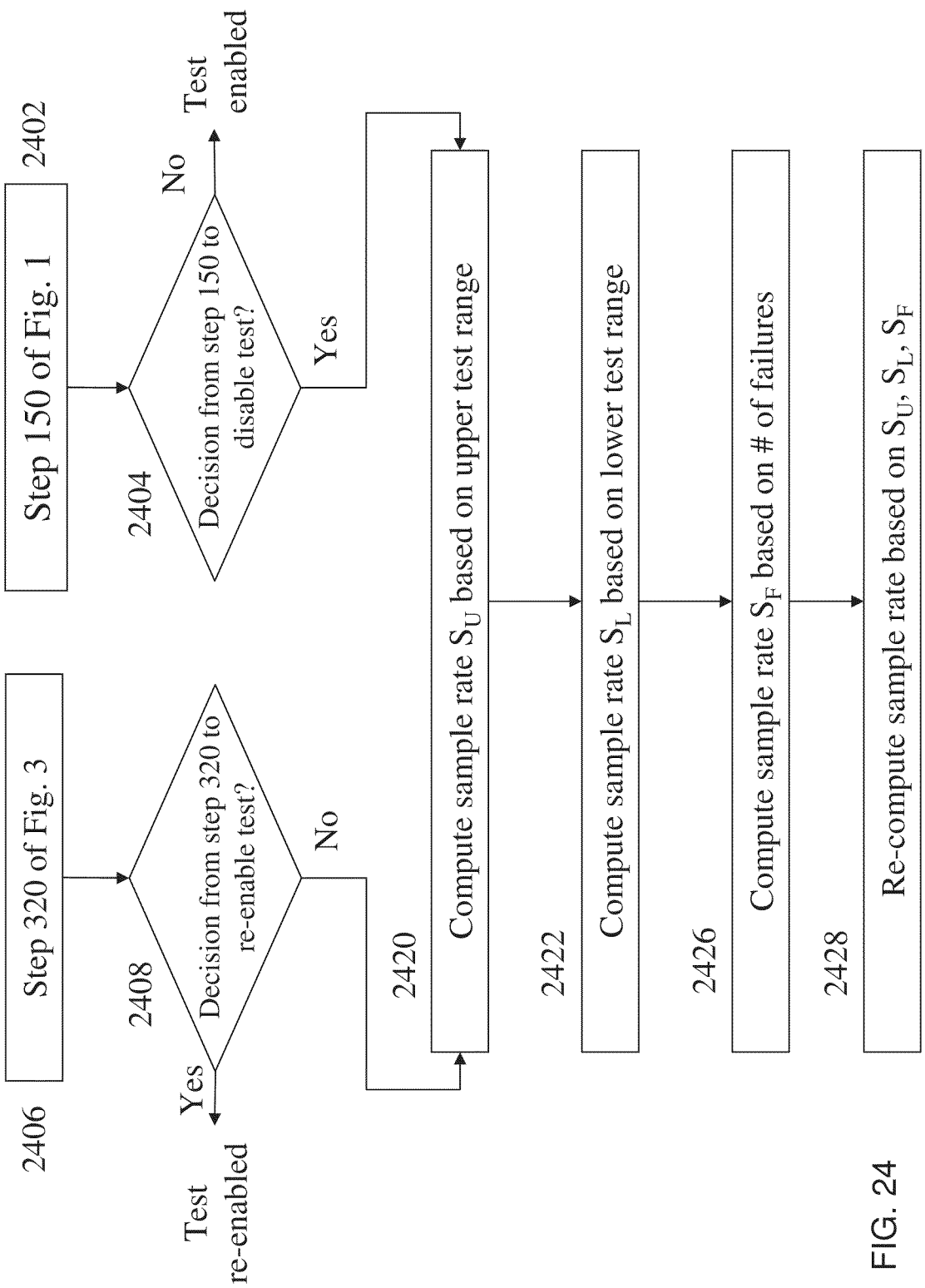
FIG. 24 is a simplified flowchart illustration of a method for determining an appropriate sample rate for a particular test, the method being operative in accordance with certain embodiments of the present invention.

FIG. 24 is a simplified flowchart illustration of a method of determining an appropriate sample rate for a particular test. The method of FIG. 24 may be exactly as illustrated and/or may comprise the following operations:

FIG. 24 illustrates two possible events which may possibly cause a sample rate to be computed. Step 2402/2404 represents an event which causes the computation of an initial sample rate. In the example of steps 2402/2404, each time step 150 of FIG. 1 occurs and there is a decision to disable a test in order to have test time reduction, an initial sample rate for the non-validation units is computed. An initial sample rate may be determined in the manner described in steps 2420 through 2428 using upper/lower ETR values and/or failure incidence based on parametric data derived from validation units from the current subject population prior to beginning unit sampling. In another embodiment, the initial sample rate may be computed, unrelated to step 150 of FIG. 1. For example, an initial sample rate for a given population of units may be determined in the manner described in steps 2420 through 2428 using upper/lower ETR values and/or failure incidence based on parametric data derived from a historical baseline of units representing the product under test. Steps 2406/2408 represent an example of an event which may cause subsequent re-computations of the sample rate. In the example of steps 2406/2408, each time step 320 of FIG. 3 occurs and there is a decision to continue test time reduction (by having the test remain disabled), the sample rate is re-computed. However in other embodiments, re-computation of the sample rate may be made additionally or alternatively at any point following recalculation of upper/lower ETR values and/or failure incidence, as testing progresses. For example, re-computation of the sample rate may occur each time step 160 of FIG. 1 occurs and there is a decision to continue test time reduction by having the test remain disabled, even if step 160 comprises a different procedure than that illustrated in FIG. 3. Additionally or alternatively, re-computation of the sample rate may occur each time step 170 is performed and there is a decision to reinstate test time reduction by disabling the test. Additionally or alternatively, re-computation of the sample rate may be made in conjunction with any calculation and evaluation of estimated maximum test range that supports a decision to begin or continue test sampling for a disabled test, thereby allowing TTR. The impetus for performing the procedure of computing the sample rate, for example as illustrated in steps 2420 through 2428 is not limited by the invention.

In steps 2420 and 2422, candidate sample rates $S_U$ and $S_L$ are calculated, respectively based on the most recently computed upper and lower estimated test range values (for example, if the entry event was step 320 then the values would have been computed in step 310; if the entry event was step 150 then the values would have been computed in step 130; if the entry event was step 170 then the values would have been computed in step 170; etc). In step 2424, candidate sample rate $S_F$ is computed, based on the most recently computed number or fraction of failures (for example if the entry event was step 320 then the number/fraction of failures would have been calculated in step 300; if the entry event was step 150 then the number/fraction would have been computed in step 150; if the entry event was step 170 then the number/fraction would have been computed in step 170; etc). In some embodiments, the three calculated candidate sample rates are limited in range from a minimum value $f_0$ to a maximum value of 100%, where $f_0$ may, for example, equal 10%, signifying that no fewer than 1 out of 10 units within a population portion will be sampled. In one of these embodiments, it is assumed that $S_U$ will be assigned the minimum sample rate value corresponding to $f_0$ when the calculated upper estimated test range "UTR" is below the upper specification limit "USL" by an amount greater-than-or-equal-to half the distance between the upper specification limit and lower specification limit "LSL", that is, when the UTR value is closer to the LSL than to the USL. Similarly, in this embodiment it is assumed that $S_L$ will be assigned the minimum sample rate value corresponding to $f_0$ when the calculated lower estimated test range is above the lower specification limit by an amount greater-than-or-equal-to half the distance between upper and lower specification limits, that is, when the LTR value is closer to the USL than to the LSL.

Figure 25:
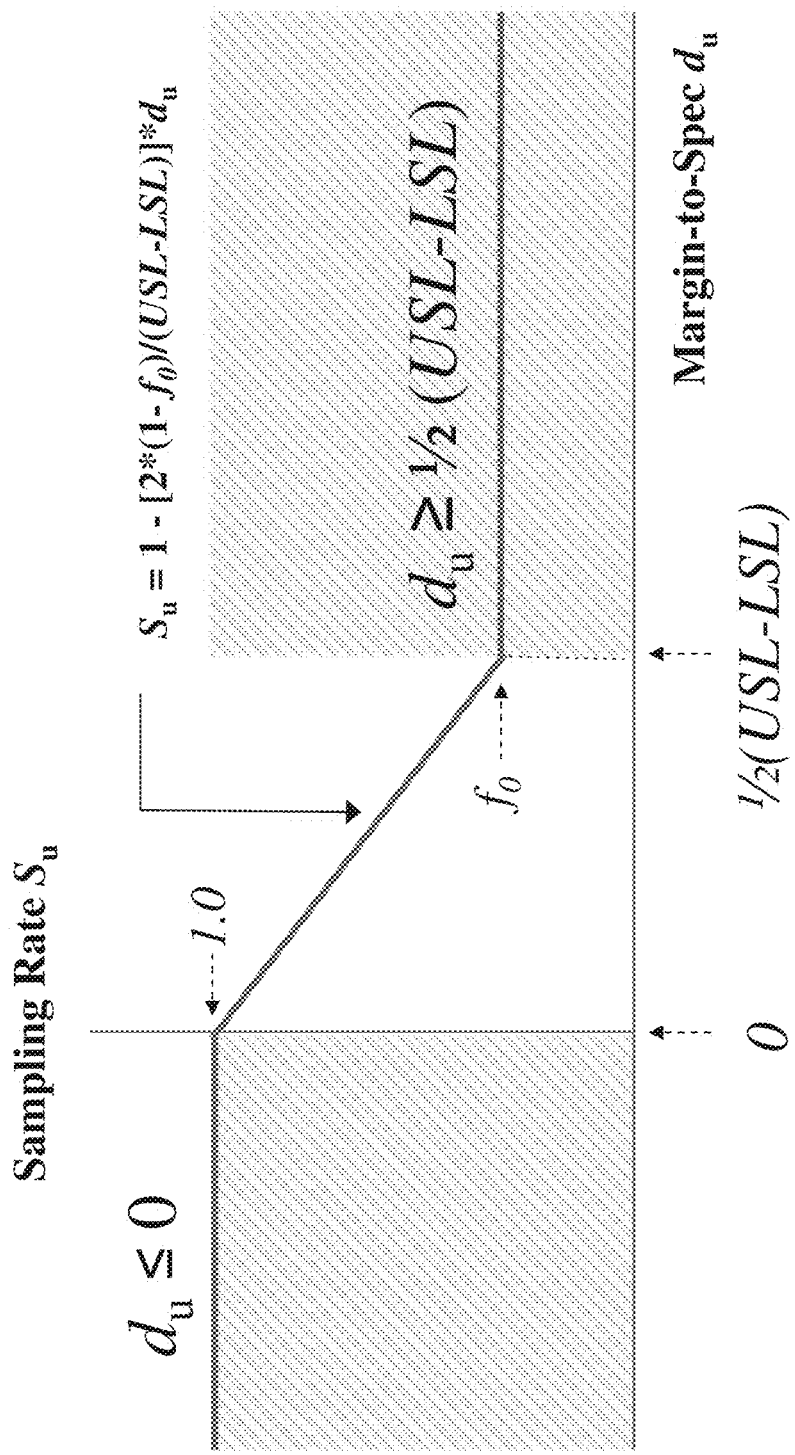
FIG. 25 is a graph illustrating an example of sampling rate determination, in accordance with certain embodiments of the present invention.

If, for example, it is given that $d_U$ represents the margin-to-upper-spec, defined as the difference between the upper specification limit value and the upper test range value ($d_U$=USL−UTR), $S_U$ will be assigned the minimum sample rate value $f_0$ if it found that $d_U$>=½(USL−LSL), that is, when the UTR value is closer to the LSL than it is to the USL. Similarly, given that $d_L$ represents the margin-to-lower-specification, defined as the difference between the lower test range value and the lower spec limit value ($d_L$=LTR−LSL), $S_L$ will be assigned the minimum sample rate value $f_0$ if it found that $d_L$>=½(USL−LSL), that is, when the LTR value is closer to the USL than it is to the LSL. In this embodiment, additionally or alternatively, it is assumed that the minimum sample rate value will be assigned to candidate sample rate $S_F$, based on the number of failures, if the number of failures to the test of interest is zero. Additionally or alternatively, in this embodiment it is assumed that the maximum sample rate value of 100% will be assigned at the same thresholds for which TTR for the test of interest is eliminated (and the test enabled), since 100% sampling is equivalent to elimination of TTR. Therefore, $S_U$ will be assigned a value of 100% if $d_U$<=0, $S_L$ will be assigned a value of 100% if $d_L$<=0, and $S_F$ will be assigned a value of 100% if the number or fraction of failures to the test of interest is >=T, where T is a predetermined threshold integer or fraction. Sample rate values may be determined by linear extrapolation between the minimum and maximum sample rate conditions, as shown in FIG. 25 for the example of sampling rate $S_U$ determination. Extrapolated $S_U$, $S_L$, and $S_F$ values are calculated using the linear equations below with independent variables $d_U$, $d_L$, and # of test failures, respectively:

$$S_U = 1 - [2*(1-f_0)/(USL-LSL)]*d_U, \text{ where } d_U = USL-UTR \text{ and } 0 < d_U < \tfrac{1}{2}(USL-LSL)$$

$$S_L = 1 - [2*(1-f_0)/(USL-LSL)]*d_L, \text{ where } d_L = LTR-LSL \text{ and } 0 < d_L < \tfrac{1}{2}(USL-LSL)$$

$$S_F = f_0 + [(1-f_0)/T]*(\# \text{ of failures}), \text{ where } \# \text{ of failures} < T$$

The three calculations are performed for a given test in steps 2420, 2422, and 2426. Since, in general, the resulting three candidate sample rate values will not be equal, final determination of the revised sample rate to be applied is performed in step 2428, as a logical or mathematical function of the $S_U$, $S_L$, and $S_F$ values. In various embodiments, the logical or mathematical function may depend on various application-specific factors and is not limited by the invention. For example in one embodiment the function may conservatively involve assigning a sample rate equal to the maximum of the three candidate sample rate values. Continuing with the example, if the computed values for $S_U$, $S_L$, and $S_F$ are 0.15, 0.10, and 0.10, respectively, then the revised sample rate to be applied will be 15%.

It is appreciated that the particular method described above for FIG. 24 merely reflects certain embodiments and is not intended to be limiting.

For example, although in one embodiment described above here the minimum sample rate value $f_0$ being applied to all three sampling schemes is the same, in other embodiments, this need not be the case. One may apply different minimum sampling values, $f_{0U}$, $f_{0L}$ and $f_{0F}$, for determination of $S_U$, $S_L$ and $S_F$, respectively. For example, if there is greater product quality or reliability risk associated with disabling a test on material that is parametrically trending close to the upper specification limit than on material trending close to the lower specification limit, then a value of 0.2 may be assigned to $f_{0U}$, and a value of 0.1 may be assigned to $f_{0L}$. Thus, a low margin-to-upper-specification based on a calculated UTR value will result in a higher sampling rate than a calculated LTR value with the same value for margin-to-lower-spec.

For another example, additionally or alternatively, the maximum values of the candidate sample rates need not necessarily correspond to the particular values of $d_U$, $d_L$, and # of test failures, as suggested in the example provided, but may correspond instead to other more conservative or less conservative values of these or similar input variables.

For another example, additionally or alternatively, the maximum allowed sample rate may be less than 100%, or may only be allowed to be 100% for a limited number of units, in order to ensure that a decision to disable a test or continue to have a test disabled leads to test time reduction.

For another example, additionally or alternatively, the extrapolation between the minimum and maximum sample rates need not be linear, as suggested in the example provided, but could be based on a different monotonically dependent function of the input variables $d_U$, $d_L$, and # of test failures, or similar input variables.

For another example, additionally or alternatively, the four steps 2420, 2422, 2426, and 2428 could be combined into one, providing the sample rate as the output of a single mathematical and/or logical function, or be provided as the output of a single operation, such as retrieval of the sample rate from a look-up table based on input variables derived from data of the population portion being evaluated.

For another example, additionally or alternatively, additional data that is not derived from the population portion being evaluated may be included or considered in the determination of sample rate, such as data quantifying the available tester capacity for performing the recommended level of sampled unit testing.

In the estimated maximum test range applications described in the embodiments provided above, the computed ETR values are compared to specification limits in order to decide whether or not to enable/disable a particular test or set of tests for units of a subject population undergoing test processing. Additionally or alternatively, in certain embodiments the ETR values may be applied as the basis for one or more manufacturing flow decisions. In such embodiments, the parametric data derived from the testing of control units (e.g. validation units and/or sampled units) are used to compute the ETR values, as previously described, based either on a continuous (sample-by-sample) or periodic analysis approach. The ETR values are predictive of the parametric distribution of all of the units within the subject population (control and non-control), given that the subject population is statistically similar to the population of control units from which the ETR values were derived. For example, in the case of a manufacturing flow decision including a material acceptance/rejection decision, if the data and ETR values derived from control units are compliant with the parametric requirements of the product being manufactured, the tested material is accepted and is allowed to continue processing. If not, the unacceptable material is rejected, and is removed from the manufacturing process flow.

In some embodiments that use estimated maximum test range values as the basis for parametric criteria for one or more manufacturing flow decisions such as a decision whether to accept or reject a subject population of material the same criteria described previously in embodiments using ETR values to accept or reject TTR may be applied in the present embodiments for the manufacturing flow decisions such as to accept or reject the material itself. The methods described above for acquiring the parametric data from validation and sampled units, for separating data and ETR analysis by test-site when statistical test-site offsets exist (in a parallel test environment), for varying sample rate (in embodiments where the sample rate is not constant), for computing the ETR values, for normalizing data and limits, etc. are similar in these embodiments to those in the embodiments previously disclosed. For example, in some embodiments a decision to reject at least some of the material of the subject population from which the control units were taken may be made if a calculated estimated maximum test range value is outside of one or more test's high or low specification limits. Continuing with the example, in some embodiments a decision to reject material is based on a logical combination of conditions, including (a) whether or not the estimated test range is inside specification limits and (b) whether or not, de facto, the number of units or the fraction of units within a subject population which fail an individual test or set of tests exceeds a predetermined threshold (where the threshold is not necessarily the same for every test). It is appreciated that alternatively, either of the above two criteria may be used in isolation. Also, a different logical combination of the two may be employed. Depending on the embodiment, the condition of being inside/outside specification limits may refer to completely inside/outside or partly inside/outside the specification limits.

One such embodiment for material rejection/acceptance is shown in the flowchart of FIG. 26, in which a manufacturing lot is being tested, and for which validation and sampled unit parametric data are being measured and evaluated. For example, the population may comprise a manufacturing lot including a batch of wafers. The method of FIG. 26 may be exactly as illustrated and/or may comprise the following operations: An initial estimated test range for the lot is derived from measurements made from validation units in step 2601, for example using the method of FIG. 2. In step 2602, the estimated test range calculated in step 2601 is compared to specification limits. If the estimated test range is not inside specification limits (no in step 2603), then in step 2607 it is determined if the entire lot should be rejected. It is assumed in the illustrated embodiment that when the estimated test range calculation is derived from measurements made from validation units, the entire lot is rejected (step 2608). However in other embodiments only part of the lot may be rejected, for example only the validation units. If instead, the estimated test range is inside specification limits (yes in step 2603), then sampling begins. Referencing the data of FIG. 17 to illustrate the present example, a single wafer of 300 units may provide the validation unit data for the initial ETR calculation of step 2601, with subsequent wafers sampled at a 10% rate of 30 units each. (In the present example a constant sample rate is assumed.) Sampled unit data are later added to the initial validation unit measurements for re-computation of the ETR in step 2606, for example using the method of FIG. 2 Comparison of the upper and lower ETR values calculated in step 2606 to specification limits in performed in (the reiteration of) step 2602. The calculation of ETR values in step 2606 and their evaluation in 2602 may occur either after each additional sample data point is acquired (under the continuous approach), or may occur periodically, for example, after gathering sample data from each set of N consecutive sampled units, or for another example, at the conclusion of each population portion corresponding to the N consecutive sampled units, at the conclusion of part of the population, or at the conclusion of the entire population, etc. For the data illustrated in FIG. 17, ETR values are calculated and evaluated periodically after every set of 10 sampled units are tested, and based on this interpretation of FIG. 17, ETR values for the wafer associated with sampled units 301 to 330, and ETR values for the wafer associated with sampled units 331 to 360, are all inside specification limits. At each evaluation interval, testing and sampling is allowed to continue in step 2605 of FIG. 26, if ETR values remain inside specification limits and there are more samples to be tested, as determined at decision steps 2603 and 2604, respectively. Continuing with the data illustrated in FIG. 17, the lower ETR values for the wafer associated with sampled units 361 to 391 trend towards the lower specification limit until finally falling outside of the lower specification limit in the third ETR re-computation for the sampled unit data of that wafer. Failure is then identified in 2603 of FIG. 26. In some embodiments, such a failure is sufficient reason to reject the entire lot, while in others the lot may be allowed to continue testing while only the failing population portion (in this example, the non-sampled units corresponding to sampled units 381 to 391) or a part of the population corresponding to sampled units 381 to 391, (for example the wafer containing sampled units 361 to 391) is rejected. These two responses are shown in step 2608 and step 2609 respectively, which depend on the policy applied in 2607. It should be evident that in other embodiments other responses are possible, for example only rejecting sampled units 381 to 391. Assuming embodiments where the continuous approach is instead used, in some cases either the lot or part of the lot, such as the wafer including the failing sample, is rejected. It should be evident that in other embodiments other responses are possible, for example only rejecting the failing sample. If testing of the lot is allowed to continue after rejecting the failing population portion, part, or sample(s), and it is determined at decision point 2610 that there are more portions/parts to be tested, then the validation baseline is reestablished using a new set of validation units obtained from the subsequent population portion/part to be tested, as shown in step 2611. In one embodiment, all previous validation and sampled unit data are excluded and the validation unit population is renewed, reinitializing the ETR value with new measurements in step 2601. In some cases, the renewed validation unit ETR values on material subsequent to failure may also fail, as implied by the data of the units following unit 391 of FIG. 17 (parametric data of the subsequent wafers of the example continue to trend downward). However, in some cases, the renewed validation unit ETR values may revert to the passing range, after an isolated failure occurs, as implied by the data of the units following unit 330 of FIG. 15B. Testing continues in this fashion until all of the lot-under-test has been tested, as determined at decision points 2604 and 2610. If the entire lot has not been rejected at step 2608 during execution of the flow, testing finally terminates at 2612 with acceptance of at least some portion(s)/parts of the lot under test.

It is appreciated that the particular method described above for FIG. 26 merely reflects certain embodiments and is not intended to be limiting.

For example, in one embodiment, the initial ETR computation based on validation unit measurements may be omitted.

As another example, other manufacturing flow decisions may additionally or alternatively be made based on the comparison of the ETR to specification limits. For instance, instead of rejecting a lot (step 2608) or rejecting a current population portion/part, (step 2609), or rejecting the failing control unit(s) (e.g. validation and/or sampled unit(s)), in some cases the lot, current population portion/part, or failing control unit(s), may be subjected to additional testing and/or other processing, for example an additional burn-in test or an additional cold test final test operation.

As another example, the manufacturing flow decision may additionally or alternatively affect other populations. Continuing with the example and assuming other populations are other lots, in one embodiment material from upcoming lot(s) may be additionally or alternatively rejected/accepted and/or manufacturing flow decisions for upcoming lots may be affected based on the comparison of the ETR calculated from measurements of previous lot/lots to specification limits.

In some embodiments, additionally or alternatively, calculated estimated maximum test range values may be applied as pass/fail test limits to which parametric data derived from testing units of a subject population may be directly compared, effectively replacing the specification limits for tests. For simplicity of description, it is assumed that pass/fail limits include upper and lower limits and that the estimated maximum test range also is bound by upper and lower values. However in other embodiments where the estimated maximum test range equals either the Upper Estimated Test Range value or the Lower Estimated Test Range Value, and the pass/fail limit is therefore an upper limit or lower limit respectively, similar methods and systems to those described below may be used, mutatis mutandis.

In some embodiments, in which the goal is to decide whether to pass or fail each individual unit comprising the subject population, the ETR values for any given test are applied as limits, requiring that the parametric value derived from testing each unit fall between the upper ETR value and the lower ETR value. In embodiments in which the goal is to decide whether to accept or reject an entire subject population, a criterion for accepting material may be based partly, or completely, on the number or fraction of units from within a subject population whose parametric test data fall between the upper ETR value and the lower ETR value of the test(s) of interest.

In some embodiments involving the use of ETR limits for unit-level pass/fail testing, data to establish ETR limits are derived from control units in an initial section of material to form a baseline. In some embodiments, it is assumed that the population comprises a plurality of fabrication lots and that these control units are drawn from each of the several fabrication lots to form a baseline, although in other embodiments the population may comprise one lot or less than one lot. An example of the former embodiments (where the population comprises a plurality of fabrication lots) is shown in the flow chart of FIG. 27. The method of FIG. 27 may be exactly as illustrated and/or may comprise the following operations: In step 2701 parametric test data are gathered from control units comprising N units from each of M fabrication lots, for a total of N*M data points. For example, 30 units may be selected from each of 6 fabrication lots, providing 180 validation units from which to establish an estimated test range baseline. In some embodiments, in order to ensure the integrity of the baseline data, any points that fall outside the range of specification limits may be excluded from the calculation, and therefore in these embodiments only control units whose points fall inside the range of the specification limits are included in the baseline. The quantity of units and of fabrication lots given here are provided as an example only, and are not meant to limit the method to these specific numbers. Any suitable number of units and fabrication lots may be used. In step 2702, the ETR calculation is performed for these control units, for example as described in FIG. 2. In step 2703 non-control units are tested and compared to the ETR values as pass/fail limits, with non-control units passing the test if inside the estimated test range. For example, referencing the probability values shown in the table of FIG. 11 and assuming 180 control units, if 5% of the 180 points are used to derive the ordered values of the ETR tail (with 9 points each included in the upper and lower ETR value calculations) and a safety coefficient of 1.0 is used, the probability of test values from non-control units of the population falling outside of the resulting upper or lower ETR limits is 0.01545888%. Thus, the application of these ETR limits as fixed pass/fail limits to the testing of subsequent (non-control) material in step 2703 will produce overkill (i.e. false failures) at a rate of about 1.5 units out of 10,000 units tested, assuming that that the subject population continues to be representative of the baseline population from which the ETR limits were derived. As described previously, the limits may be tightened or loosened (with an increase or decrease in overkill rate), by adjusting the number of data points included in the tail and/or by adjusting the safety coefficient value. If there is a systematic shift in the baseline, as evidenced by a statistically significant increase or decrease in the expected overkill rate, or as predicted by a recognized deliberate or incidental change in the way that the material at test has been fabricated that impacts parametric behavior, then another baseline may be drawn from a new representative set of units, and the ETR limits may be recomputed by repeating steps 2701 and 2702. These two alternative triggers to reestablish the baseline with new (different) control units are shown in steps 2704 and 2705. As long as the subject population continues to be statistically consistent with the population from which ETR limits have been computed, the current limits may continue to be used, as shown in step 2706.

In some embodiments involving the use of ETR limits for unit-level pass/fail testing, data to establish ETR limits are derived from the body of material currently under test, and thus, the limits are allowed to vary according to the parametric distribution of the subject population. In such embodiments, any units from the subject population whose parametric data for the test or tests of interest are outside of the custom upper or lower ETR limits computed for that population, are defined as failing. Since the data points included in the ETR calculation will always reside between the resulting upper and lower ETR values (by definition of the estimated maximum test range calculation methodology), embodiments utilizing the upper and lower ETR values as unit-level pass/fail limits should exclude the data being compared to these limits from the ETR value calculations. If the parametric test of interest is being executed on each unit, and evaluated against dynamic and custom ETR-based pass/fail limits for the unit's subject population, it is therefore suggested that the parametric data of the unit under evaluation be excluded from the ETR calculations prior to verifying that the unit is inside the range of the upper and lower ETR pass/fail limits. Units whose parametric data are found to be outside the range defined by these ETR pass/fail limits are defined as failures and are excluded from any subsequent recalculation of the ETR-based pass/fail limits.

In some embodiments where ETR-based pass/fail limits are dynamically updated, the control unit data for the recalculation of the dynamic (or adaptive) ETR limits are acquired as testing progresses and recalculation occurs at the same rate as the control unit data are acquired. The rate of units designated as control units may range from a minimum of $f_0$ to a maximum of 100% of the units within the subject population that have been tested up to the point of ETR calculation. For example, if one of every ten units tested is designated as a control unit, then ETR limit recalculation occurs after every set of ten units has been tested. Continuing with this example, the recalculated values of the ETR-based pass/fail limits are applied for parametric evaluation of the next ten units, pending the next recalculation. The subject population under test would typically be defined as the set of units within a wafer, within a fabrication lot, or within a final test lot, although in other embodiments may include less than all units in a wafer or lot, units from more than one wafer or from more than one lot, etc. FIG. 28 illustrates a flow chart for such an embodiment. The method of FIG. 28 may be exactly as illustrated and/or may comprise the following operations: in this example, it is assumed that the illustrated flow is being applied to a population comprising units within a wafer. Therefore in step 2801 the data from each of the first N units tested on the wafer that pass device specification limits are used to establish the data-set that is used in step 2802 to calculate initial upper and lower ETR-based pass/fail limits for the test or tests of interest, for example as described in FIG. 2. Each unit on the wafer (excluding the N units) is evaluated against these limits in step 2803. If the current unit under test fails in decision step 2804, then in step 2805, another unit becomes the unit under test and is tested in the next iteration of stage 2803 against the same ETR limits. Similarly if the unit passes in step 2804, but the unit is not a designated control unit ("no" in step 2806), then in step 2805, another unit is becomes the unit under test and is tested in the next iteration of stage 2803 against the same ETR limits. However, if the passing unit is a designated control unit ("yes" in step 2806) then in step 2807 the control unit data is incorporated into the data-set, causing the ETR to be recalculated, for example as per FIG. 2. The rate of units designated as control units determines how often in step 2806 a unit is identified as a control unit. In the extreme case of $f_0=0\%$, all remaining units tested on the wafer continue to be evaluated against the initial pass/fail limits (no additional units are designated as control units). At the opposite extreme of $f_0=100\%$, every unit on the wafer is designated as a control unit, potentially causing the pass/fail limits to be updated with the data of each passing unit. Note that in step 2807 the recalculation of the ETR-based pass/fail limits may occur either by appending additional control unit data to the existing data-set, increasing the total number of data points being applied, or may occur by substituting the earliest data point in the data-set with the most recent data point, maintaining a fixed number of data points for ETR calculation.

In other embodiments in which dynamic updates to ETR-based pass/fail limits are made, data for calculation of the ETR limits are acquired as testing progresses, but the calculation of revised ETR values occurs only at periodic intervals after testing of at least the control units from within a defined population portion has been completed. In some cases, parametric data from the test or tests of interest may be simultaneously collected on control units and on non-control units, with pass/fail evaluation performed only after testing of a defined population portion has been completed. In these cases, the passing or failing status of the non-control units is assigned through comparison of their data to the ETR-based pass/fail limits after the population portion testing has been completed. In some of these cases, the collection of units within a defined population portion may be designated as "control units" and "non-control units", as convenient, after the testing of the population portion has been completed, when the parametric data from all of the units contained within the population portion is available. In other cases, parametric data may be initially collected only on control units from within a population portion, and after calculation of ETR-based pass/fail limits using this data-set has occurred, the remaining non-control units from within the population portion may be tested and evaluated in real time against these pass/fail limits. In some embodiments, the data-set comprised of parametric test data from control units from within the population portion may be altered to exclude one or more of the control unit data points and ETR-based pass/fail limits may be recalculated using this reduced data-set, to derive suitable pass/fail limits for evaluating the status of the control units whose data points have been eliminated. In some of these cases, for each control unit a different data-set may be applied for a unique ETR pass/fail limit calculation in which, minimally, the data of the control unit being evaluated has been excluded.

As mentioned above, in embodiments for which the updates to ETR-based pass/fail limits are performed periodically, after sufficient data have been acquired by testing at least the control units of a particular population portion, the pass/fail evaluation of units may also be performed periodically or may be evaluated as testing of the population portion progresses. In some of these embodiments, methodologies may be applied to exclude aberrant data points in the calculation of the ETR-based pass/fail limits, since such aberrant data will distort the limits that would otherwise have been computed (in the absence of such aberrance within the subject population). An example of the impact of an aberrant data point on a computed estimated test range value can be seen in FIG. 15B in lower ETR value 1510. The inclusion of control data point #330 in the calculation drives the lower ETR to a much lower value than preceding values, although control data points prior to and following control data point #330 are consistent with one another. In some embodiments, the problem may be avoided by following the sequence of FIG. 28, previously described. In such an approach, the data from units within the population portion are included in ETR calculation only after individual data points have been verified to be compliant with the current value of ETR-based pass/fail limits. Designated control units whose data are inside the current ETR-based pass/fail limits are sequentially appended to the set of data from which revised ETR values will be computed. Aberrant data points are thus excluded from ETR calculations. A limitation of such an approach is that a prior set of ETR-based pass/fail limits must be known in order to apply them to pass/fail evaluation of designated control units within the current population portion.

Assuming embodiments where the pass/fail evaluation of units is performed periodically, other approaches to avoid the problem of aberrant data distorting ETR based limits may be used. For example, in some embodiments, solving the problem may include breaking the current population portion into multiple segments, calculating upper and lower ETR values for each of these segments, and accepting data points for calculation of upper and lower ETR values for the entire population portion only from segments whose ETR values are consistent with one another. This approach is shown in FIG. 29. The method of FIG. 29 may be exactly as illustrated and/or may comprise the following operations: In step 2901, all of the (N) units within population portion 'X' are tested and the resulting parametric test data are stored for evaluation. The data of units passing device specification limits are partitioned into K groups of M units each in step 2902, and for each of the K groups upper and lower ETR values are calculated, as shown in step 2903, using the ETR computation methods previously described for example with reference to FIG. 2. In step 2904 the resulting K upper ETR values and K lower ETR values are each sorted to find the median value of the upper ETR and the lower ETR for the set of K groups, along with the values of the 25-percentile and the 75-percentile values of each distribution. The "robust sigma" of the upper ETR and the lower ETR distributions for the set of K groups is then determined by calculating the difference between the 25-percentile and the 75-percentile values of each, and dividing this difference by 1.35, providing a non-parametric estimate of a standard deviation. If a Gaussian distribution is assumed, the median and robust sigma calculation may be replaced in step 2904 with the calculation of the mean and standard deviation of the K upper ETR values and the K lower ETR values, and these may be used instead. In the loop of steps 2905 through 2910, each group's calculated value of upper ETR is individually compared to an upper limit equal to the median plus six times the robust sigma, and each group's lower ETR value is compared to a lower limit equal to the median minus six times the robust sigma. Alternatively, if a Gaussian distribution is assumed, the comparisons of upper and lower ETR values are made, respectively, to the mean plus six times the standard deviation or to the mean minus six times the standard deviation. If the evaluations of steps 2906 and 2907 determine that a group's upper or lower ETR values are not inside this accepted statistical range, the M data points that comprise that group are rejected and will be excluded from the calculation of the global upper and lower ETR-based pass/fail limits for population portion 'X' in step 2911 (i.e. the group is barred from being control units). The units from groups whose upper and lower ETR values are inside the accepted statistical range are control units and are therefore used in calculating a global ETR in step 2911, for example as described with reference to FIG. 2, for use as ETR-based pass/fail limits. The resulting ETR-based pass/fail limits for population portion 'X' are then applied in step 2912 for evaluation of the data from all N units, with units whose individual values fall outside of these limits being designated as failures. Step 2912 may optionally be simplified by skipping the evaluation of any data points that have been included in calculating the ETR-based pass/fail limits of the population portion, since data points included in that calculation are mathematically guaranteed to pass.

In some embodiments, the segmentation of the population portion into K groups of M units each is made with consideration to the methodology just described. The number M must be chosen to be small enough that, at a given probability of encountering aberrance in units tested (i.e., at a given defect density), enough of the K segmented groups are found to be defect-free to provide a reasonable number of units for ETR-based pass/fail limit calculation for the population portion being evaluated. If the overall probability of encountering aberrant data is known, appropriate values of M can be determined using binomial statistics.

For example, if population portion 'X' is defined as a single wafer that contains 2000 units, and a defect density of 0.1% is assumed, the probability of encountering a defect-free group is determined by way of binomial statistics to be roughly 90% for a value of M=100 units and K=20 groups. That is, 90% of the 20 groups of units (of 100 units each) will be defect-free, and roughly 18 of the 20 defined groups can be used to provide a total of 1,800 suitable units for calculation of wafer-level ETR-based pass/fail limits. Under these assumptions, the groups whose ETR limits are at the 25%-tile, median, and 75%-tile of the ordered data are likely to be comprised of defect-free units and are representative of a defect-free parametric data distribution.

On the other hand, if for example, a defect density of 1% is assumed, with the same value of 100 units for M, the probability of encountering a defect-free group drops to only 37%, or approximately 7 defect-free groups on the wafer, providing 700 suitable units for ETR calculation. Although this number of units for ETR calculation is still acceptable, the groups at either the 25%-tile or the 75%-tile of the ordered data set used to determine "robust sigma" (that is, the $5^{th}$ or the $15^{th}$ group in the ordered set of 20 groups) would be likely to contain defective units under these assumptions, with impact to the upper/lower ETR values of these groups and thus, inaccuracy in the "robust sigma" calculation. Similarly, the group whose data sit at the median of the distribution may have unrepresentative upper/lower ETR values, given that over half of the groups on such a wafer would be expected to contain defective units under the given conditions. One might, as a response, reduce the group size, for example adopting of a value of M=20 units and K=100 groups, which according to binomial statistics takes the probability of encountering a defect-free group to about 82%. The 1640 units from the 82 defect-free groups of this example is a suitable size for wafer-level ETR calculation. However, a group size of M=20 is marginal for meaningful calculation of the upper and lower ETR values for each group, as required by the methodology. Since the accuracy of the ETR calculation depends on having an adequate number of units, in the limit of small population portions, small group sizes, and/or high defect densities, the method described may not be suitable.

In some embodiments, as an alternative, or in addition to, the methodology of FIG. 29, the methodology shown in FIG. 30 may be applied as a solution to the mentioned limitations. In this embodiment, an a priori assumption is made regarding the fraction of data that will be impacted by defective units, comprising a portion of the topmost and a portion of the bottommost data points collected from the N units of population portion 'X'. The user-defined fraction q, when multiplied by N, provides the number of units at the extreme upper end and also at the extreme lower end of the ordered sequence of data derived from population portion 'X' suspected of being "outliers", that is, of being defective. The data of those suspect units are initially omitted from calculation of a preliminary upper ETR value and lower ETR value for population portion 'X', and are then individually compared to these preliminary limits to determine whether or not each suspect unit's data should be rejected in calculation of the final ETR values. To simplify the illustration, the embodiment of FIG. 30 applies the same value of the assumed defective fraction q to both the extreme upper data values and the extreme lower data values, although the methodology does not require this, and two different values may be applied, if appropriate (i.e., assignment of a $q_{lower}$ value and a $q_{upper}$ value are not necessarily the same).

Continuing with an explanation of FIG. 30, the method of FIG. 30 may be exactly as illustrated and/or may comprise the following operations: in step 3001, the N units within population portion 'X' are tested and the resulting parametric test data are stored for evaluation. The N data points are ordered from high values to low values in step 3002. For the purposes of the illustration, the data point with the highest value is assigned to position 1 and the data point with the lowest value is assigned to position N. A hypothetical number of "outliers" comprising the topmost and the bottommost data points are calculated in step 3003, by multiplying the total number of data points N by the assumed fraction defective q. In step 3004 a dataset excluding the topmost q*N data points and the bottommost q*N data points is used to calculate a preliminary value for the upper and lower ETR values for population portion 'X', for example as described above with reference to FIG. 2. In the loop of steps 3005 through 3011, each of the topmost data points excluded in step 3003 is individually compared to a preliminary upper ETR value, and each of the bottommost data points excluded in step 3003 is individually compared to a preliminary lower ETR value. If the evaluations of steps 3006 and 3008 determine that a data point value is outside of the preliminary ETR limits, the data point will be excluded from the calculation of the final upper and lower ETR-based pass/fail limits for population portion 'X' in step 3012 (i.e. the unit associated with the excluded data point will not be a control unit). If the evaluations of steps 3006 and 3008 determine that the data point is instead inside the preliminary ETR limits, the associated unit will be a control unit. The remainder of the N units which are not the topmost q*N data points and the bottommost q*N data points will also be control units. The calculation of the final ETR in step 3012 may proceed for example as described above with reference to FIG. 2. The resulting ETR-based pass/fail limits for population portion 'X' are then applied in step 3013 for evaluation of the data for all N units, with units whose individual values fall outside of these limits being designated as failures. Step 3013 may optionally be simplified by skipping the evaluation of any data points that have been included in calculating the final ETR-based pass/fail limits, since data points included in that calculation are mathematically guaranteed to pass.

To provide a numerical example of the methodology of FIG. 30, a population portion 'X' may be defined as a single wafer that contains N=2000 units, and a defect density of 2% is hypothesized and assumed to be split evenly between units whose data are at the extreme top and at the extreme bottom of the range of all data points. In this example, therefore, a value of q=0.01 may be assigned. After testing the N units of the wafer, and sorting the resulting parametric data points from high to low, the topmost 20 points and the bottommost 20 points are excluded from preliminary upper and lower ETR calculation (the number equal to q*N is 0.01*2000, in this example). The remaining 1,960 units are assumed to be defect-free and suitable for the preliminary ETR calculation. The excluded data points of the 40 extreme units are then compared to the preliminary ETR limits, and are either accepted or rejected for use in the final ETR calculation. If, for example, it is found that 10 units from the topmost group and 10 units from the bottommost group are rejected, then the final ETR calculation is performed with the data of the surviving 1,980 accepted units. The data of the 1,980 units included in the calculation are mathematically guaranteed to be inside the range of the resulting ETR-based pass/fail limits. The data of the 20 rejected units are compared to the final upper and final lower ETR pass/fail values, with units whose individual values fall outside of these limits being designated as failures.

It is appreciated that the methods described above with reference to FIGS. 27-30 merely reflect certain embodiments and are not intended to be limiting.

In some embodiments involving the use of ETR limits for unit-level pass/fail testing, regardless of which of the embodiments described above or any other embodiments have been used for performing the pass/fail testing, a manufacturing flow decision may additionally or alternatively be made. The manufacturing flow decision (such as a decision to reject or to accept the material of the subject population) may be made at least partly on the basis of the incidence of failure (e.g. number or fraction of failing units) contained within the subject population, where in these embodiments a failing unit is defined as one whose parametric test data lies outside of the upper and lower ETR-based pass/fail limits of one test or a set of tests. In some of these embodiments, if the number or fraction of units within the subject population that fail an individual test or set of tests exceeds a predetermined threshold (where the threshold is not necessarily the same for each test), the material is rejected.

Depending on the embodiment, a criterion for the manufacturing flow decision which is based on ETR pass/fail limits may be used in addition to or instead of criteria described earlier with respect to manufacturing flow decisions. It is noted that in earlier described embodiments at least one of the criteria for the manufacturing flow decision (such as a decision to either accept or reject material) is based on the overlap of the calculated estimated test range with specification limits. However in the present embodiments at least one of the criteria for the manufacturing flow decision such as whether to accept or reject material is additionally or alternatively based on the number of fraction of failures within the material under evaluation, where a unit failure in these embodiments is defined by non-compliance to ETR-based pass/fail limits. In these embodiments, within a given population of material (e.g., a lot, part of a wafer, a wafer, a set of wafers, part of a lot, a lot, a set of lots, etc), every unit from the population, or a number of units from the population, is tested and the resulting unit-level parametric data are individually compared to ETR-based pass/fail limits calculated for the subject population. In one example of these embodiments if the testing data for a unit is greater than the corresponding upper ETR-based limit or less than the lower ETR-based limit, the unit is defined as a failure. The fraction of failing units, is calculated in these embodiments by dividing the number of such failures by the number of units that have been evaluated. If the fraction of failing units for any of the tests under evaluation exceeds a predefined threshold, which is a fraction that is not necessarily the same for each test, then for example the entire set of units comprising the subject population is rejected. In some cases of these embodiments, rather than basing the decision at least partly on the fraction of failures, an integer number of failing units may define at least one of the rejection threshold conditions; for example, if the number of failing units on a wafer exceeds say the number 5, then the entire wafer may be rejected.

In some of these embodiments a decision to reject material is based on a logical combination of conditions, including (a) whether or not the estimated test range is inside specification limits and (b) whether or not, de facto, the number of units or the fraction of units inside a subject population which fail an individual test or set of tests exceeds a predetermined threshold, where in these embodiments a unit fails if the data for unit tested is greater than the upper ETR-based limit or less than the lower ETR-based limit and the threshold is not necessarily the same for each test. It is appreciated that alternatively, either of the above two criteria may be used in isolation. Also, a different logical combination of the two may be employed.

Embodiments of the present invention have been primarily disclosed as methods and it will be understood by a person of ordinary skill in the art that a system such as a conventional data processor incorporated with a database, software and other appropriate components could be programmed or otherwise designed to facilitate the practice of one or more methods of the invention or a part thereof.

For example, in some embodiments, any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. Therefore in some embodiments of the invention, operations in accordance with the teachings herein may be performed by a computer specially constructed for the desired purposes or by a general purpose computer specially configured for the desired purpose by a computer program stored in a computer readable storage medium. Embodiments of the present invention are not described with reference to any particular programming language. It will be appreciated that a variety of programming languages may be used to implement the teachings of the inventions as described herein. The term "process" as used herein is intended to include any type of computation or manipulation or transformation of data represented as physical, e.g. electronic phenomena which may occur or reside e.g. within registers and/or memories of a computer.

Additionally or alternatively, the system of the present invention may include, according to certain embodiments of the invention, machine readable memory containing or otherwise storing a program of instructions which, when executed by the machine, implements some or all of the methods, features and functionalities of the invention shown and described herein. Alternatively or in addition, the system of the present invention may include, according to certain embodiments of the invention, a program as above which may be written in any conventional programming language, and optionally a machine for executing the program such as but not limited to a general purpose computer which may optionally be configured or activated in accordance with the teachings of the present invention. It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of some embodiments of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable system programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Unless specifically stated otherwise, as apparent from the description herein, it is appreciated that throughout the discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining", "receiving" "performing", "plotting", "extending", "defining", "modifying", "disabling", "enabling", "re-computing", "changing", "rejecting", "normalizing", "applying", or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices. The term "computer" should be expansively construed to cover any kind of electronic device with data processing capabilities, including, by way of non-limiting example, personal computers, servers, computing systems, communication devices, processors (e.g. digital signal processor (DSP), microcontrollers, field programmable gate array (FPGA), application specific integrated circuit (ASIC), etc.) and other electronic computing devices.

Figure 31:
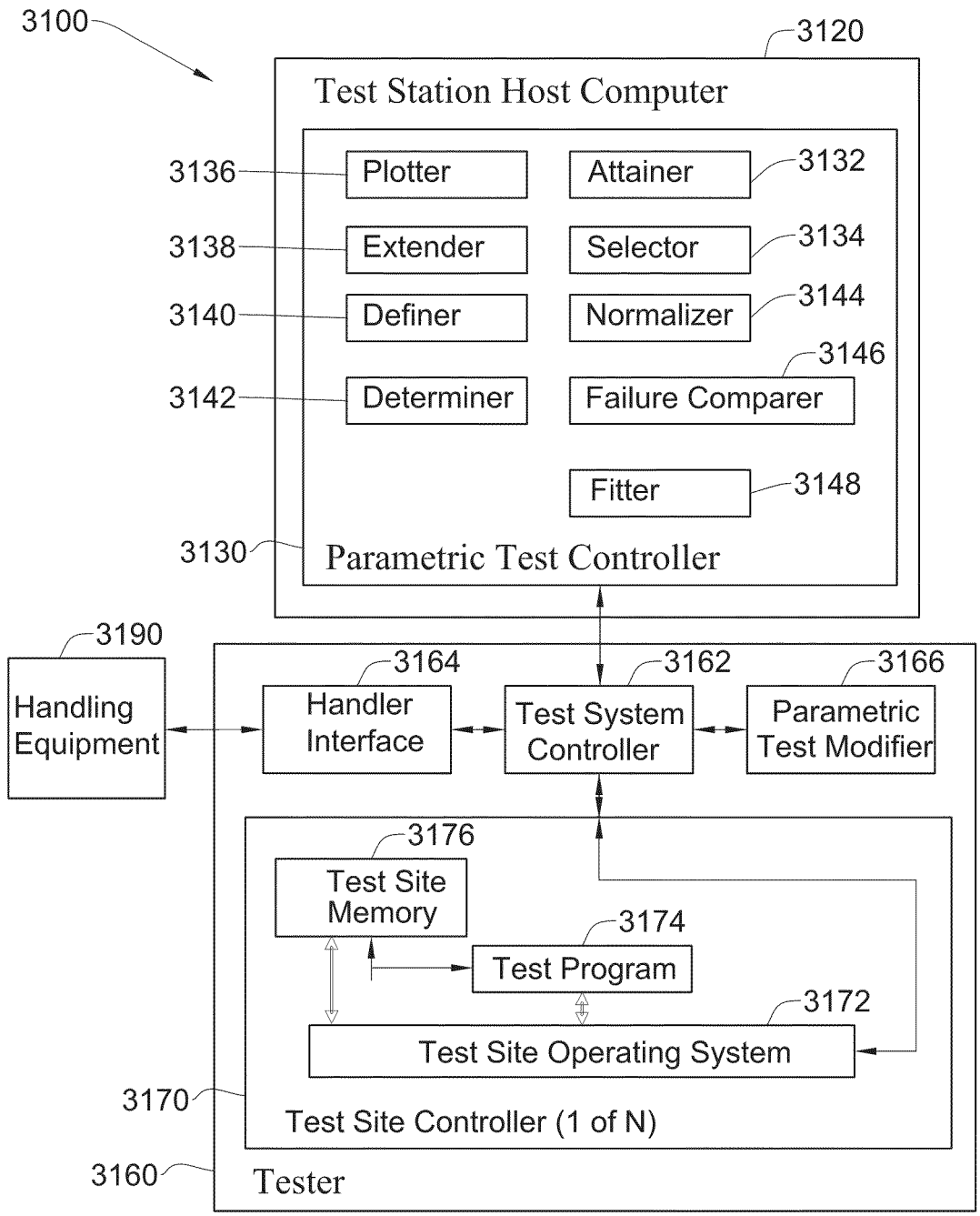
FIG. 31 is a simplified block diagram of a system for parametric testing in accordance with certain embodiments of the present invention.

For the sake of further enlightenment to the reader, embodiments of a system for parametric testing will now be described with reference to FIG. 31, but the embodiments should not be construed as limiting. As shown in FIG. 31, system 3100 includes a Test Station Host Computer 3120 (including a Parametric Test Controller 3130), a Tester 3160 and handling equipment 3190. In some embodiments, one or more of the elements of FIG. 31 such as Test Station Host Computer 3120, Tester 3160, and Handling Equipment 3190 are connected to one another via a local area network LAN and/or a bus. For example, in one of these embodiments, Test Station Host Computer 3120 may be integrated into Tester 3160. As another example, Test Station Host computer 3120, Tester 3160, and Handling Equipment 3190 may communicate via any conventional wired or wireless digital communication means, e.g. via a wired or cellular telephone network or a computer network such as the Internet.

Each element in FIG. 31 can be made up of any combination of software, hardware and/or firmware that performs the functions as defined and explained herein. The elements in FIG. 31 may be centralized in one location or dispersed over more than one location. In some embodiments of the invention, system 3100 may comprise fewer, more, and/or different elements than those shown in FIG. 31. For example, in one embodiment of the invention there may additionally or alternatively be a test operation server which stores extensive manufacturing data, with such a server standing alone or integrated with another element of FIG. 31 such as with Test Station Host Computer 3120. In some embodiments of the invention, the functionality of system 3100 described herein may be divided differently into the elements of FIG. 31. In some embodiments of the invention, the functionality of system 3100 described herein may be divided into fewer, more and/or different elements than shown in FIG. 31 and/or system 3100 may include additional or less functionality than described herein. For example, in one embodiment of the invention there may be a plurality of Test Station Host Computers 3120, for example two Test Station Host Computers 3120, with one Host Computer 3120 dedicated to Tester 3160 and the other Host Computer 3120 dedicated to Handling Equipment 3190. For simplicity of description it is assumed herein that there is only one Test Station Host Computer 3120. In some embodiments of the invention, one or more elements shown in FIG. 31 may have more, less and/or different functionality than described.

In the illustrated embodiments of FIG. 31, Handling Equipment 3190 is configured to handle semiconductor devices. For example in one embodiment Handling Equipment 3190 includes a prober for handling a wafer and/or handler for handling an individual unit. Continuing with the example, in one embodiment of final stage test, Handling Equipment 3190 includes a device handler adapted to handle packaged devices. Continuing with the example, in various embodiments Handling Equipment 3190 may also or instead include other equipment used to handle wafers, individual units or packaged integrated circuits.

In the illustrated embodiments of FIG. 31, Tester 3160 includes a Test System Controller module 3162, a Handler Interface module 3164, a Parametric Test Modifier module 3166, and N Test Site Controllers 3170. In these embodiments, N≥1 with the value of N depending on tester architecture. Each of the N test site controllers 3170 (of which one is illustrated) includes a Test Site Operating System module 3172, a Test Program module 3174, and a Test Site Memory module 3176. Each of these modules can be made up of any combination of software, hardware and/or firmware that performs the functions as defined and explained herein.

In the illustrated embodiments of FIG. 31, Test System Controller 3162 is the overall controller of system test operations, including inter-alia the coordination of testing by the N Test Site Controllers 3170. (In some cases with only one Test Site Controller, the functionality of Test System Controller 3162 and Test Site Controller 3170 may be merged into one controller, but in other cases, System Controller 3162 and Test Site Controller 3170 would still be separate.) In one embodiment, Test System Controller 3162 coordinates communications among Test Site Controllers 3170 (assuming more than one). In some embodiments with a plurality of Test Site Controllers 3170, Test System Controller 3162 alternatively or additionally supports operations relating to more than one Test Site Controller 3170, for example relating to all Test Site Controllers 3170 in one of these embodiments.

In the illustrated embodiments of FIG. 31, specification of the test content, for example the desired signal transition timing, voltage or current levels, pass/fail criteria, vector/data pattern selection, vector/data pattern sequences, test subroutine and pattern content, test flow sequencing and branching, etc. is made through compiled or linked files constituting Test Program 3174, created for example using custom tester-specific programming languages and a library of application programming interface (API) functions. In the illustrated embodiments a version of Test Program 3174 executes on each instance of Test Site Controller 3170, running under the local CPU and Test Site Operating System 3172. In the illustrated embodiments, Test Program 3174 comprises one or more tests whose individual execution status, test-times, and test results are logged as testing progresses from the beginning of Test Program 3174 through the end. Data generated in the course of testing a device by Test Program 3174 are stored in the corresponding (local) Test Site Memory 3176, but may be globally accessed and/or modified through Test System Controller 3162. For example, the data may be retrieved by Test System Controller 3162, formatted and sent to Test Station Host Computer 3120. The formatted binary data may symbolize parametric variables data specific to a unit that has been generated during its testing, and may also symbolize the classification of the unit, according to its overall pass/fail response to an individual test or to a sequence of tests. In the present system 3100, the formatted binary data includes results from parametric testing.

In the illustrated embodiments of FIG. 31, the content of Test Site Memory 3176 is local to each Test Site Controller 3170. To name just a few example applications, the data stored in Test Site Memory 3176 may include inter-alia digital data controlling analog test instrumentation (such as D-to-A settings), digital data representing results of parametric testing (such as A-to-D test results), as well as purely digital data such as data to control signal timing and format, design-specific data specified for electronic device functional operations, control flags to track and evaluate in conditional test operations, and pass/fail counters and flags associated with individual tests within the sequence of tests of an integrated test flow. The short list of uses provided here is meant to illustrate how test site memory is used and how dynamic it may be during electronic device testing; many other possible applications and data types will occur to those skilled in the art.

In the illustrated embodiments of FIG. 31, Handler Interface 3164 provides an interface to Handling Equipment 3190. In another embodiment, a Handler Interface to Handling Equipment 3190 may additionally or alternatively be implemented from Test Station Host Computer 3120. In embodiments where an action that is determined by Parametric Test Controller 3130 includes the physical handling of units by Handling Equipment 3190, control of the physical handling of the units is provided via Handler Interface 3164. For example, a change to the manufacturing flow and/or augmented testing on units which have already been tested may in some cases require physical handling of the units. Continuing with the example if the change in the manufacturing flow includes material rejection then material may need to be unloaded by Handling Equipment 3190 and/or if augmented testing is required then non-sampled units may need to be returned by Handling Equipment 3190 for testing.

In the illustrated embodiments of FIG. 31, Parametric Test Modifier 3166 is configured to generate a command if an action that is determined by Parametric Test Controller 3130 requires modification to the test flow and/or parametric test conditions. The generated command may be for example specific to Test Site Operating System 3172 and may cause Test System Controller 3162 to perform modifications to the test flow and/or parametric test conditions, For example, if it is determined to enable a test going forward that was previously disabled for test time reduction, then the test may be restored to the accepted test flow for testing upcoming material. As another example, if it is determined to disable a test going forward that was previously enabled, then the test may be removed from the accepted test flow for upcoming material. As another example, if it is determined to alter the sample rate and/or pass/fail limits, then the sample rate and/or pass fail limits may be altered. In order to modify the test flow and/or parametric test conditions, Test System Controller 3162 modifies, for example, Test Program 3174 and/or Test Site Memory 3176 on one or more of Test Site Controllers 3170.

In another embodiment, there may be a separate Parametric Test Modifier 3166 on each Test Site Controller 3170. In this case, the Parametric Test Modifier 3166 on a particular Test Site Controller 3170 may modify the test flow and/or parametric test conditions for that test site, for example by modifying the corresponding Test Program 3174 and/or Test Site Memory 3176.

In another embodiment, Parametric Test Modifier 3166 may be omitted, for example if actions determined by Parametric Test Controller 3130 do not require modification of test flow and/or parametric test conditions.

In some embodiments of the invention, Tester 3160 may comprise fewer, more, and/or different modules than those shown in FIG. 31. For example, in one embodiment, Tester 3160 may include part or all of Parametric Test Controller 3130. As another example, additionally or alternatively, in one embodiment there may be a separate Parametric Test Modifier 3166 on each Test Site Controller 3170, and/or Parametric Test Modifier 3166 may be omitted from Tester 3160. In some embodiments of the invention, the functionality of Tester 3160 described herein may be divided differently into the modules of Tester 3160. In some embodiments of the invention, the functionality of Tester 3160 described herein may be divided into fewer, more and/or different modules than shown in FIG. 31 and/or Tester 3160 may include additional or less functionality than described herein. For example, in one embodiment, Tester 3160 may exclude Handler Interface 3164. In some embodiments of the invention, one or more modules of Tester 3160 may have more, less and/or different functionality than described.

In the illustrated embodiments of FIG. 31, Test Station Host Computer 3120 provides operational support, such as providing configuration information and the various files required to define the test conditions of the particular type of semiconductor device to be tested, information about the lot and wafer origins of the material being tested, initiation of tester initialization/calibration/test procedures, and/or the receipt and archival of any processed data generated during testing, etc. Therefore in the illustrated embodiments, Parametric Test Controller 3130 is assumed to be located in Test Station Host Computer 3120 in order to have access to the data received by Test Station Host Computer 3120 when determining whether or not to perform an action. However in other embodiments, part or all of Parametric Test Controller 3130 may be located elsewhere, for example on Tester 3160, on a test operation server, or anywhere else in system 3100.

In the illustrated embodiments of FIG. 31, Parametric Test Controller 3130 includes an Attainer module 3132, a Selector module 3134, a Plotter module 3136, a Fitter module 3148, an Extender module 3138, a Definer module 3140, a Determiner module 3142, a Normalizer module 3144, and a Failure Comparer module 3146. In one embodiment, Parametric Test Controller 3130 is configured inter-alia to perform part or all of the method of FIG. 2. Each of these modules can be made up of any combination of software, hardware and/or firmware that performs the functions as defined and explained herein.

For example, Attainer 3132 may attain results generated from a parametric test performed on semiconductor devices included in a control set comprising a subset of a population of semiconductor devices. The invention does not limit the way that the results are attained and any known active and/or passive way can be used. Optionally Attainer 3132 may obtain other data. In some embodiments, Attainer 3132 may attain results, for example on a device by device basis as testing progresses, or periodically in a batch operation which includes all results derived from devices which have completed testing. Optionally results attained may be initially filtered to eliminate data points outside of specification limits, with the additional option that remaining data points attained may be numerically sorted.

For example, Selector 3134 may select from among the semiconductor devices at least one extreme subset including at least one of a high-scoring subset including all devices whose results exceed a high cut-off point and a low-scoring subset including all devices whose results fall below a low cut-off point.

Optionally, for example, Normalizer 3144 may normalize results of the control set and/or of the at least one extreme subset.

For example, Plotter 3136 may plot results (actual or normalized) of the at least one extreme subset as a normal probability plot located between a zero probability axis and a one probability axis. Optionally Plotter 3136 may also plot the results of all the other devices in the control set. In some embodiments Selector 3134 may select the at least one extreme subset after results of the control set have been plotted.

For example Fitter 3148 may fit a plurality of curves to a plurality of subsets of the results of the at least one extreme subset respectively.

It should be understood that the plotting and fitting functions include embodiments where the plotting is performed literally, creating a graphic representation of the points and fitted curves on a Cartesian coordinate system, as well as embodiments where the plotting is additionally or alternatively performed mathematically.

For example, Extender 3138 may extend each of the plurality of curves to the zero probability axis for the low-scoring subset or to the one probability axis for the high scoring subset thereby to define a corresponding plurality of intersection points along the zero or one probability axis. It should be understood that the extending function includes embodiments where the extrapolation is performed graphically as well as embodiments where the extrapolation is additionally or alternatively performed mathematically.

Optionally for example if normalization had previously occurred Normalizer 3144 may apply an inverse normalization function.

For example, Definer 3140 may define the estimated maximum test range based on at least one of the intersection points. For example, the estimated maximum test range may include all intersection points, may include all intersection points extended outward by a safety factor, may equal the highest or lowest intersection point, may include the highest or lowest intersection point extended outward by a safety factor, etc.

Optionally, for example, Failure Comparer 3146 may compare the incidence of failure to a threshold, if such a comparison is useful for determining whether or not to perform an action.

For example, Determiner 3142 may determine whether or not to perform an action based at least partly on the estimated maximum test range. Optionally the determination may alternatively or additionally be based on the output of Failure Comparer 3136. In some cases, comparison of failure incidence to a threshold may relate to estimated maximum test range, and therefore the functionality of Failure Comparer 3136 may in some cases be integrated in the functionality of Determiner 3142. Examples of actions which in various embodiments may be determined by Determiner 3142 include inter-alia: at least partly enabling a test, at least partly disabling a test, material rejection, changing pass/fail limits, changing sample rate, changing manufacturing flow, etc.

In the embodiments described herein, the determined action by Determiner 3142 may affect one or more devices in the subject population and/or in other population(s). Other populations may include population(s) that preceded the subject population in testing, which follow the subject population in testing, and/or which are tested in parallel to the subject population (e.g. at parallel sites), etc. In some of these embodiments, an affected device may be affected directly by the determined action. In other embodiments, additionally or alternatively, an affected device may be affected indirectly by the determined action. For example, consider the manufacturing flow for a particular device. In some cases of this example, Determiner 3142 may determine that the manufacturing flow should be changed for the device (independently or along with other device(s)), whereas in other cases of this example, Determiner 3142 may additionally or alternatively determine that an action should be performed and the performed action may cause the manufacturing flow for the device (independently or along with other device(s)) to be changed. Continuing with the latter cases, at least partly enabling a test, at least partly disabling a test, changing pass/fail limits, changing sample rate, etc may in some of these cases lead to the manufacturing flow for the device to be changed.

It is noted that depending on the embodiment, a change in the manufacturing flow for device(s) may represent a change from the original manufacturing flow (for example which assumed acceptance of the device(s)) or may represent a change from a previously assigned manufacturing flow whose assignment was unrelated to an estimated maximum test range. A change in the manufacturing flow for device(s) may in some embodiments be equivalent to device rejection, device acceptance, subjecting the device(s) to additional testing and/or other processing, not subjecting the device(s) to additional testing and/or other processing, etc.

One or more modules of system 3100 and/or other modules may carry out the rejection and/or acceptance of device(s). For example, for devices contained in a wafer, rejection and/or acceptance may include any of the following acts inter-alia: assignment of appropriate bins to individual devices within a wafer's bin map (e.g. by Handling Equipment 3190 such as a prober, by Test Station Host Computer 3120, or by Tester 3160), modification of previously assigned bins within a wafer's bin map (e.g. by Parametric Test Controller 3130, located for instance on a test operation server), communication of devices statuses (e.g. by Handling Equipment 3190, Test Station Host computer 3120, Tester 3160 or a test operation server to a manufacturer's workflow automation system, to a Manufacturing Execution System, to a similar system (possibly including a test operation server), and/or to responsible manufacturing personnel), and/or selection, after the wafer has been singulated in the assembly saw operation, of appropriate devices by equipment such as "pick and place" equipment. In some cases of this example, the selection may be based on the (assigned or post-modification assigned) bins within the wafer's bin map and/or on previous communication. In an example of device(s) after wafer singulation but prior to packaging, rejection and/or acceptance may include any of the following acts inter-alia: Handling Equipment 3190 such as a handler physically placing device(s) in appropriate bins, Handling Equipment 3190 such as a handler physically removing device(s) from previously assigned bin(s) and placing the device(s) in different bin(s), and/or communication of device(s) status(es) (e.g. by Handling Equipment 3190, Test Station Host computer 3120, Tester 3160 or a test operation server to a manufacturer's workflow automation system, to a Manufacturing Execution System, to a similar system (possibly including a test operation server), and/or to responsible manufacturing personnel). In an example of device(s) contained in package(s), rejection and/or acceptance during final test may include any of the following acts inter-alia: Handling Equipment 3190 such as a handler physically placing packaged device(s) in appropriate bins, Handling Equipment 3190 such as a handler physically removing packaged device(s) from previously assigned bin(s) and placing the package device(s) in different bin(s), and/or communication of packaged device(s) status(es) (e.g. by Handling Equipment 3190, Test Station Host computer 3120, Tester 3160 or a test operation server to a manufacturer's workflow automation system, to a Manufacturing Execution System, to a similar system (possibly including a test operation server), and/or to responsible manufacturing personnel). In these examples, communication may occur for instance via parallel digital communication, RS-232 serial communication, General Purpose Interface Bus (e.g. IEEE 488 or HP-IB bus), Transmission Control Protocol/Internet Protocol TCP/IP network, via email or a similar messaging system, cellular networks, the Internet, and/or by any other means of communication.

Depending on the embodiment, rejection of a device may mean that the device is discarded, or may mean that the device is removed from the manufacturing flow for that particular product line but may be used in a different product line. In some embodiments, a particular product line includes a particular device design and a particular packaging design. Assume the particular product line includes a multi-chip package (MCP), meaning that multiple devices are included in a single package. In some embodiments, if multiple devices are to be included within a single package, parametric testing results may relate to set up and hold timing of those devices since the test set up and hold timing of the devices should be consistent with one another to ensure that the input-output signals are correctly detected between devices during operation of the product line item at specified clock speeds. Additionally or alternatively, in some embodiments, parametric testing results may relate to cumulative quiescent or active power consumption of the devices vis-a vis a maximum limit. Additionally or alternatively, in some embodiments, parametric testing results may relate to any appropriate parameter(s). In embodiments where the particular product line includes a multi-chip package, a rejected device may possibly be used in a different product line, for instance with other requirement(s) than the particular product line. Other requirements, for example may include less stringent reliability requirements. In some of these embodiments, the rejected device may be therefore be used in a different multi-device package line (for example with more or fewer devices per package and/or different devices per package), in a single-device package line, or discarded, depending on the implementation. In other embodiments, the particular product line may be a single-device package product line, and a rejected device may be used in a different single-device package line, in a multi-device line, or discarded depending on the implementation.

Additionally or alternatively, a product line may refer to a printed circuit (PC) board line. Manufacturing a PC board includes selection and placement of unpackaged and/or packaged devices on the board. In some embodiments, parametric testing results may relate to set up and hold timing of devices that may be included in the board since the test set up and hold timing of the devices should be consistent with one another to ensure that the input-output signals are correctly detected between devices during operation of the board at specified clock speeds. Additionally or alternatively, in some embodiments, parametric testing results may relate to cumulative quiescent or active power consumption of the devices on the board vis-a vis a maximum limit. Additionally or alternatively, in some embodiments, parametric testing results may relate to any appropriate parameter(s). In embodiments where the product line refers to a PC board line, a rejected device is removed from the manufacturing flow for that PC board line but may be used in a different PC board line, for example with different requirements, or discarded, depending on the implementation. Different requirements, for example, may include less stringent requirements.

It is noted that if a rejected device is not removed from the manufacturing flow for the product line, the specifications of that product line may not be met in some cases. Additionally or alternatively, in some cases there may be a significant negative impact on a semiconductor manufacturer from including devices that do not comply with the parametric performance requirements in the product line, and/or including devices of marginal reliability that have a high probability of eventually causing failure. For example, if specifications of the particular product line are not met because a parametrically marginal device has been used, the output of the product line may fail subsequent testing (for not complying with specifications) and cost the manufacturer loss of yield. Additionally or alternatively, for example, if a parametrically abnormal device has been used in the product line, with increased reliability risk, the output of the product line may fail "in the field", after the product line output has been shipped to end customers, resulting in warranty cost to the manufacturer and/or loss of customer confidence in the manufacturer's product. The negative impacts described here may in some cases be more costly to the manufacturer if the product line is constructed from multiple devices rather than from only one device, because the probability of failure may increase with increasing device count, and/or because the cost of failure, in terms of the cost of materials used to build the product, may increase with increasing device content.

The modules in Parametric Test Controller 3130 may be centralized in one location or dispersed over more than one location. For example, in one embodiment Parametric Test Controller 3130 may be located partly in Tester 3160 and partly in Test Station Host Computer 3120. In some embodiments, Parametric Test Controller 3130 may comprise fewer, more, and/or different modules than those shown in FIG. 31. For example, in one embodiment, Normalizer 3144 and/or Failure Comparer 3146 may be omitted. In some embodiments of the invention, the functionality of Parametric Test Controller 3130 described herein may be divided differently into the various modules. For example in one embodiment the functionality may be consolidated among fewer modules than shown. In some embodiments of the invention, the functionality of Parametric Test Controller 3130 described herein may be divided into fewer, more and/or different modules than shown in FIG. 31 and/or system 3100 may include additional or less functionality than described herein. In some embodiments of the invention, one or more modules of Parametric Test Controller 3130 may have more, less and/or different functionality than described.

Also included in the scope of the present invention, is a computer program product, comprising a computer usable medium having a computer readable program code embodied therein, the computer readable program code being adapted to be executed to implement one, some or all of the methods shown and described herein, or a part thereof. The invention further contemplates a machine-readable memory tangibly embodying a program of instructions executable by the machine for executing one, some or all of the methods shown and described herein, or a part thereof. It is appreciated that any or all of the computational steps shown and described herein may be computer-implemented.

While the invention has been shown and described with respect to particular embodiments, it is not thus limited. Numerous modifications, changes and improvements within the scope of the invention will now occur to the reader.

The order of clauses in the method claims below should not be construed as limiting the order of execution of steps.

The invention claimed is:

1. A method of determining whether or not to perform an action based at least partly on an estimated maximum test range, the method comprising:
   attaining results generated from a parametric test performed on semiconductor devices included in a control set comprising a subset of a population of semiconductor devices;
   selecting from among said semiconductor devices at least one extreme subset including at least one of a high-scoring subset including all devices whose results exceed a high cut-off point and a low-scoring subset including all devices whose results fall below a low cut-off point;
   plotting at least results of said at least one extreme subset as a normal probability plot located between a zero probability axis and a one probability axis;
   fitting a plurality of curves to a plurality of subsets of said results of said at least one extreme subset respectively;
   extending each of said plurality of curves to said zero probability axis for said low-scoring subset or to said one probability axis for said high scoring subset thereby to define a corresponding plurality of intersection points along said zero or one probability axis;
   defining an estimated maximum test range based on at least one of said intersection points; and
   determining whether or not to perform an action based at least partly on said estimated maximum test range, wherein at least one of said selecting, plotting, fitting, extending, defining or determining is performed by at least one processor.

2. The method of claim 1, wherein said action includes at least partly disabling said test.

3. The method of claim 1, wherein said action includes at least partly enabling said test.

4. The method of claim 3, wherein said enabling causes at least one semiconductor device, not in said control set, which had previously undergone a test program flow without said test to be tested with said test.

5. The method of claim 3, wherein said enabling causes at least one untested semiconductor device to undergo a test program flow with said test.

6. The method of claim 1, wherein said estimated maximum test range is computed on-the-fly each time testing data on an additional control semiconductor device becomes available.

7. The method of claim 1, wherein said estimated maximum test range is computed after at least all control units in a portion of said population have been tested.

8. The method of claim 7, wherein said estimated maximum test range is again computed after at least all control units in a second portion of said population have been tested, said second portion of a different size than said portion.

9. The method of claim 1, wherein said action includes: changing the manufacturing flow for at least one device in said population.

10. The method of claim 9, wherein said changing said manufacturing flow includes: rejecting said at least one device.

11. The method of claim 9, wherein said changing said manufacturing flow includes: subjecting said at least one device to additional testing.

12. The method of claim 1, wherein said determining includes: comparing said estimated maximum test range with a known pass value range defined by a specification for said test.

13. The method of claim 12, wherein said test is at least partly disabled if said estimated maximum test range falls at least partly inside said known pass value range.

14. The method of claim 12, wherein said test is at least partly disabled if said estimated maximum test range falls entirely inside said known pass value range.

15. The method of claim 12, wherein said determining includes: making an on-the-fly determination as to whether said estimated maximum test range falls at least partly outside said known pass value range and using said on-the-fly determination as a condition for at least partly re-enabling said test, said on-the-fly determination comprising re-computing said estimated maximum test range on an on-the-fly generated control set comprising at least one tested semiconductor test absent from a previous control subset.

16. The method of claim 12, wherein said determining includes: making an on-the-fly determination as to whether said estimated maximum test range falls entirely outside said known pass value range and using said on-the-fly determination as a condition for at least partly re-enabling said test, said on-the-fly determination comprising re-computing said estimated maximum test range on an on-the-fly generated control set comprising at least one tested semiconductor test absent from a previous control subset.

17. The method of claim 12, wherein said known pass value range has only a single endpoint and said at least one extreme subset comprises only one extreme subset.

18. The method of claim 12, wherein said known pass value range has two endpoints and said at least one extreme subset comprises two extreme subsets.

19. The method of claim 1, wherein said action includes changing a pass/fail limit, said estimated maximum test range functioning as a pass/fail test limit.

20. The method of claim 19, wherein said estimated maximum test range is re-computed if a failure rate is statistically different than expected.

21. The method of claim 19, wherein said estimated maximum test range is recomputed after an additional device, designated as belonging in said control set, has been tested.

22. The method of claim 1, wherein said action includes: changing a sample rate, thereby changing a percentage of semiconductor devices in said population which are tested with a disabled test.

23. The method of claim 22, wherein said sample rate varies based on at least one selected from a group comprising: relationship of said estimated maximum test range to a specification limit of said test, and incidence of test failure.

24. The method of claim 1, wherein said control set includes validation units.

25. The method of claim 1, wherein said control set includes sampled units.

26. The method of claim 1, wherein said control set includes semiconductor devices which have passed device specification limits.

27. The method of claim 1, wherein said control set includes semiconductor devices which have passed previously designated estimated maximum test range pass/fail limits.

28. The method of claim 1, wherein said control set includes semiconductor devices belonging to groups whose results are consistent with one another.

29. The method of claim 1, wherein said control set excludes semiconductor devices whose results are outliers compared to results from other tested units.

30. The method of claim 1, wherein said determining is also based at least partly on incidence of test failure.

31. The method of claim 1, wherein said determining includes determining whether or not to change a manufacturing flow based on failure incidence where said estimated maximum test range functions as a pass/fail limit.

32. The method of claim 1, wherein said estimated maximum test range is defined to at least include all of said intersection points.

33. The method of claim 32, wherein said estimated maximum test range is extended outward by a safety factor.

34. The method of claim 1, wherein said estimated maximum test range is defined to equal a lowest or highest intersection point.

35. The method of claim 1, wherein said estimated test range is defined to equal said lowest or highest intersection point extended outward by a safety factor.

36. The method of claim 1, wherein said plurality of subsets of said results comprises result pairs.

37. The method of claim 1, wherein said plurality of subsets of said results comprises all result pairs which are adjacent within a set of numerically ordered results.

38. The method of claim 1, wherein said plurality of subsets of said results comprises only result pairs which are adjacent.

39. The method of claim 1, wherein said population of semiconductor devices is contained in wafers and said test is part of a wafer sort test program flow.

40. The method of claim 1, wherein said population of semiconductor devices comprises a population of singulated units that have or have not been packaged.

41. The method of claim 1, wherein said determining includes comparing said estimated maximum test range to other data and a result of said comparison is used as a necessary condition for determining whether or not to perform said action.

42. The method of claim 1, wherein said determining includes comparing said estimated maximum test range to other data and a result of said comparison is used as a sufficient condition for determining whether or not to perform said action.

43. The method of claim 1, wherein said test is conducted at a plurality of sites in parallel and wherein said estimated maximum test range is computed separately for each site or group of sites from among said plurality of sites whose results statistically differ from results of other sites in said plurality of sites.

44. The method of claim 1, wherein
said selecting includes:
 normalizing test results of said control set or of said at least one extreme subset;
said plotting includes:

plotting normalized results;
and said defining includes:
applying an inverse normalization function so that said estimated maximum test range includes un-normalized values.

45. The method of claim 1, further comprising:
performing a parametric test on semiconductor devices included in said control set, thereby to generate said results.

46. The method of claim 1, further comprising:
performing said action if determined accordingly.

47. The method of claim 1, wherein said plotting includes: plotting results of all devices in said control set.

48. The method of claim 47 wherein said selecting is performed after said plotting.

49. A system for determining whether or not to perform an action based at least partly on an estimated maximum test range, the system comprising:
an attainer for attaining results generated from a parametric test performed on semiconductor devices included in a control set comprising a subset of the population of semiconductor devices;
a selector for selecting from among said semiconductor devices at least one extreme subset including at least one of a high-scoring subset including all devices whose results exceed a high cut-off point and a low-scoring subset including all devices whose results fall below a low cut-off point;
a plotter for plotting at least results of said at least one extreme subset as a normal probability plot located between a zero probability axis and a one probability axis;
a fitter for fitting a plurality of curves to a plurality of subsets of said results of said at least one extreme subset respectively;
an extender for extending each of said plurality of curves to said zero probability axis for said low-scoring subset or to said one probability axis for said high-scoring subset thereby to define a corresponding plurality of intersection points along said zero or one probability axis;
a definer for defining said estimated maximum test range based on at least one of said intersection points; and
a determiner for determining whether or not to perform an action based at least partly on said estimated maximum test range, wherein the system comprises at least one processor.

50. The system of claim 49, further comprising:
a tester for performing a parametric test on semiconductor devices included in said control set, thereby to generate said results.

51. The system of claim 50, wherein said tester is also configured to perform said action independently or in conjunction with at least one other element, if determined accordingly.

52. The system of claim 49, wherein said system is part of a test station host computer.

53. The system of claim 49, wherein said system is part of a tester, said tester also configured to perform a parametric test on semiconductor devices included in said control set, thereby to generate said results.

54. A non-transitory program storage device readable by machine, tangibly embodying a program of instructions executable by the machine to perform a method of determining whether or not to perform an action based at least partly on an estimated maximum test range, the method comprising:
attaining results generated from a parametric test performed on semiconductor devices included in a control set comprising a subset of a population of semiconductor devices;
selecting from among said semiconductor devices at least one extreme subset including at least one of a high-scoring subset including all devices whose results exceed a high cut-off point and a low-scoring subset including all devices whose results fall below a low cut-off point;
plotting at least results of said at least one extreme subset as a normal probability plot located between a zero probability axis and a one probability axis;
fitting a plurality of curves to a plurality of subsets of said results of said at least one extreme subset respectively;
extending each of said plurality of curves to said zero probability axis for said low-scoring subset or to said one probability axis for said high-scoring subset thereby to define a corresponding plurality of intersection points along said zero or one probability axis;
defining an estimated maximum test range based on at least one of said intersection points; and
determining whether or not to perform an action based at least partly on said estimated maximum test range.

55. A non-transitory computer program product comprising a computer useable medium having computer readable program code embodied therein for determining whether or not to perform an action based at least partly on an estimated maximum test range, the computer program product comprising:
computer readable program code for causing the computer to attain results generated from a parametric test performed on semiconductor devices included in a control set comprising a subset of a population of semiconductor devices;
computer readable program code for causing the computer to select from among said semiconductor devices at least one extreme subset including at least one of a high-scoring subset including all devices whose results exceed a high cut-off point and a low-scoring subset including all devices whose results fall below a low cut-off point;
computer readable program code for causing the computer to plot results of said at least one extreme subset as a normal probability plot located between a zero probability axis and a one probability axis;
computer readable program code for causing the computer to fit a plurality of curves to a plurality of subsets of said results of said at least one extreme subset respectively;
computer readable program code for causing the computer to extend each of said plurality of curves to said zero probability axis for said low-scoring subset or to said one probability axis for said high-scoring subset thereby to define a corresponding plurality of intersection points along said zero or one probability axis;
computer readable program code for causing the computer to define an estimated maximum test range based on at least one of said intersection points; and
computer readable program code for causing the computer to determine whether or not to perform an action based at least partly on said estimated maximum test range.

56. The method of claim 10, wherein at least one of said rejected at least one device is used in a different product line than if not had been rejected.

57. The method of claim 10, wherein at least one of said rejected at least one device is discarded.

58. The system of claim 49, further comprising handling equipment, wherein said handling equipment is configured to perform said action independently or in conjunction with at least one other element, if determined accordingly.

59. The system of claim 49, wherein said system is configured to perform said action independently or in conjunction with at least one other element, if determined accordingly.

* * * * *